(12) United States Patent
Ogiwara et al.

(10) Patent No.: US 10,032,509 B2
(45) Date of Patent: Jul. 24, 2018

(54) SEMICONDUCTOR MEMORY DEVICE INCLUDING VARIABLE RESISTANCE ELEMENT

(71) Applicant: TOSHIBA MEMORY CORPORATION, Minato-ku, Tokyo (JP)

(72) Inventors: Ryu Ogiwara, Yokohama Kanagawa (JP); Daisaburo Takashima, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 32 days.

(21) Appl. No.: 15/065,341

(22) Filed: Mar. 9, 2016

(65) Prior Publication Data

US 2016/0293253 A1 Oct. 6, 2016

Related U.S. Application Data

(63) Continuation-in-part of application No. 14/846,291, filed on Sep. 4, 2015, now abandoned.

(Continued)

(51) Int. Cl.
 *G11C 13/00* (2006.01)
 *G11C 8/08* (2006.01)
 (Continued)

(52) U.S. Cl.
 CPC .............. *G11C 13/004* (2013.01); *G11C 8/08* (2013.01); *G11C 13/0002* (2013.01);
 (Continued)

(58) Field of Classification Search
 CPC ............................ G11C 13/004; G11C 13/0023
 (Continued)

(56) References Cited

U.S. PATENT DOCUMENTS

| 4,953,127 A | * | 8/1990 | Nagahashi | ............ G11C 11/418 |
| | | | | 365/189.05 |
| 6,061,276 A | * | 5/2000 | Kawashima | .......... G11C 11/419 |
| | | | | 365/189.06 |

(Continued)

FOREIGN PATENT DOCUMENTS

| FR | 3029342 A1 | * | 6/2016 | ................ G11C 7/06 |
| JP | 11016384 A | * | 1/1999 | |

(Continued)

OTHER PUBLICATIONS

Hanzawa, et al., "A 512kB Embedded Phase Change Memory with 416kB/s Write Throughput at 100μA Cell Write Current", International Solid-State Circuits Conference, ISSCC 2007, Session 26, 2007, pp. 474-475, 616.

(Continued)

*Primary Examiner* — Anthan Tran
*Assistant Examiner* — Mushfique Siddique
(74) *Attorney, Agent, or Firm* — Holtz, Holtz & Volek PC

(57) ABSTRACT

According to one embodiment, a semiconductor memory device includes a memory cell including a variable resistance element, a first circuit including a first resistance element and a first transistor, a first bit line, a second transistor, and a sense circuit. The memory cell and the first circuit are connected to the first bit line. One end and the other end of the second transistor are connected to the first bit line and the sense circuit respectively. During a first operation before reading data of the memory cell a voltage of the first bit line falls to a first voltage and the first and second transistors are turned off in response to a fall of the voltage of the first bit line to the first voltage.

20 Claims, 38 Drawing Sheets

Related U.S. Application Data

(60) Provisional application No. 62/140,068, filed on Mar. 30, 2015.

(51) Int. Cl.
*G11C 11/16* (2006.01)
*G11C 11/22* (2006.01)
*G11C 7/12* (2006.01)

(52) U.S. Cl.
CPC ...... G11C 13/0023 (2013.01); G11C 13/0026 (2013.01); G11C 13/0028 (2013.01); *G11C 7/12* (2013.01); *G11C 11/1673* (2013.01); *G11C 11/2273* (2013.01); *G11C 2013/0042* (2013.01); *G11C 2013/0054* (2013.01); *G11C 2207/002* (2013.01); *G11C 2207/12* (2013.01); *G11C 2213/79* (2013.01)

(58) Field of Classification Search
USPC .......................................... 365/148, 163, 175
See application file for complete search history.

(56) References Cited

U.S. PATENT DOCUMENTS

| | | | | |
|---|---|---|---|---|
| 6,330,202 B1* | 12/2001 | Tanizaki | G11C 7/1078 | 365/189.16 |
| 7,751,250 B2* | 7/2010 | Lee | G11C 5/147 | 365/185.17 |
| 7,898,840 B2* | 3/2011 | Maejima | G11C 5/02 | 365/148 |
| 7,911,823 B2* | 3/2011 | Futatsuyama | G11C 11/36 | 365/148 |
| 8,000,155 B2* | 8/2011 | Edahiro | G11C 13/0007 | 365/100 |
| 8,238,138 B2* | 8/2012 | Kitagawa | G11C 7/08 | 365/148 |
| 8,243,542 B2* | 8/2012 | Bae | G11C 5/145 | 365/163 |
| 9,153,316 B1* | 10/2015 | Ryu | G11C 13/004 | |
| 9,312,000 B1* | 4/2016 | Song | G11C 11/1655 | |
| 9,324,457 B2* | 4/2016 | Takizawa | G11C 11/161 | |
| 9,355,739 B2* | 5/2016 | Castalino | G11C 17/18 | |
| 9,378,781 B1* | 6/2016 | Jung | G11C 7/08 | |
| 9,520,164 B1* | 12/2016 | Yamamoto | G11C 7/1057 | |
| 9,595,311 B2* | 3/2017 | Takizawa | G11C 11/1673 | |
| 9,601,165 B1* | 3/2017 | Dray | G11C 7/065 | |
| 9,672,929 B2* | 6/2017 | Maejima | G11C 16/26 | |
| 9,691,499 B1* | 6/2017 | Dozaka | G11C 17/18 | |
| 9,715,927 B2* | 7/2017 | Bertin | G11C 13/0069 | |
| 2001/0033511 A1* | 10/2001 | Saito | G11C 11/412 | 365/174 |
| 2002/0093032 A1* | 7/2002 | Hanzawa | G11C 7/14 | 257/200 |
| 2003/0123281 A1* | 7/2003 | Iwata | G11C 11/15 | 365/158 |
| 2003/0235069 A1* | 12/2003 | Ooishi | G11C 7/1051 | 365/158 |
| 2004/0105304 A1* | 6/2004 | Hidaka | G11C 11/15 | 365/158 |
| 2004/0223392 A1* | 11/2004 | Ikehashi | G11C 7/06 | 365/205 |
| 2005/0082572 A1* | 4/2005 | Miyazaki | G11C 16/28 | 257/202 |
| 2006/0062066 A1* | 3/2006 | Garni | G11C 7/062 | 365/207 |
| 2006/0067138 A1* | 3/2006 | Ogiwara | G11C 11/22 | 365/189.09 |
| 2007/0035982 A1* | 2/2007 | Yamamura | G11C 7/062 | 365/145 |
| 2007/0109157 A1* | 5/2007 | Lee | G11C 7/062 | 341/51 |
| 2007/0140029 A1* | 6/2007 | Kim | G11C 7/062 | 365/233.12 |
| 2007/0217250 A1* | 9/2007 | Morita | G11C 11/22 | 365/145 |
| 2008/0205119 A1* | 8/2008 | Nagai | G11C 7/02 | 365/148 |
| 2008/0304309 A1* | 12/2008 | Shiga | G11C 11/22 | 365/145 |
| 2009/0080243 A1* | 3/2009 | Chiang | G11C 5/14 | 365/163 |
| 2009/0103354 A1* | 4/2009 | Yoon | G11C 11/1673 | 365/158 |
| 2009/0296488 A1* | 12/2009 | Nguyen | G11C 7/02 | 365/185.21 |
| 2010/0061141 A1* | 3/2010 | Hwang | G11C 7/04 | 365/148 |
| 2010/0080054 A1* | 4/2010 | Abe | H01L 27/228 | 365/171 |
| 2010/0165701 A1* | 7/2010 | Ueda | G11C 11/16 | 365/148 |
| 2010/0214820 A1* | 8/2010 | Hosono | G11C 8/14 | 365/148 |
| 2011/0110142 A1* | 5/2011 | Kitagawa | G11C 13/0007 | 365/148 |
| 2011/0116296 A1* | 5/2011 | Kitagawa | G11C 11/5678 | 365/51 |
| 2011/0235398 A1* | 9/2011 | Hosono | G11C 8/08 | 365/148 |
| 2012/0026777 A1* | 2/2012 | Kitagawa | G11C 13/0009 | 365/148 |
| 2012/0250393 A1* | 10/2012 | Shirakawa | G11C 7/12 | 365/148 |
| 2013/0100725 A1* | 4/2013 | Kim | G11C 5/063 | 365/148 |
| 2014/0010027 A1* | 1/2014 | Fujiwara | G11C 7/12 | 365/189.09 |
| 2014/0244930 A1* | 8/2014 | Lee | G11C 11/1673 | 711/118 |
| 2015/0255151 A1* | 9/2015 | Ogiwara | G11C 13/004 | 365/148 |
| 2015/0279458 A1* | 10/2015 | Papandreou | G11C 13/004 | 365/163 |
| 2016/0064059 A1* | 3/2016 | Takahashi | G11C 11/1675 | 365/158 |
| 2016/0093351 A1* | 3/2016 | Jung | G11C 11/1673 | 365/158 |
| 2016/0172032 A1* | 6/2016 | Matsuoka | G11C 13/0069 | 365/148 |
| 2016/0267969 A1* | 9/2016 | Ogiwara | G11C 13/004 | |
| 2016/0293251 A1* | 10/2016 | Ogiwara | G11C 13/004 | |
| 2016/0379708 A1* | 12/2016 | Katayama | G11C 7/065 | 365/148 |
| 2017/0062062 A1* | 3/2017 | Tanabe | G11C 16/26 | |
| 2017/0076797 A1* | 3/2017 | Lung | G11C 13/0097 | |
| 2017/0162248 A1* | 6/2017 | Matsuoka | G11C 11/1655 | |

FOREIGN PATENT DOCUMENTS

| | | | | |
|---|---|---|---|---|
| JP | 2000090671 A | 3/2000 | | |
| JP | 2006107560 A | 4/2006 | | |
| JP | 2007035157 A | 2/2007 | | |
| JP | 2010049792 A | 3/2010 | | |
| JP | 2010267373 A | 11/2010 | | |
| JP | WO 2013031126 A1 * | 3/2013 | ......... | G11C 13/0004 |
| JP | WO 2017043105 A1 * | 3/2017 | ......... | G11C 11/1673 |
| WO | WO 2013059808 A1 * | 4/2013 | ............ | G11C 5/063 |
| WO | 2015141033 A1 | 9/2015 | | |

OTHER PUBLICATIONS

Heller, "Cross-Coupled Charge-Transfer Amplifier", International Solid-State Circuits Conference, ISSCC 79, Session I, WAM 1.5, Feb. 1979.

Heller, et al., "High-Sensitivity Charge-Transger Sense Amplifier", International Solid-State Circuits Conference, ISSCC75 Session X, THAM 10.6, Feb. 13, 1975.

Itoh, "VLSI memory", Baifukan Company Limited, pp. 212-215, Nov. 1994.

(56) References Cited

OTHER PUBLICATIONS

Tominaga, et al., "Electrical-field induced giant magnetoresistivity in (non-magnetic) phase change films", Applied Physics Letter 99, 152105, 2011.

* cited by examiner

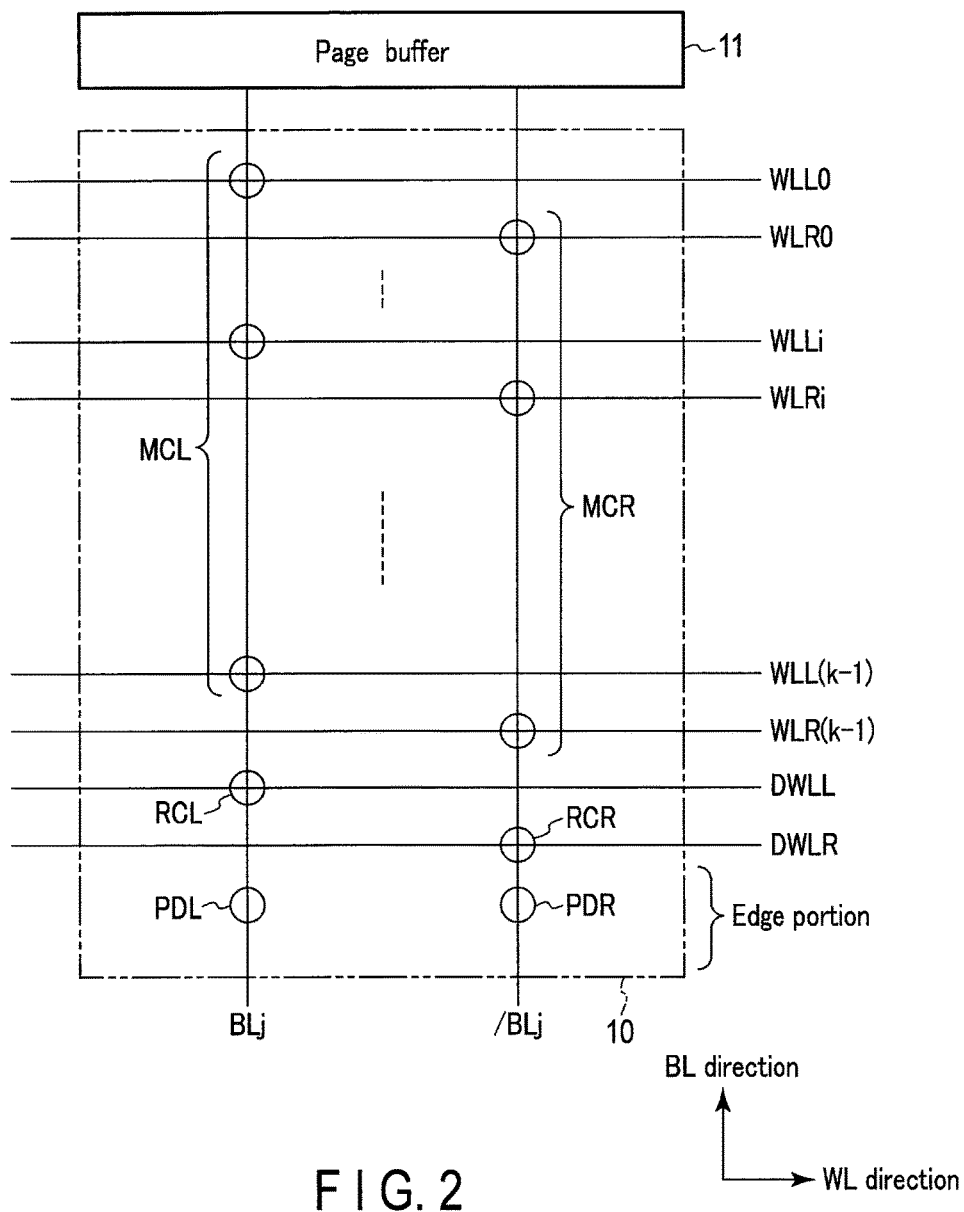
F I G. 2

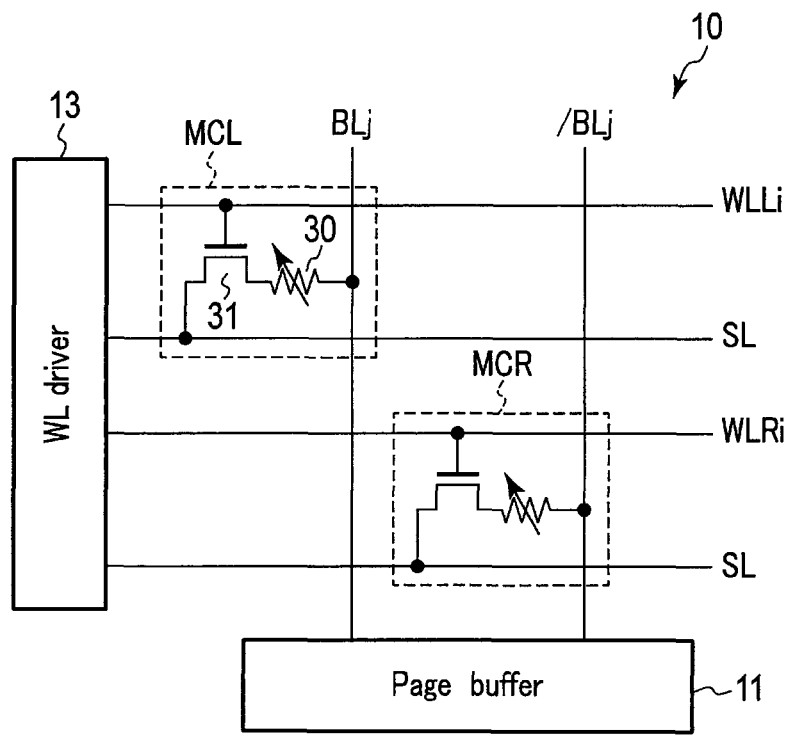
F I G. 3
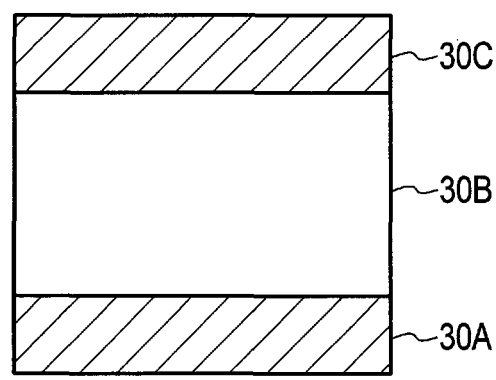
F I G. 4

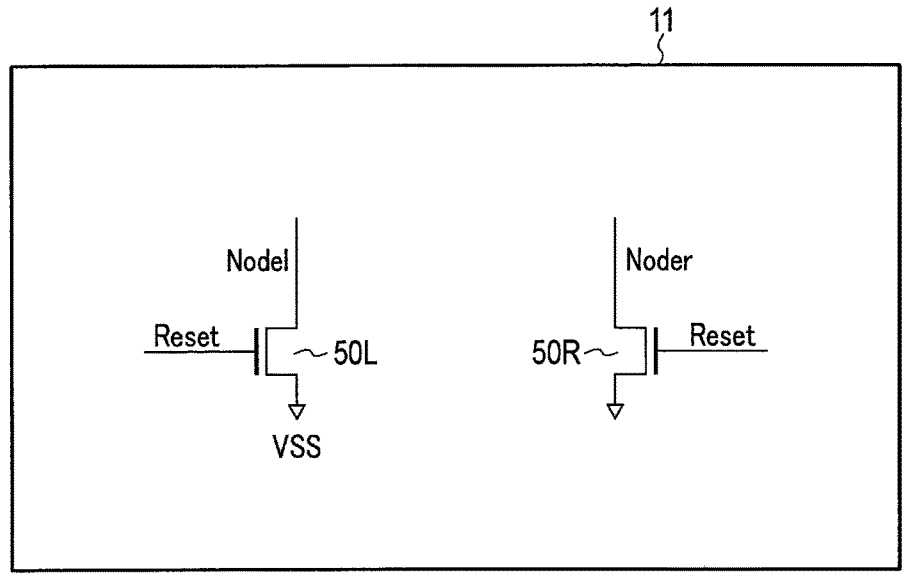
F I G. 7
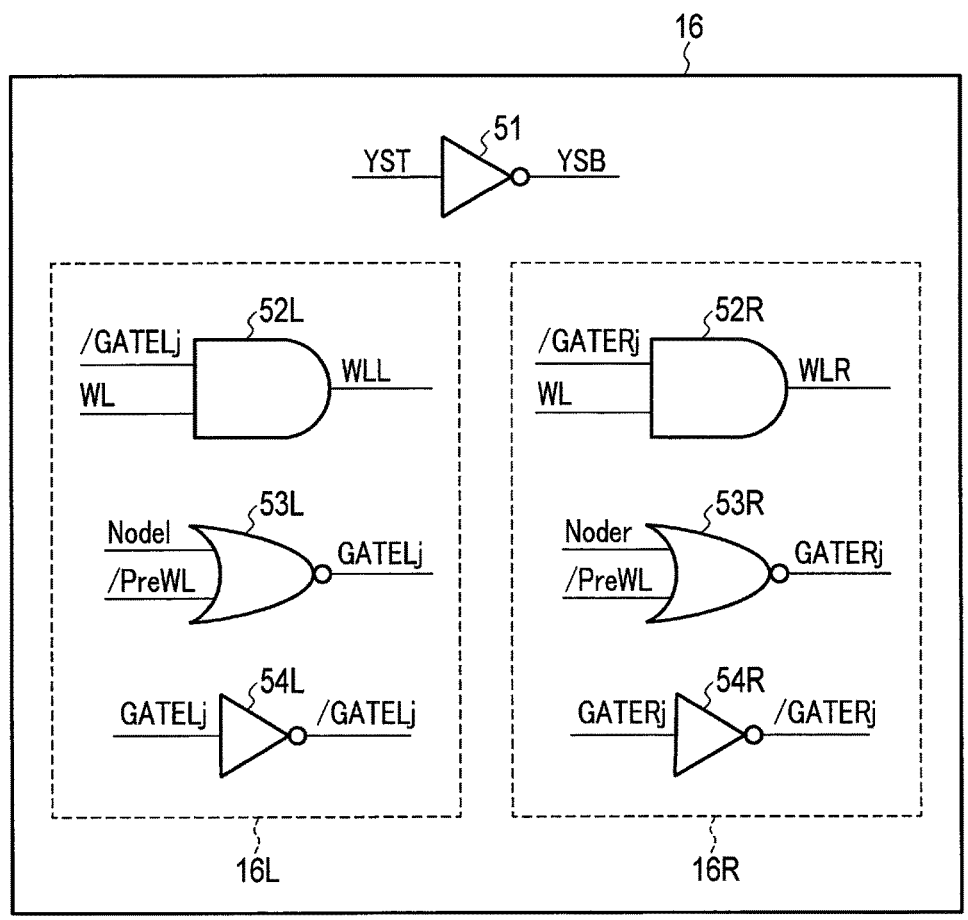
F I G. 8

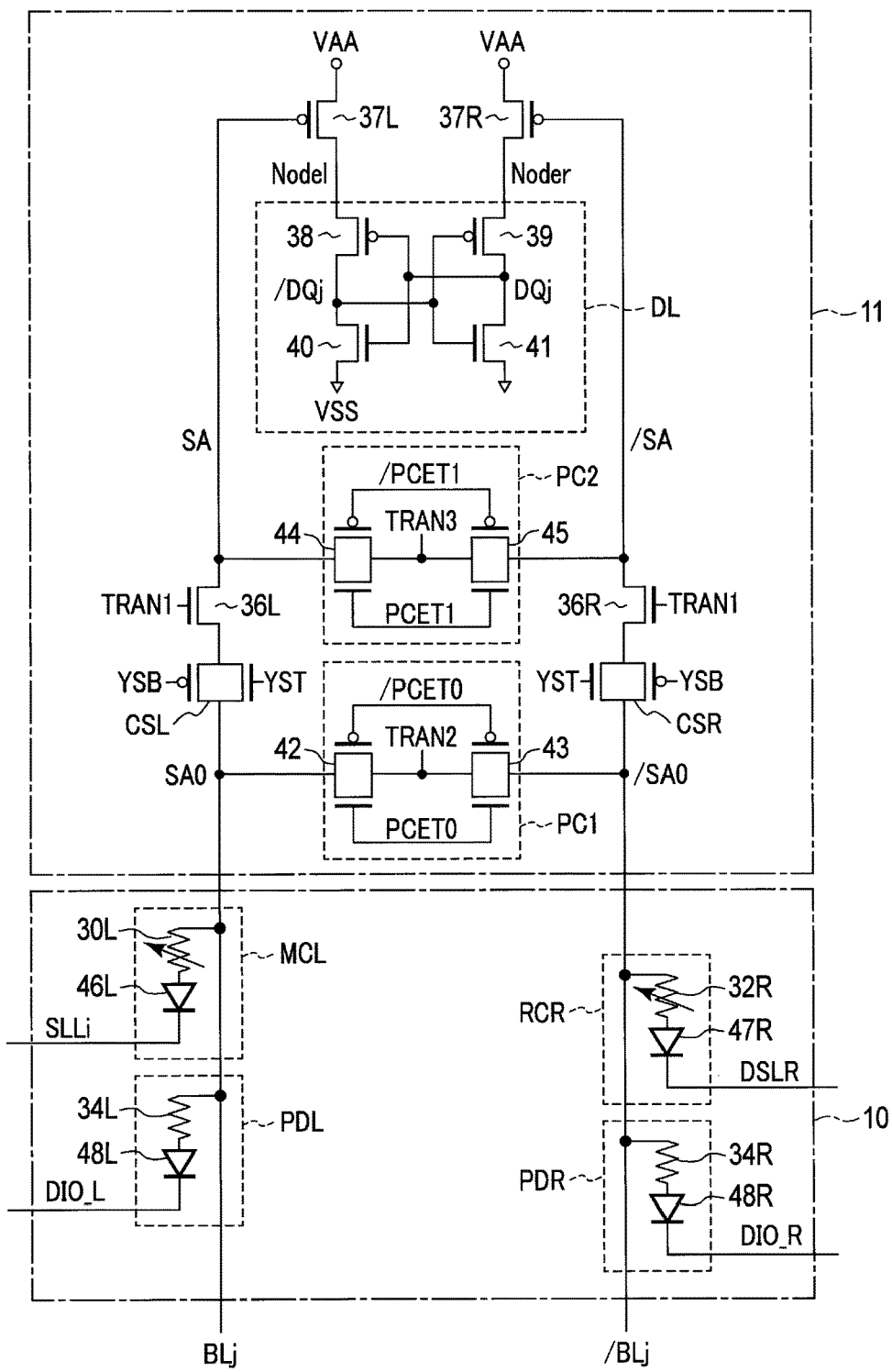
F I G. 14

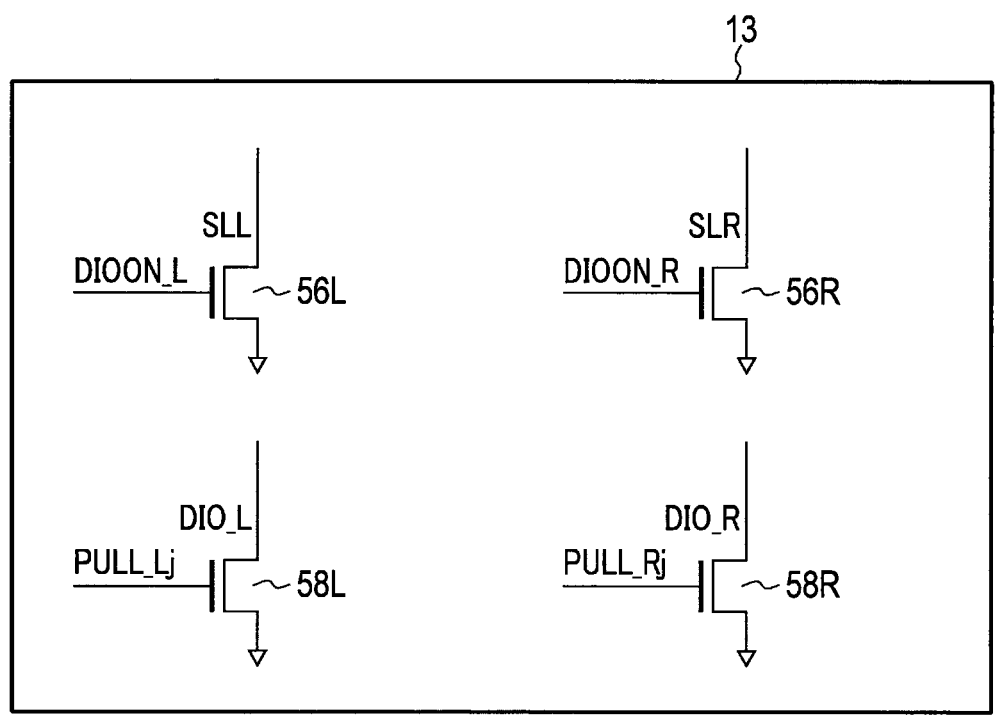
F I G. 15

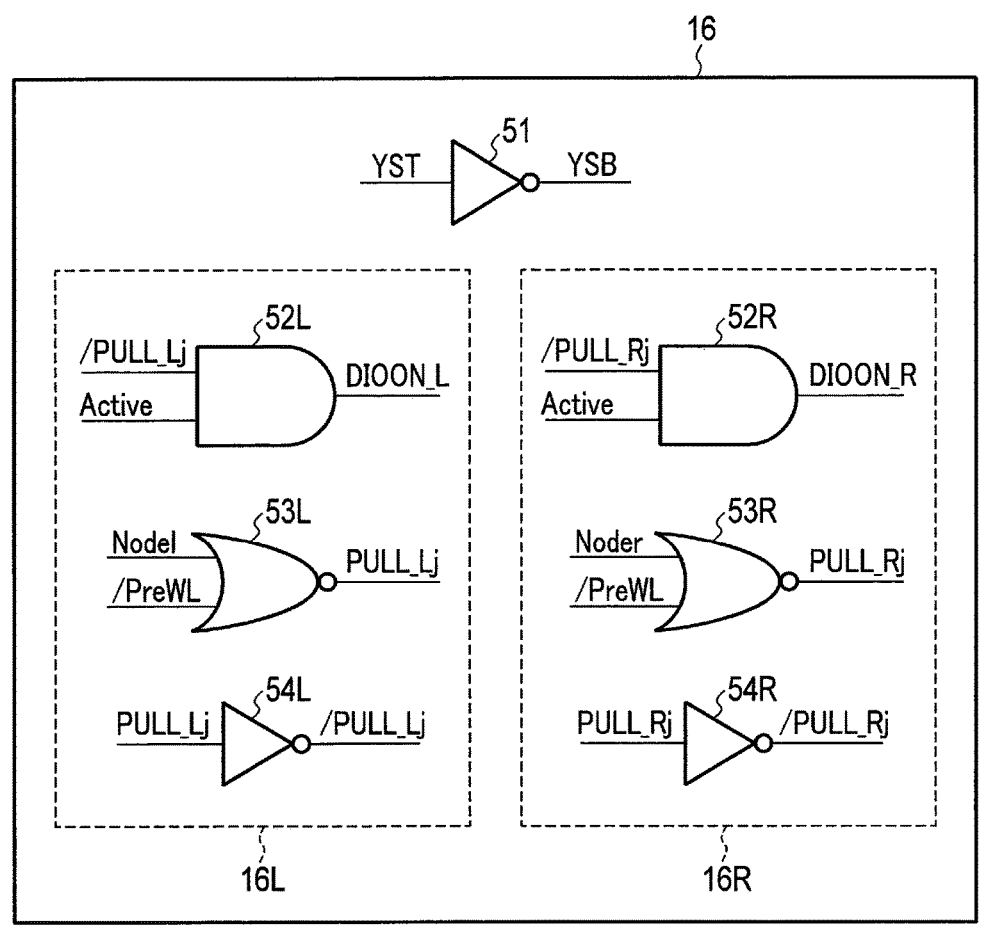
F I G. 16

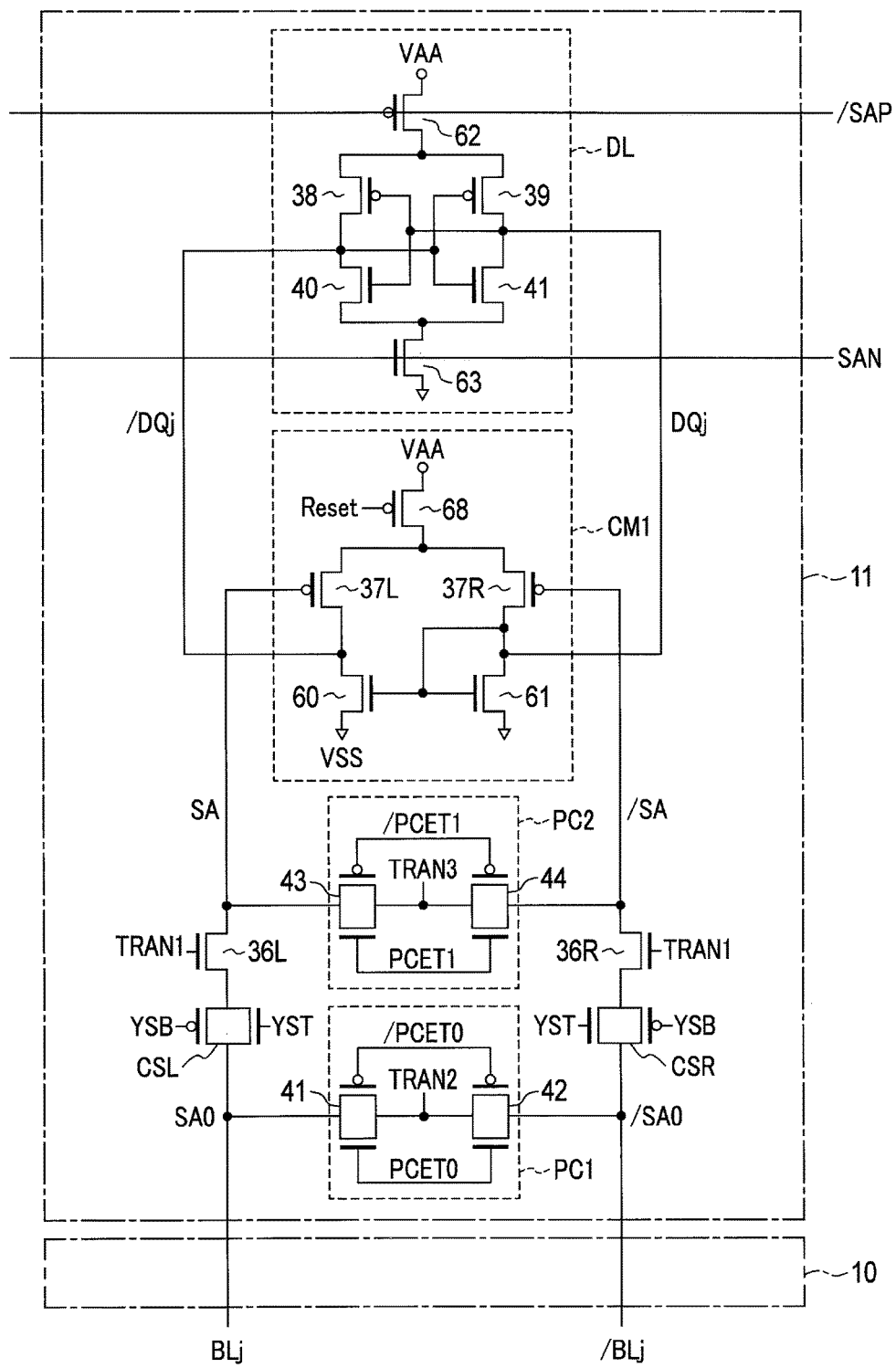
F I G. 17

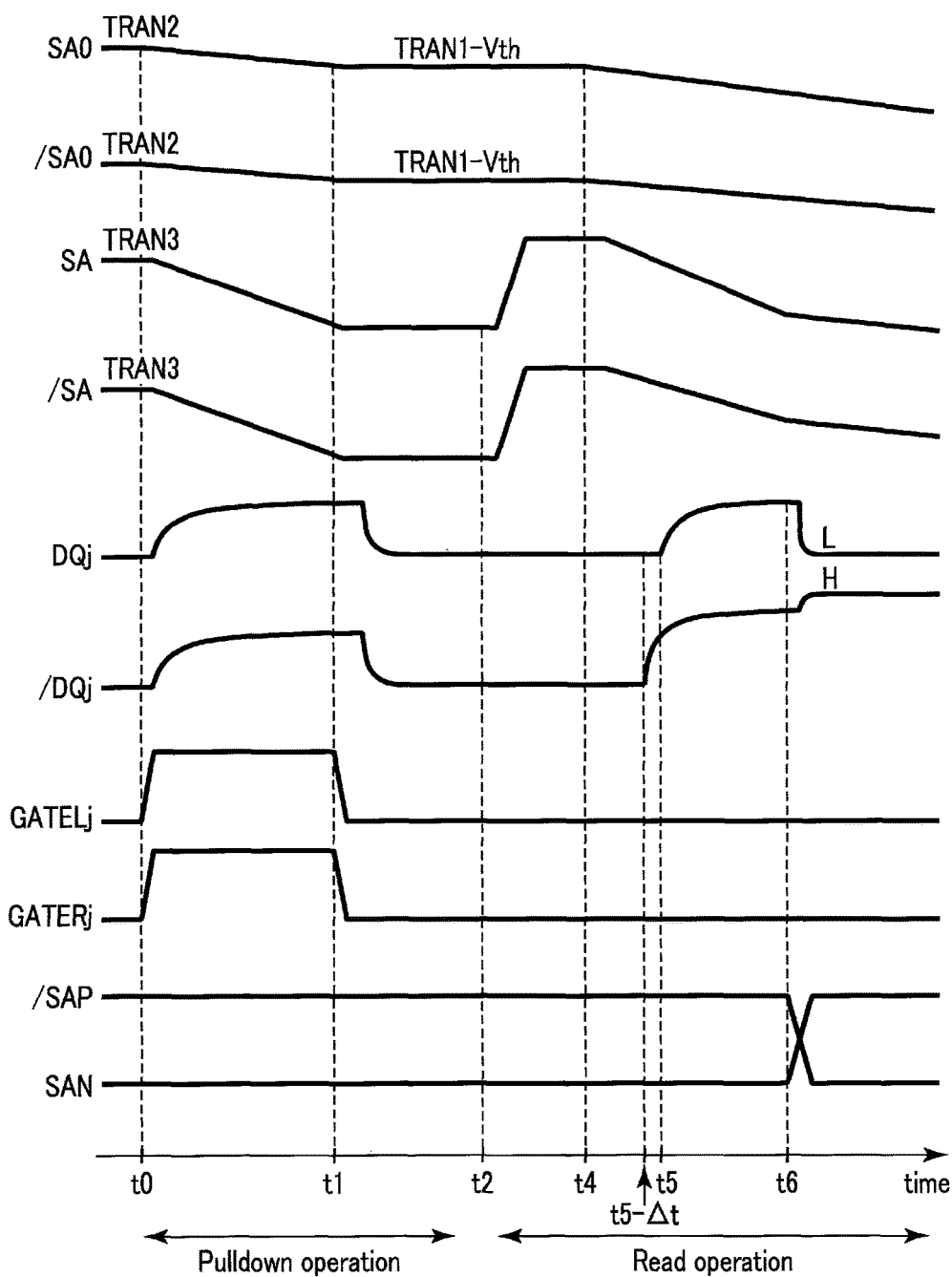
F I G. 20

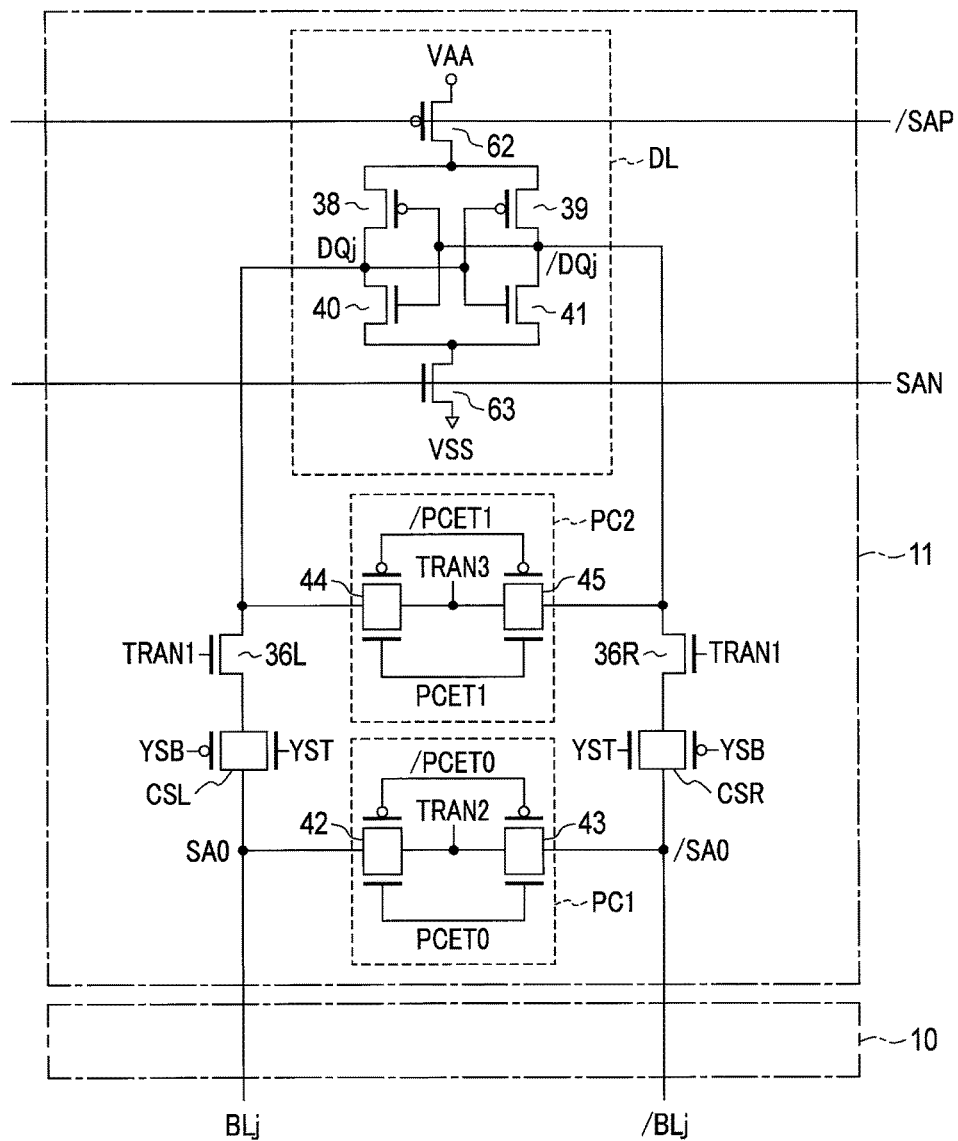
F I G. 25

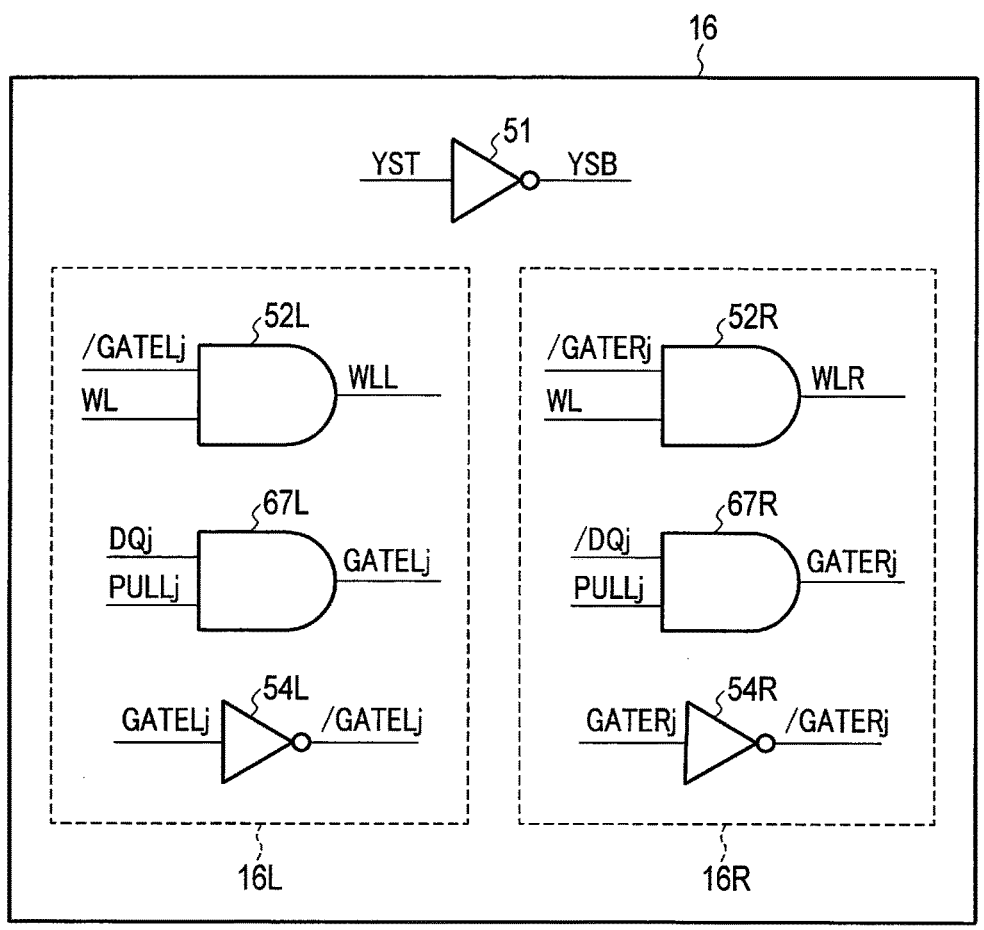
F I G. 26

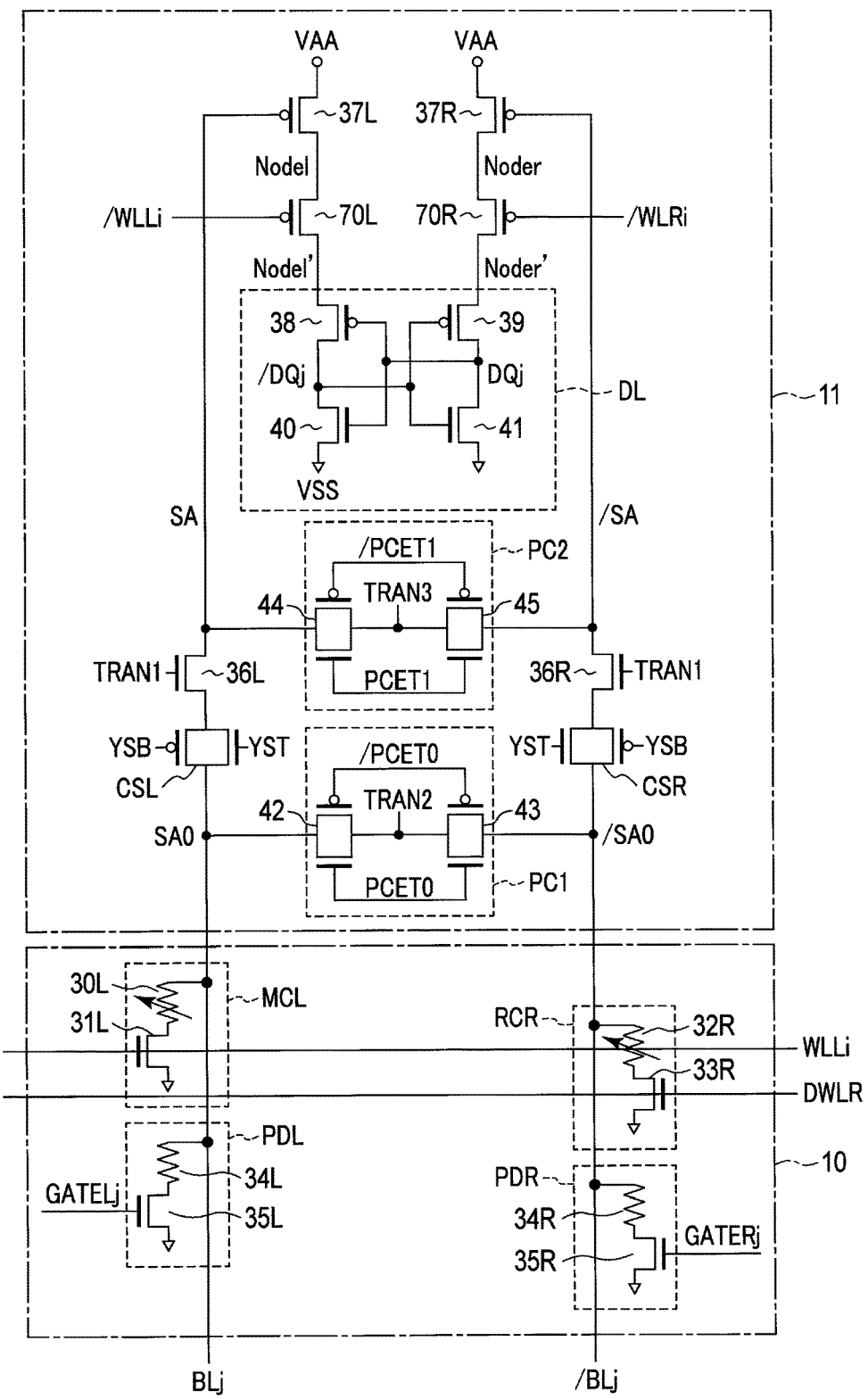
F I G. 29

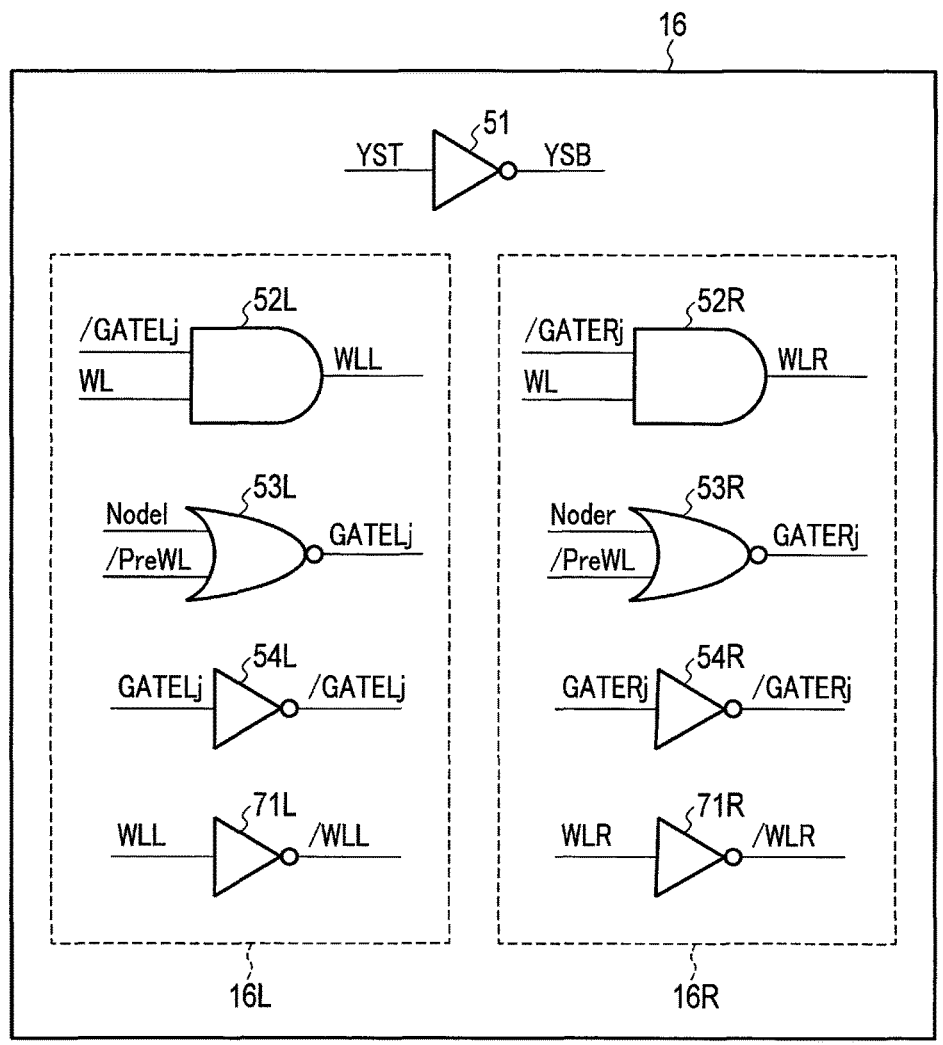
F I G. 30

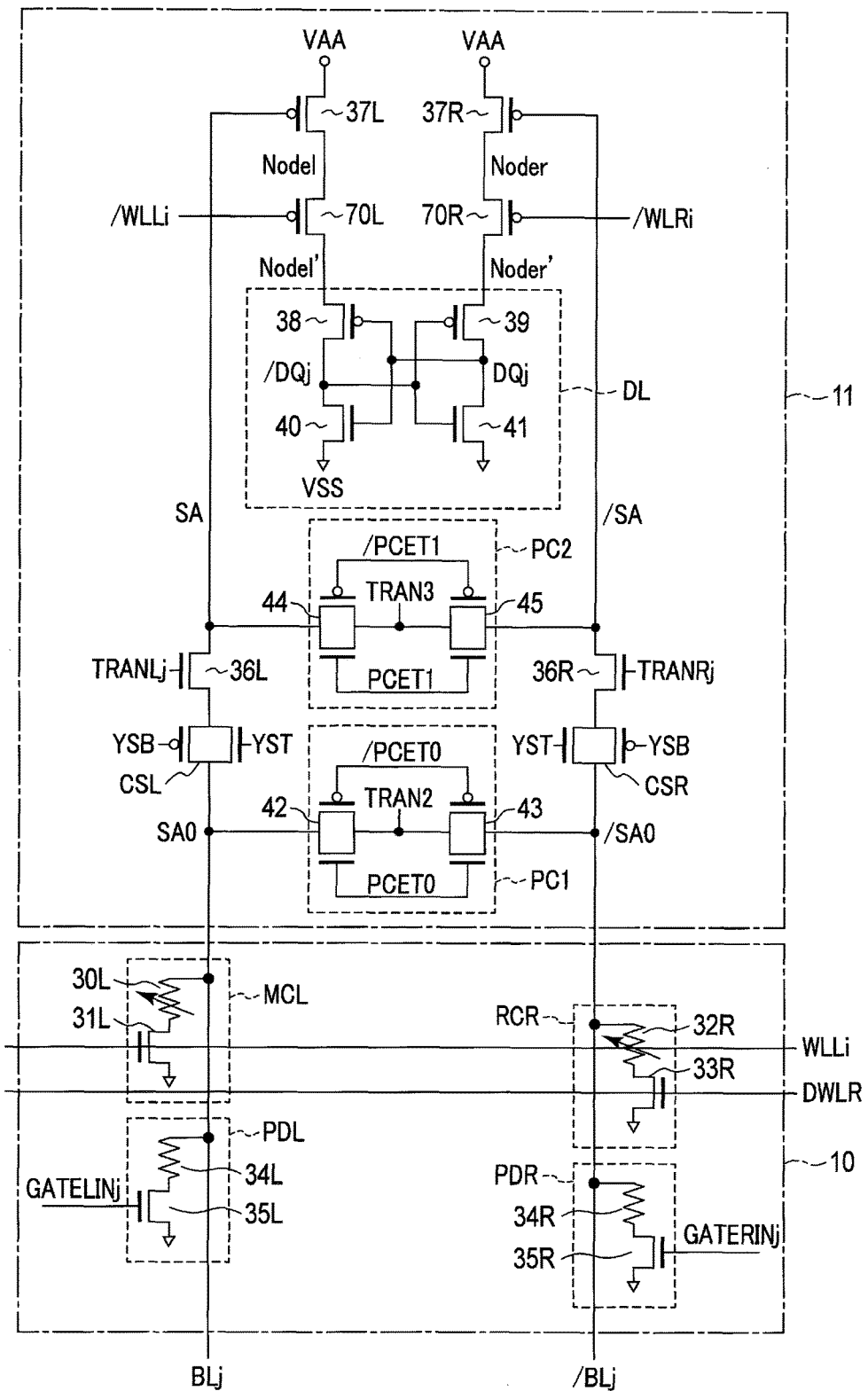
F I G. 32

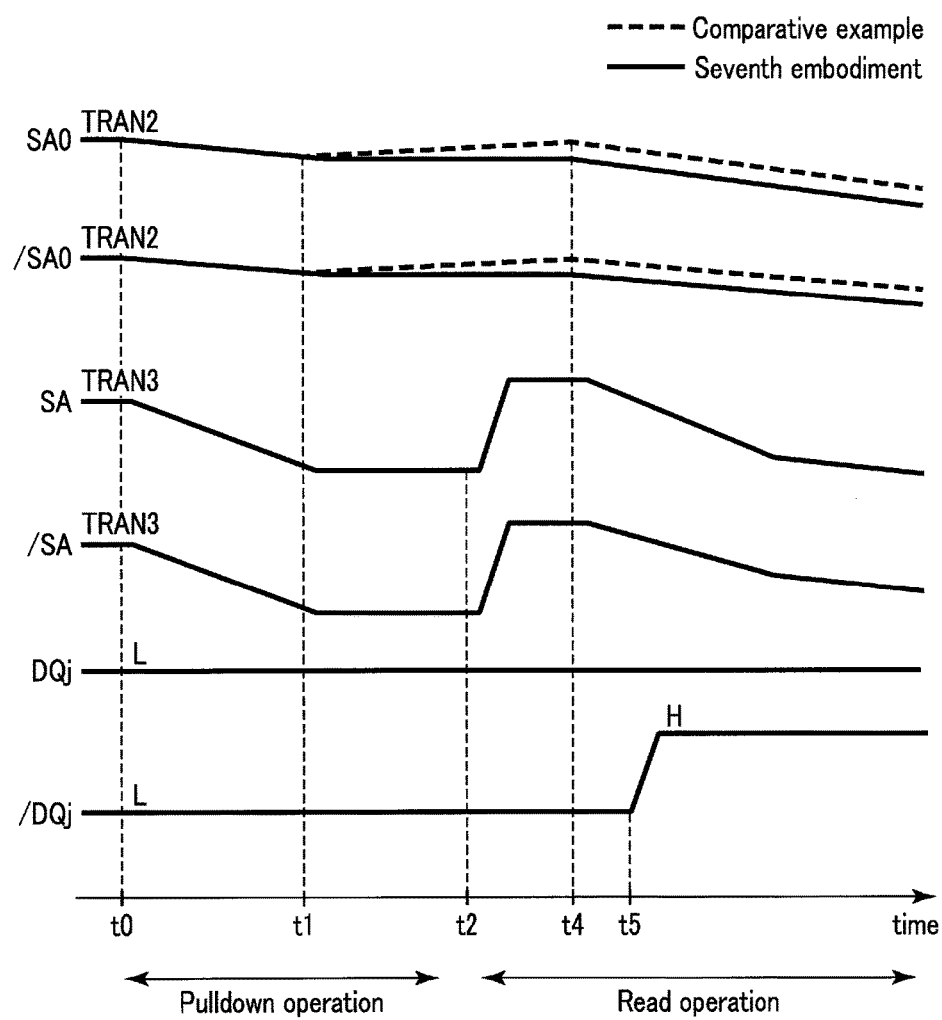
F I G. 35

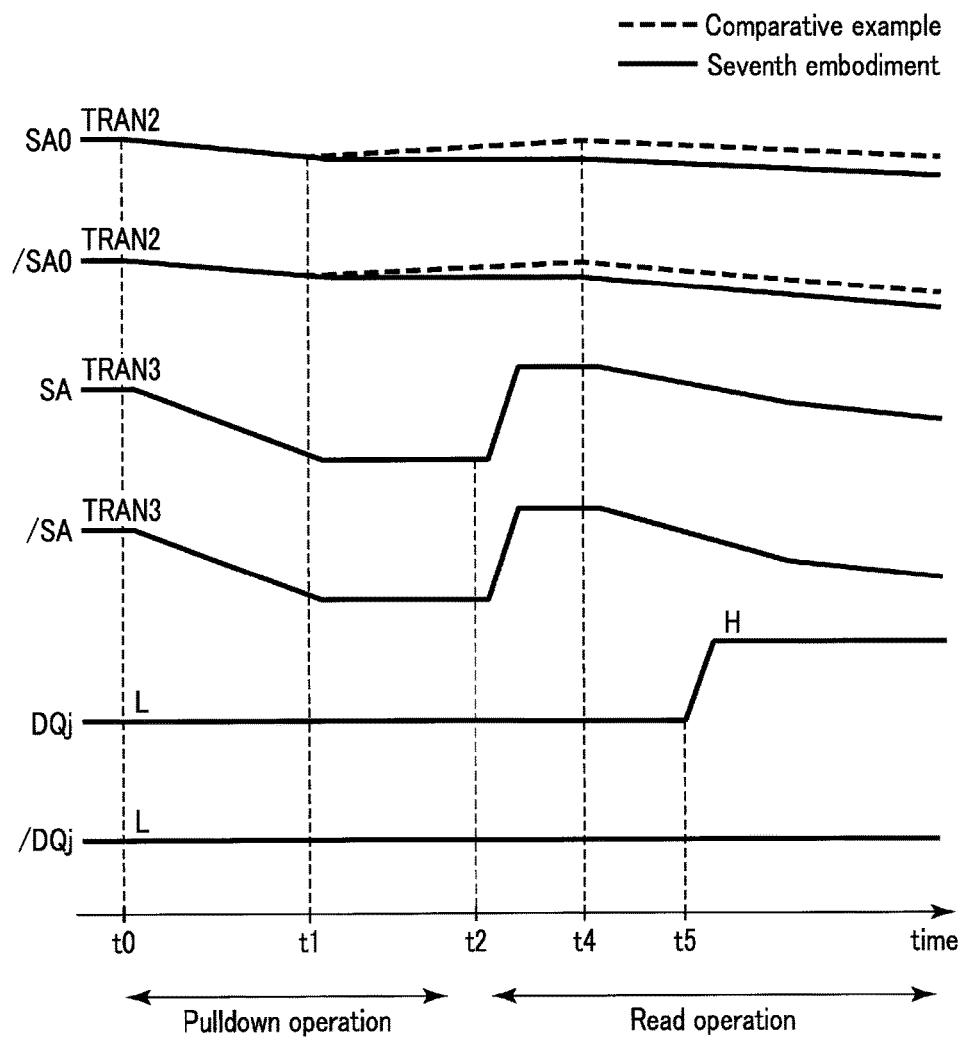
F I G. 36

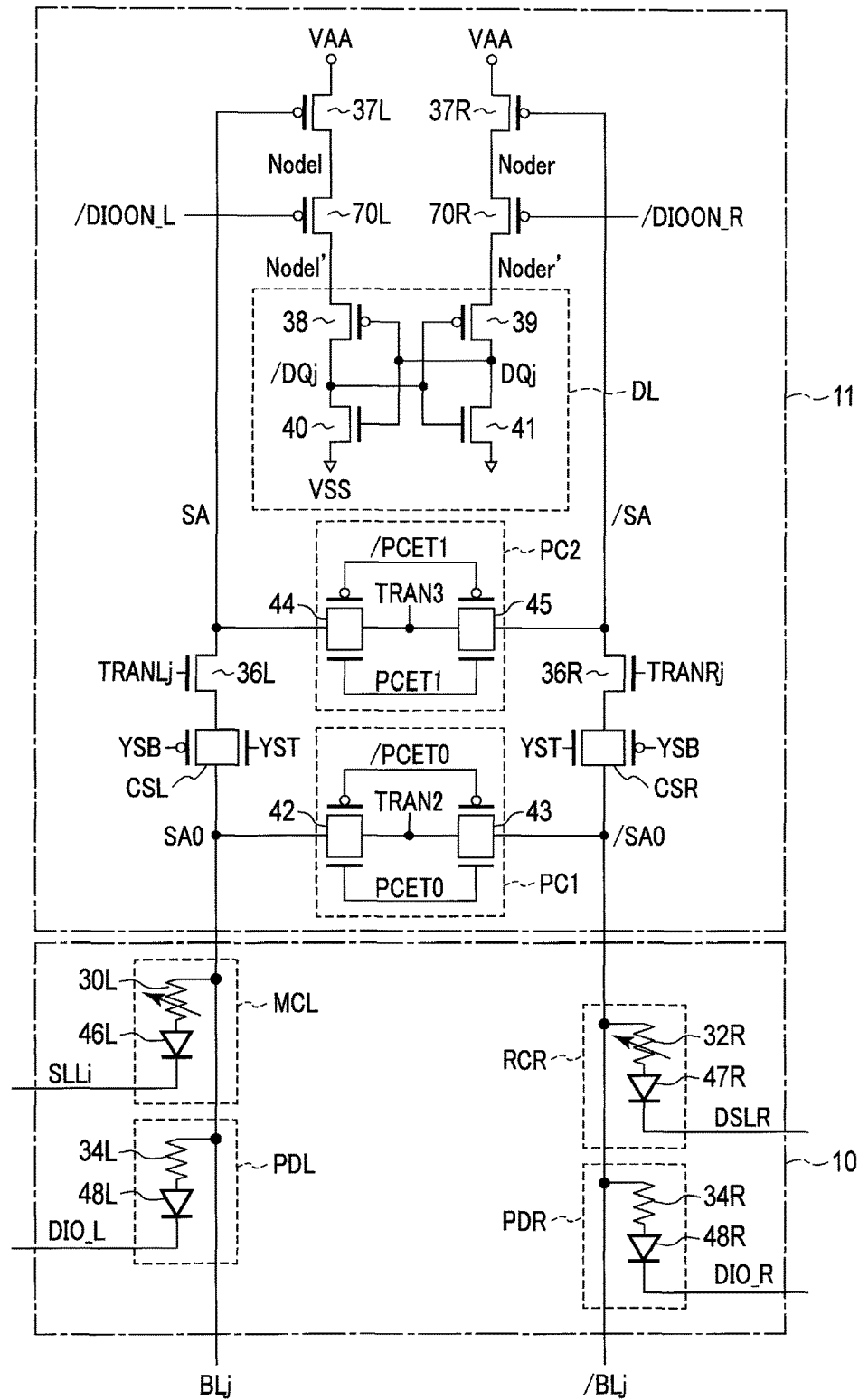
F I G. 37

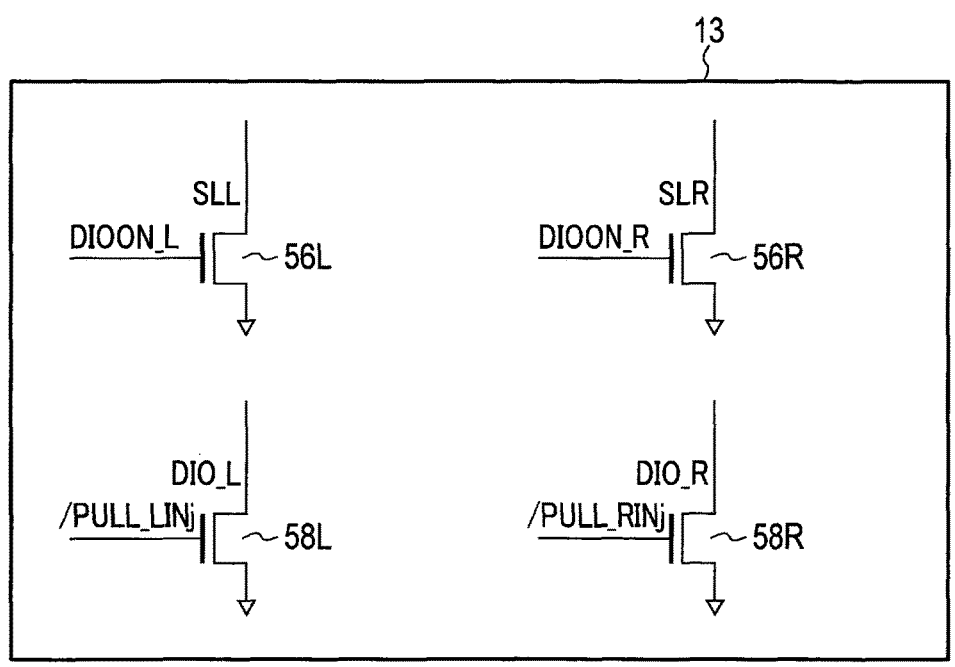
F I G. 38

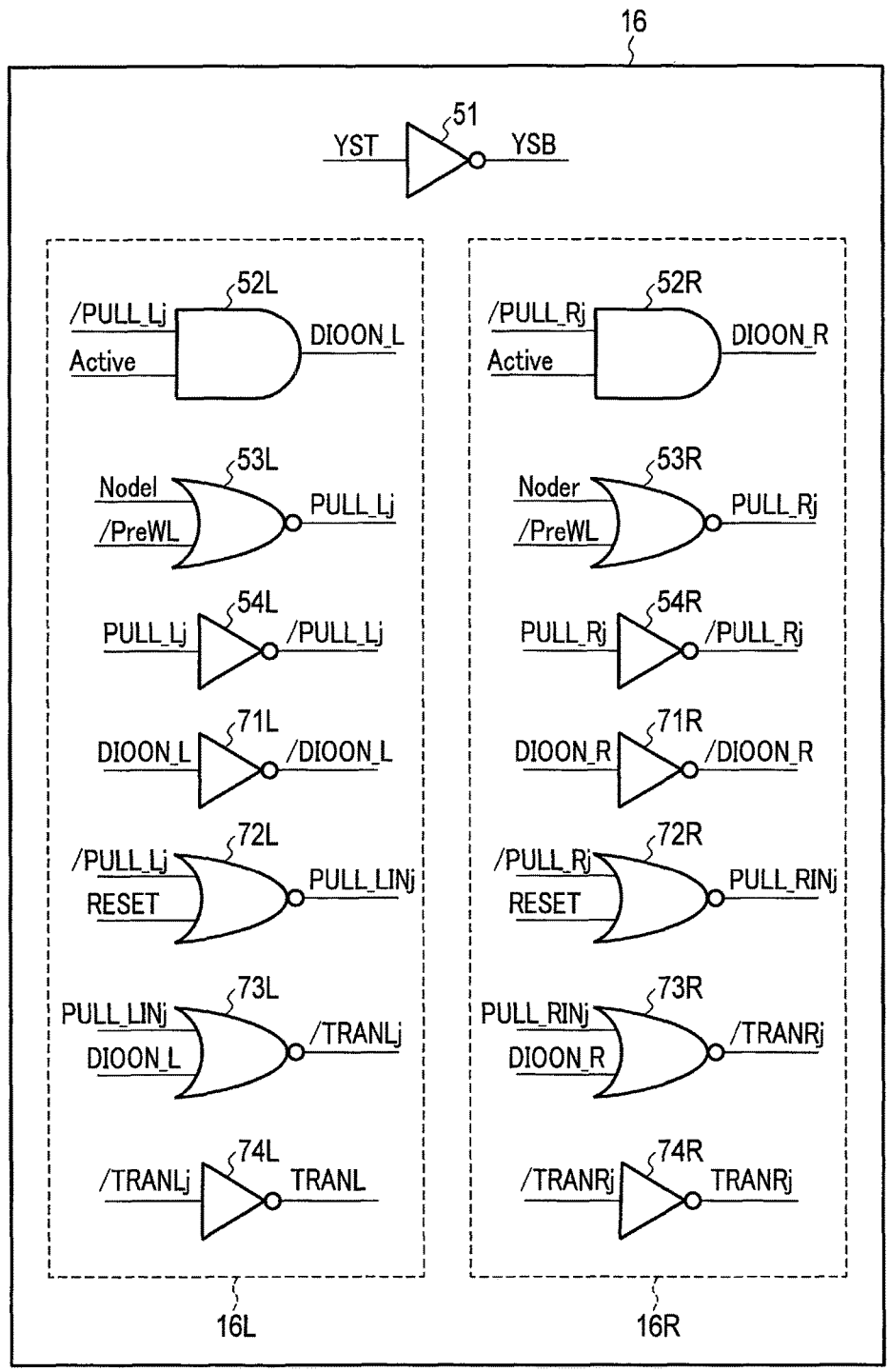
F I G. 39

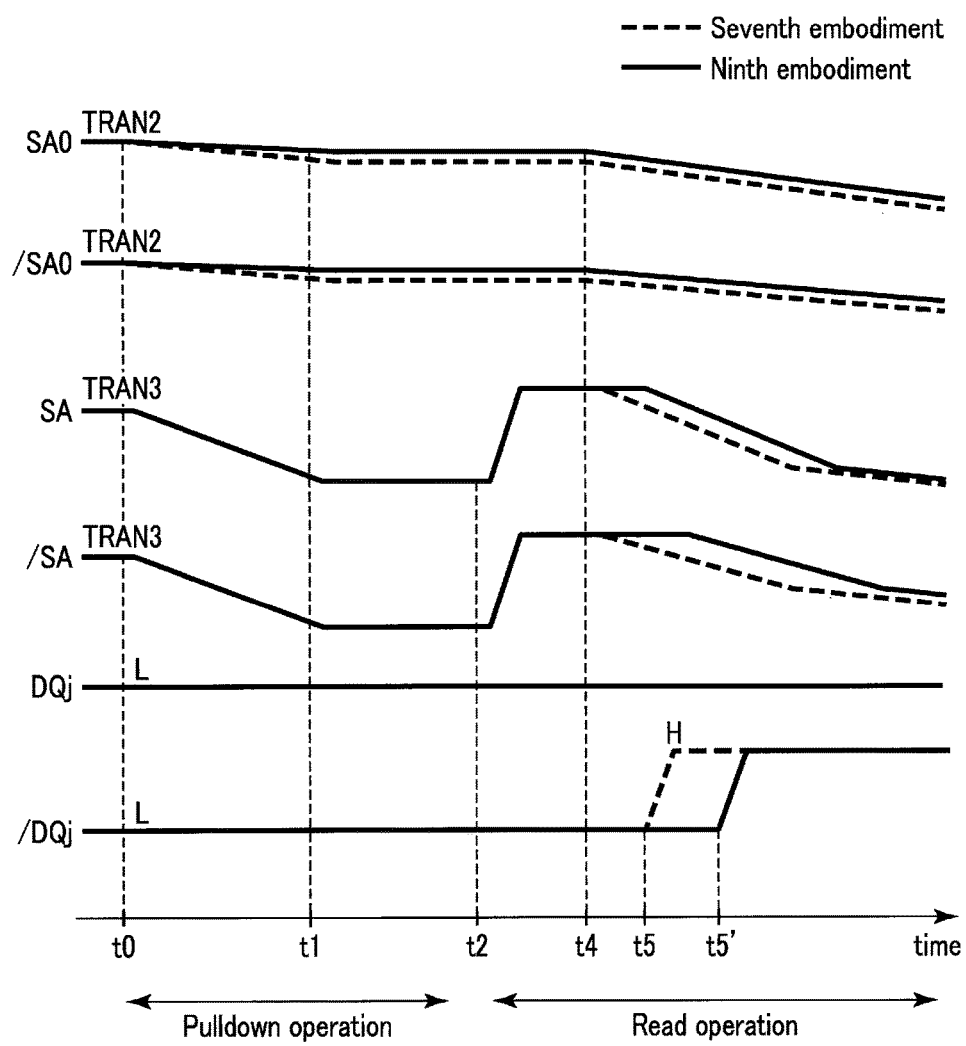
F I G. 40

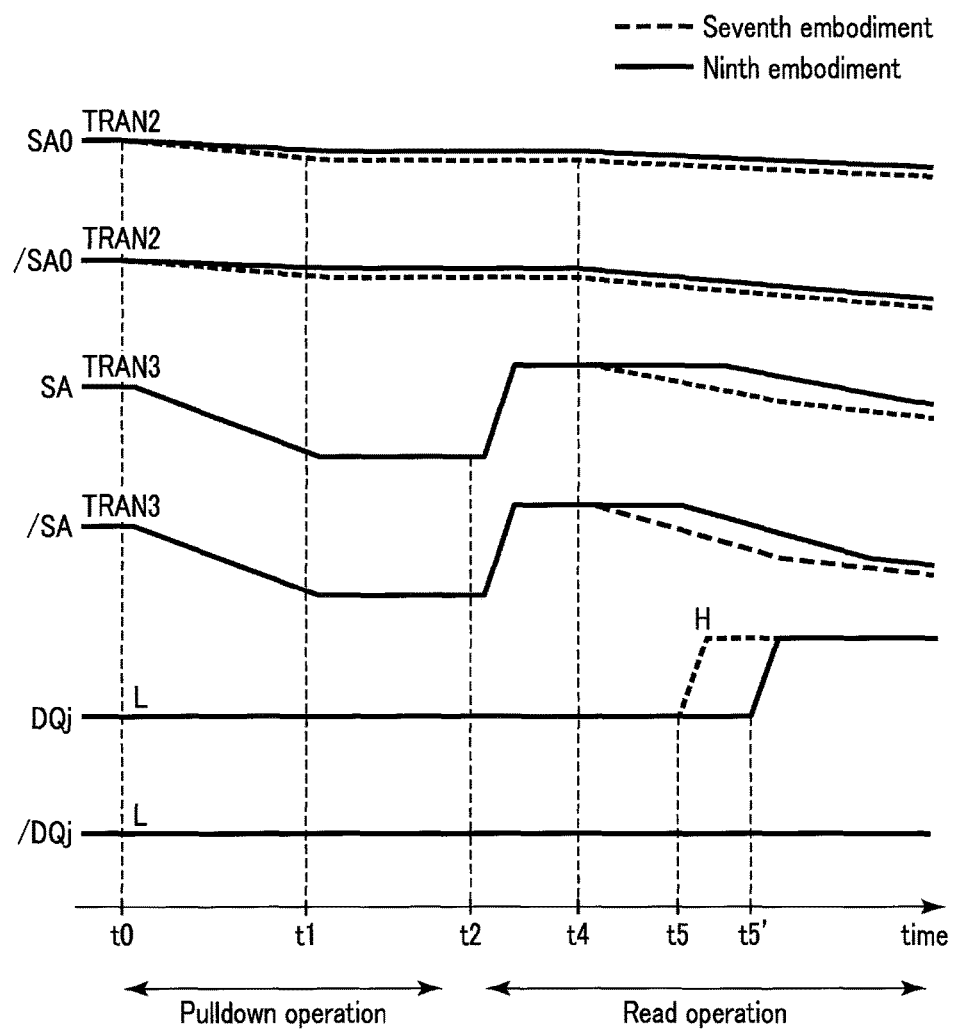
F I G. 41

SEMICONDUCTOR MEMORY DEVICE INCLUDING VARIABLE RESISTANCE ELEMENT

CROSS-REFERENCE TO RELATED APPLICATIONS

This application is a Continuation-in-Part Application of U.S. patent application Ser. No. 14/846,291, filed Sep. 4, 2015 and claiming the benefit of U.S. Provisional Application No. 62/140,068, filed Mar. 30, 2015, the entire contents of which are incorporated herein by reference.

FIELD

Embodiments described herein relate generally to a semiconductor memory device.

BACKGROUND

A charge transfer device is used in a semiconductor memory device.

BRIEF DESCRIPTION OF THE DRAWINGS

FIG. 2 is a plan view of a memory cell array included in the semiconductor memory device according to the first embodiment;

FIG. 3 is a circuit diagram of the memory cell array included in the semiconductor memory device according to the first embodiment;

FIG. 4 is a sectional view of a memory element included in the semiconductor memory device according to the first embodiment;

FIG. 7 is a circuit diagram of the page buffer included in the semiconductor memory device according to the first embodiment;

FIG. 8 is a circuit diagram of a sequence controller included in the semiconductor memory device according to the first embodiment;

FIG. 14 is a circuit diagram of the memory cell array and the page buffer included in the semiconductor memory device according to the second embodiment;

FIG. 15 is a circuit diagram of the page buffer included in the semiconductor memory device according to the second embodiment;

FIG. 16 is a circuit diagram of the sequence controller included in the semiconductor memory device according to the second embodiment;

FIGS. 17 and 18 are circuit diagrams of the page buffer included in the semiconductor memory device according to a third embodiment;

FIGS. 20 and 21 are timing charts of the pulldown operation and the read operation of the semiconductor memory device according to the third embodiment;

FIG. 25 is a circuit diagram of the page buffer included in the semiconductor memory device according to a fifth embodiment;

FIG. 26 is a circuit diagram of the sequence controller included in the semiconductor memory device according to the fifth embodiment;

FIG. 29 is a circuit diagram of the page buffer included in the semiconductor memory device according to the sixth embodiment;

FIG. 30 is a circuit diagram of the sequencer included in a semiconductor memory device according to the sixth embodiment;

FIG. 32 is a circuit diagram of the memory cell array and the page buffer included in a semiconductor memory device according to the seventh embodiment;

FIGS. 34, 35, and 36 is a timing chart of the pulldown operation and the read operation of the semiconductor memory device according to the seventh embodiment;

FIG. 37 is a circuit diagram of the memory cell array and the page buffer included in a semiconductor memory device according to the eighth embodiment;

FIG. 38 is a circuit diagram of the source line driver included in the semiconductor memory device according to the eighth embodiment;

FIG. 39 is a circuit diagram of a sequence controller included in the semiconductor memory device according to the eighth embodiment.

FIGS. 40 and 41 is a timing chart of the pulldown operation and the read operation of the semiconductor memory device according to the eighth embodiment;

DETAILED DESCRIPTION

Figure 1:
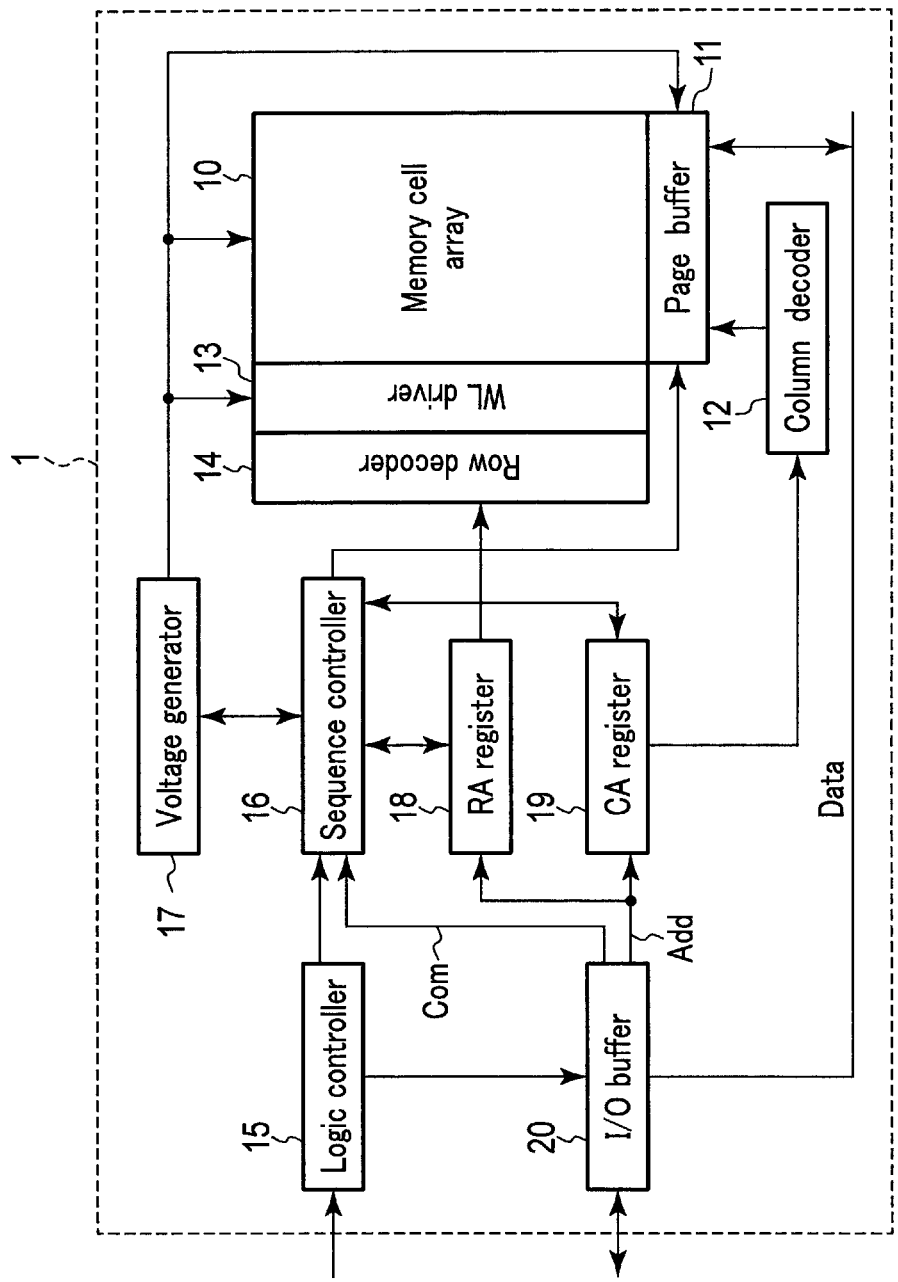
FIG. 1 is a block diagram of a semiconductor memory device according to a first embodiment.

In general, according to one embodiment, there is provided a semiconductor memory device comprising: a memory cell including a variable resistance element; a first circuit including a first resistance element and a first transistor; a first bit line; a second transistor; and a sense circuit. The memory cell and the first circuit are connected to the first bit line. One end and the other end of the second transistor are connected to the first bit line and the sense circuit respectively. During a first operation before reading data of the memory cell a voltage of the first bit line falls to a first voltage and the first and second transistors are turned off in response to a fall of the voltage of the first bit line to the first voltage.

The embodiments will be described below with reference to the drawings. In the description that follows, the same reference numerals are attached to structural elements having substantially the same function and configuration, and a duplicate description will be provided only when necessary. The drawings are schematic. Each embodiment illustrates a device and a method to embody the technical idea of the embodiment, and the technical idea of the embodiment does not intend to limit the materials, shapes, structures, arrangements and the like of components to the following ones.

First Embodiment

[1] Configuration

The basic configuration of a semiconductor memory device 1 will be described using FIG. 1. FIG. 1 is a block diagram of the semiconductor memory device 1 according to the first embodiment.

The semiconductor memory device 1 includes a memory cell array 10, a page buffer 11, a column decoder 12, a word line driver (WL driver) 13, a row decoder 14, a logic controller 15, a sequence controller (sequencer) 16, a voltage generator 17, a row address register (RA register) 18, a column address register (CA register) 19, and an input/output buffer (I/O buffer) 20.

The memory cell array 10 is a set of a plurality of nonvolatile memory cells MC, each associated with a source line and a bit line. As the memory cell MC, for example, a resistance change type memory cell such as an interfacial phase-change memory (iPCM) is used. Hereinafter, the semiconductor memory device 1 using iPCM as the memory cell MC is taken as an example in the description that follows.

An iPCM can take either a high-resistance state or a low-resistance state. A phase transition can be caused bidirectionally between the high-resistance state and the low-resistance state. Accordingly, an iPCM stores data "1" or "0". The high-resistance state is set as "1" data and the low-resistance state is set as "0" data. However, the high-resistance state may be set as "0" data and the low-resistance state may be set as "1" data and the settings are not specifically limited.

Incidentally, as the memory cell MC, a resistance change type memory element such as resistance random access memory (ReRAM), phase-change RAM (PRAM), ferroelectric NAND-type memory (FeNAND), magnetic random access memory (MRAM), ion memory may be used.

The column decoder 12 receives a column address signal from the CA register 19 to decode the column address signal. The decoded column address signal is set to the page buffer 11. The page buffer 11 selects the column in accordance with the column address signal.

When data is read, the page buffer 11 senses data read to a bit line from the memory cell MC and temporarily stores the read data. When data is written, the page buffer 11 temporarily stores write data sent from the input/output buffer 20 and transfers the write data to a bit line.

The row decoder 14 receives a row address signal from the RA register 18 to decode the row address signal. The decoded row address signal is sent to the word line driver 13. The word line driver 13 selects the row in accordance with the row address signal.

The word line driver 13 receives a row address signal from the row decoder 14 and applies appropriate voltages to a word line WL and a dummy word line DWL of the memory cell array 10.

The logic controller 15 receives control signals such as a chip enable signal, a command enable signal, an address latch enable signal, a write enable signal, and a read enable signal from outside. The logic controller 15 controls the operation of the input/output buffer 20 based on such control signals. Also, the logic controller 15 sends control signals to the sequencer 16.

The sequencer 16 controls the overall operation of the semiconductor memory device 1. The sequencer 16 executes sequence control of writing, reading, or erasing of data in accordance with a command Com received from the input/output buffer 20.

The voltage generator 17 generates a voltage needed for writing or reading or erasing data and supplies the voltage to the memory cell array 10, the page buffer 11, and the word line driver 13. The voltage generator 17 contains a voltage boosting circuit, a voltage lowering circuit, and a band-gap reference (BGR) circuit (no circuit is shown). The voltage boosting circuit generates a voltage higher than an external power supply VDD by a charge pump circuit. The voltage lowering circuit generates a voltage lower than the external power supply VDD by a PMOS feedback circuit or a NMOS source follower circuit. The BGR circuit generates a constant voltage that is independent of the temperature and the external power supply VDD. The voltage generated by the BGR circuit is used as a reference voltage.

The RA register 18 receives and holds a row address signal via the input/output buffer 20. The row address signal held in the RA register 18 is sent to the row decoder 14.

The CA register 19 receives and holds a column address signal via the input/output buffer 20. The column address signal held in the CA register 19 is sent to the column decoder 12.

The input/output buffer 20 receives an address signal Add, a command Com. and data from outside. The command Com is sent to the sequencer 16. The address signal Add contains a column address signal and a row address signal. The column address signal is sent to the CA register 19 and the row address signal is sent to the RA register 18. When data is written, the input/output buffer 20 sends write data received from outside to the page buffer 11. When data is read, the input/output buffer 20 outputs read data received from the page buffer 11 to the outside.

[1-1] Memory Cell Array 10

The configuration of the memory cell array 10 will be described using FIGS. 2 and 3. FIG. 2 is a plan view of the memory cell array 10 included in the semiconductor memory device 1 according to the first embodiment. FIG. 3 is a circuit diagram of the memory cell array 10 included in the semiconductor memory device 1 according to the first embodiment.

The memory cell array 10 includes a plurality of bit lines, a plurality of word lines, and a plurality of memory cells.

The plurality of bit lines are arranged in a WL direction and contain m (m is a natural number equal to 1 or greater) bit line pairs (bit lines BL, /BL). FIG. 2 shows one bit line pair (bit lines BLj, /BLj (j is an integer equal to 0 or greater)).

The plurality of word lines are arranged in a BL direction and contain k (k is a natural number greater than or equal to 1) word line pairs (word lines WLL, WLR). The (k−1)-th word line pair WLL, WLR will be denoted as word lines WLL(k−1), WLR(k−1). The i-th (i is an integer greater than or equal to 0) word line pair WLL, WLR will be denoted as word lines WLLi, WLRi.

Memory cells are arranged, for example, in a staggered configuration. The memory cell to which the bit line BLj and the word line WLLi are connected will be denoted as the memory cell MCL and the memory cell to which the bit line /BLj and the word line WLRi are connected will be denoted as the memory cell MCR. The memory cells MCL, MCR are configured similarly, and are denoted simply as memory cells MC in the description that follows.

The circuit configuration of the memory cell array 10 will be described using FIG. 3.

The memory cell array 10 includes a plurality of source lines. Source lines SL are arranged in the BL direction and as many source lines as the number of word lines are provided. Each source line SL is arranged between word lines.

The memory cell MC includes a memory element 30 and a select transistor 31. The memory element 30 is configured to the iPCM. One end of the memory element 30 is connected to the bit line and the other end is connected to one end of the select transistor 31. The select transistor 31 is an n-channel MOS transistor (NMOS transistor), with one end thereof connected to the source line SL and the gate thereof connected to the word line.

The bit lines BLj, /BLj are connected to the page buffer 11. One column of the memory cell array 10 is composed of one bit line and one reference bit line.

The word lines WLLi, WLRi are connected to the word line driver 13. One row of the memory cell array 10 is composed of one word line, one dummy word line and one source line SL.

With the above configuration, when data is read from or written to the memory cell MC, the page buffer 11 can pass a current to the memory cell MC selected by the word line and the bit line.

Incidentally, the order of connection of the memory element 30 and the select transistor 31 may be reversed. In such a case, one end of the memory element 30 is connected to the source line SL and the other end is connected to one end of the select transistor 31. The other end of the select transistor 31 is connected to the bit line and the gate thereof is connected to the word line.

An example of the configuration of the memory element 30 in iPCM will be described using FIG. 4. FIG. 4 is a sectional view of the memory element 30 included in the semiconductor memory device 1 according to the first embodiment.

The memory element 30 includes a lower electrode 30A, a memory layer 30B, and an upper electrode 30C.

The lower electrode 30A and the upper electrode 30C are provided across the memory layer 30B and are used for connection to a circuit. The memory layer 30B is a superlattice including, for example, germanium atoms Ge, tellurium atoms Te, and antimony atoms Sb and in which a germanium tellurium layer and an antimony-tellurium layer are stacked. The superlattice changes to a high-resistance state or a low-resistance state by the crystalline state changes. More specifically, if, for example, a necessary voltage pulse is applied to a superlattice, germanium atoms Ge in the sueprlattice move, thereby changing the bonded state of germanium atoms Ge and tellurium atoms Te. In an iPCM, for example, the low-resistance state is called the set state and the high-resistance state is called the reset state.

Returning to FIG. 2, the memory cell array 10 comprises a dummy word line pair, a plurality of reference cells RCL, RCR, and a plurality of pulldown circuits PDL, PDR.

The dummy word line pair (dummy word lines DWLL, DWLR) is contained in a plurality of word lines. The dummy word line pair is provided in accordance with the number of reference cells RCL, RCR connected to one bit line. The dummy word line pair is arranged such that, for example, the pluralities of word lines are sandwiched between the dummy word line pair and the page buffer 11.

One pair of reference cells RCL, RCR are provided on the bit lines BLj, /BLj respectively and arranged in a staggered configuration together with the memory cells MCL, MCR. One end of the reference cell RCL is connected to the dummy word line DWLL and the other end thereof is connected to the bit line BLj. One end of the reference cell RCR is connected to the dummy word line DWLR and the other end thereof is connected to the bit line /BLj.

The pulldown circuits PDL, PDR have a function to pull down charges of a bit line and provided in accordance with the number of bit lines. The pulldown circuit PDL is connected to the bit line BLj and the pulldown circuit PDR is connected to the bit line /BLj. The pulldown circuits PDL, PDR are arranged such that a plurality of memory cells and a plurality of reference cells are sandwiched between the pulldown circuits and the page buffer 11. That is, the pulldown circuits PDL, PDR are arranged at an edge portion of the memory cell array 10. The pulldown circuits PDL, PDR are simplified as pulldown circuit PD in the description below.

Figure 5:
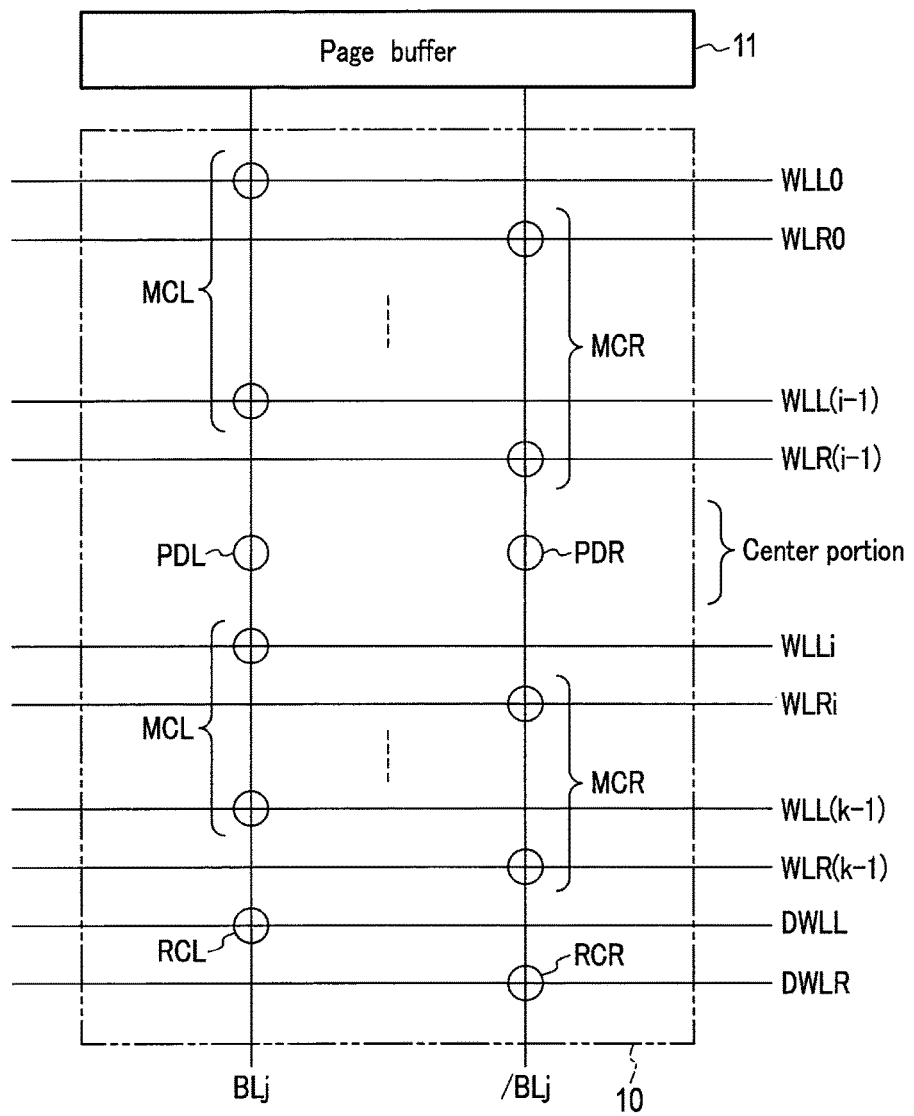
FIG. 5 is a plan view of the memory cell array included in the semiconductor memory device according to the first embodiment.

The pulldown circuits PDL, PDR may be arranged, as shown in FIG. 5, in a center portion of the memory cell array 10. More specifically, the pulldown circuits PDL, PDR are arranged between the word lines WLLi, WLRi and the word lines WLL(i−1), WLR(i−1). Thus, the pulldown circuits PDL, PDR may be arranged between word lines to be arrayed and are not specifically limited.

When data of the memory cell MCL is read by the bit line pair BLj, /BLj, the reference cell RCR is used. On the other hand, when data of the memory cell MCR is read by the bit line pair BLj, /BLj, the reference cell RCL is used. Thus, when data of the memory cell MC connected to one bit line of the bit line pair BLj, /BLj is read, the reference cell connected to the other bit line is used.

Figure 6:
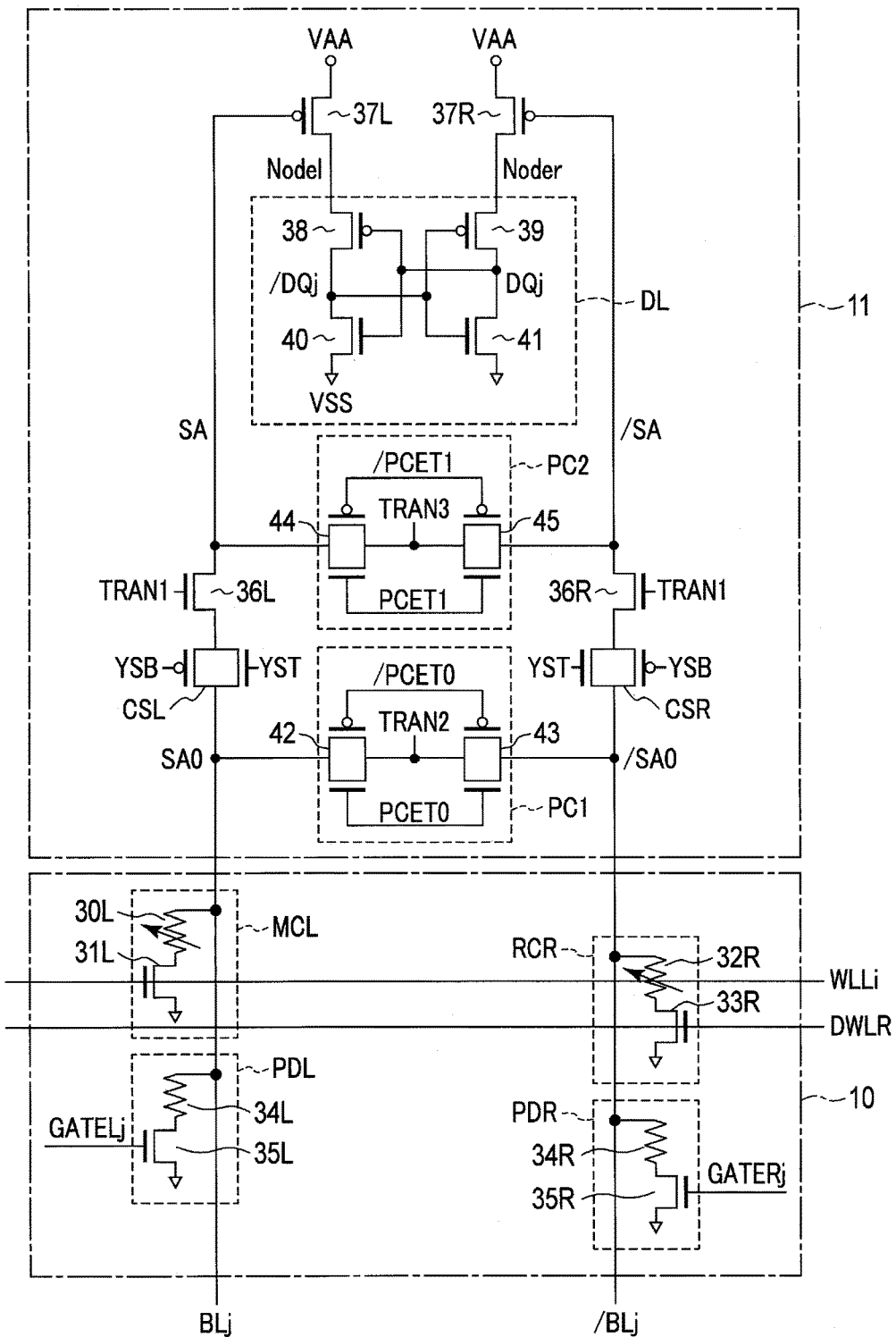
FIG. 6 is a circuit diagram of the memory cell array and a page buffer included in the semiconductor memory device according to the first embodiment.

The circuit configuration of the reference cell and the pulldown circuit PD will be described using FIG. 6. FIG. 6 is a circuit diagram of the memory cell array 10 and the page buffer 11 included in the semiconductor memory device according to the first embodiment and shows one bit line pair BLj, /BLj and the page buffer 11 corresponding thereto. FIG. 6 also shows one memory cell MCL and one reference cell RCR to illustrate a read operation of data stored in the memory cell MCL to which the word line WLLi is connected. In FIG. 6, the memory element 30 and the select transistor 31 corresponding to the bit line BLj are shown as a memory element 30L and the select transistor 31L, respectively. Details of the circuit configuration and operation of the page buffer 11 will be described later.

The reference cell RCR comprises a reference resistance element 32R (32) and a select transistor 33R (33). The reference resistance element 32 is used when data is read and the resistance value of the reference resistance element 32 is set to an intermediate level between the high-resistance state and the low-resistance state of the memory element 30. One end of the reference resistance element 32R is connected to the bit line /BLj and the other end thereof is connected to one end of the select transistor 33R. The select transistor 33R is an n-channel MOS transistor, and a ground voltage VSS (for example, 0 V) is applied to the other end thereof and the gate thereof is connected to the dummy word line DWLR. That the ground voltage VSS is applied means that a grounding terminal is connected.

On the other hand, the reference cell RCL (not shown) comprises a reference resistance element 32L (32) and a select transistor 33L (33). One end of the reference resistance element 32L is connected to the bit line BLj and the gate of the select transistor 33L is connected to the dummy word line DWLL. The remaining configuration of the reference cell RCL is the same as that of the reference cell RCR.

Incidentally, the order of connection of the reference resistance element 32 and the select transistor 33 may be reversed. In such a case, the ground voltage is applied to one end of the reference resistance element 32 and the other end thereof is connected to one end of the select transistor 33. The other end of the select transistor 33 is connected to the bit line.

The pulldown circuit PDL comprises a pulldown resistance element 34L (34) and a transistor 35L (35). The pulldown resistance element 34 is used to precharge the voltage of the bit line to the gate voltage of the charge transfer transistor minus threshold voltage of the charge transfer transistor in a short time, and the resistance value of the pulldown resistance element 34 is, for example, approximately the same as that of the reference resistance element 32. One end of the pulldown resistance element 34L is connected to the bit line BLj and the other end thereof is connected to one end of the transistor 35L. The transistor 35L (35) is an n-channel MOS transistor. The ground voltage is applied to the other end of the transistor 35L and a control signal GATELj is input into the gate thereof.

On the other hand, the pulldown circuit PDR (not shown) comprises a pulldown resistance element 34R (34) and a transistor 35R (35). One end of the pulldown resistance element 34R is connected to the bit line /BLj and a control signal GATERj is input into the gate of the transistor 35R. The remaining configuration of the pulldown circuit PDR is the same as that of the pulldown circuit PDL.

Incidentally, the order of connection of the pulldown resistance element 34 and the transistor 35 may be reversed. In such a case, the ground voltage is applied to one end of the pulldown resistance element 34 and the other end thereof is connected to one end of the transistor 35. The other end of the transistor 35 is connected to the bit line BL.

[1-2] Page Buffer 11

The circuit configuration of the page buffer 11 will be described using FIG. 6. FIG. 6 is a circuit diagram of a memory cell array and a page buffer.

The page buffer 11 includes a column switch CS, a charge transfer transistor 36, a transistor 37, precharge circuits PC1, PC2, and a latch circuit DL.

The column switch CS is provided for each bit line pair to electrically connect the bit line pair intended for reading or writing and the page buffer 11. The column switches CS corresponding to the bit lines BLj, /BLj will be denoted as column switches CSL, CSR respectively.

The column switch CS is configured by, for example, a pair of n-channel MOS transistor and a p-channel MOS transistor (a transfer gate). The transfer gate is connected in parallel and includes an n-channel MOS transistor and a p-channel MOS transistor (PMOS transistor) into which column selection signals YST, YSB are input respectively in the gate. One end of the column switch CSL is connected to a bit line node SA0 and the other end thereof is connected to one end of a transistor 36L. One end of the column switch CSR is connected to a bit line node /SA0 and the other end thereof is connected to one end of a transistor 36R.

The charge transfer transistor 36 is configured by, for example, an n-channel MOS transistor and separates sense nodes SA, /SA of the page buffer 11 with a small capacity and the bit line nodes SA0, /SA0 on the bit line side with a large capacity. The charge transfer transistors 36 corresponding to the bit lines BLj, /BLj will be denoted as the transistors 36L, 36R respectively.

The other end of the transistor 36L is connected to the sense node SA and a voltage TRAN1 is applied to the gate thereof. The other end of the transistor 36R is connected to the sense node /SA and the voltage TRAN1 is applied to the gate thereof. The voltage TRAN1 is set higher than a threshold voltage Vth of the charge transfer transistor 36.

The transistor 37 is a p-channel MOS transistor and detects voltage fluctuations of the sense nodes SA, /SA of the page buffer 11 and forms a current path between the latch circuit DL and a power supply voltage VAA. The transistors 37 corresponding to the sense nodes SA, /SA will be denoted as transistors 37L, 37R.

The power supply voltage VAA is applied to one end of the transistor 37L, the other end thereof is connected to a node Nodel, and the gate thereof is connected to the sense node SA. The power supply voltage VAA is applied to one end of the transistor 37R, the other end thereof is connected to a node Noder, and the gate thereof is connected to the sense node /SA.

The precharge circuit PC1 includes switch elements 42, 43 to precharge the bit line nodes SA0, /SA0.

The switch element 42 is configured by, for example, a pair of n-channel MOS transistor and p-channel MOS transistor. The n-channel MOS transistor and p-channel MOS transistor are connected in parallel. Control signals PCET0, /PCET0 are input to the gate of the n-channel MOS transistor and the gate of the p-channel MOS transistor, respectively. One end of the switch element 42 is connected to the bit line node SA0 and a voltage TRAN2 is applied to the other end thereof. The voltage TRAN2 is set higher than a difference between the voltage TRAN1 and the threshold voltage of the charge transfer transistor 36.

The switch element 43 is configured in the same manner as the switch element 42 and one end thereof is connected to the bit line node /SA0 and the voltage TRAN2 is applied to the other end.

The precharge circuit PC2 includes switch elements 44, 45 to precharge the sense nodes SA, /SA.

The switch element 44 is configured by, for example, a pair of n-channel MOS transistor and p-channel MOS transistor. The n-channel MOS transistor and p-channel MOS transistor are connected in parallel. Control signals PCET1, /PCET1 are input to the gate of the n-channel MOS transistor and the gate of the p-channel MOS transistor, respectively. One end of the switch element 44 is connected to the sense node SA and a voltage TRAN3 is applied to the other end thereof. The voltage TRAN3 is, for example, the power supply voltage VAA and is set to a value that does not turn on the transistors 37L, 37R.

The switch element 45 is configured in the same manner as the switch element 44 and one end thereof is connected to the sense node /SA and the voltage TRAN3 is applied to the other end.

The latch circuit DL latches data read from bit lines. The latch circuit DL is configured by, for example, two inverter circuits in which mutual inputs are connected to mutual outputs (cross-coupled). The latch circuit DL includes p-channel MOS transistors 38, 39 and n-channel MOS transistors 40, 41.

One end of the transistor 38 is connected to the node Nodel, the other end thereof is connected to a node /DQj, and the gate thereof is connected to a node DQj. One end of the transistor 39 is connected to the node Noder, the other end thereof is connected to the node DQj, and the gate thereof is connected to the node /DQj.

One end of the transistor 40 is connected to the node /DQj, the ground voltage is applied to the other end thereof, and the gate thereof is connected to the node DQj. One end of the transistor 41 is connected to the node DQj, the ground voltage is applied to the other end thereof, and the gate thereof is connected to the node /DQj.

Another circuit configuration of the page buffer 11 will be described using FIG. 7.

The page buffer 11 includes a transistor 50. The transistor 50 is an n-channel MOS transistor and is used for a reset operation of a node connecting the transistor 37 and the latch circuit DL. The transistors 50 corresponding to the sense nodes Nodel, Noder will be denoted as transistors 50L, 50R respectively.

One end of the transistor 50L is connected to the node Nodel, the ground voltage is applied to the other end thereof, and a control signal Reset is input into the gate thereof. One end of the transistor 50R is connected to the node Noder, the ground voltage is applied to the other end thereof, and the control signal Reset is input into the gate thereof.

The logic circuit configuration of the sequencer 16 related to the operation of the page buffer 11 will be described using FIG. 8. FIG. 8 is a circuit diagram of the sequencer 16 included in the semiconductor memory device 1 according to the first embodiment. The sequencer 16 includes an inverter circuit 51 and control circuits 16L, 16R.

The inverter circuit 51 is used to control the column switch CS and inverts the column selection signal YST and outputs a column selection signal YSB.

The control circuit 16L includes an AND gate 52L, a NOR gate 53L, and an inverter circuit 54L and is used for the operation on the bit line BLj side in the page buffer 11. The control circuit 16R includes an AND gate 52R, a NOR gate 53R, and an inverter circuit 54R and is used for the operation on the bit line /BLj side in the page buffer 11.

The AND gate 52L performs an AND operation of a control signal /GATELj and a control signal WL and outputs a control signal WLL. The AND gate 52R performs an AND operation of a control signal /GATERj and the control signal WL and outputs a control signal WLR.

When data of the memory cell MCL to which the word line WLLi is connected is read, the control signal WLL is input into the word line WLLi. At this point, an "H" level signal is input into the word line DWLR.

On the other hand, when data of the memory cell MCR to which the word line WLRi is connected is read, the control signal WLR is input into the word line WLRi and at this point, an "H" level signal is input into the word line DWLL.

The NOR gate 53L performs a NOT-OR operation of the voltage of the node Nodel and a control signal /PreWL and outputs the control signal GATELj. The NOR gate 53R performs a NOT-OR operation of the voltage of the node Noder and the control signal /PreWL and outputs the control signal GATERj. The control signal /PreWL controls a pulldown operation described later.

The inverter circuit 54L inverts the control signal GATELj and outputs the control signal /GATELj. The inverter circuit 54R inverts the control signal GATERj and outputs the control signal /GATERj.

[2] Operation

Figure 9:
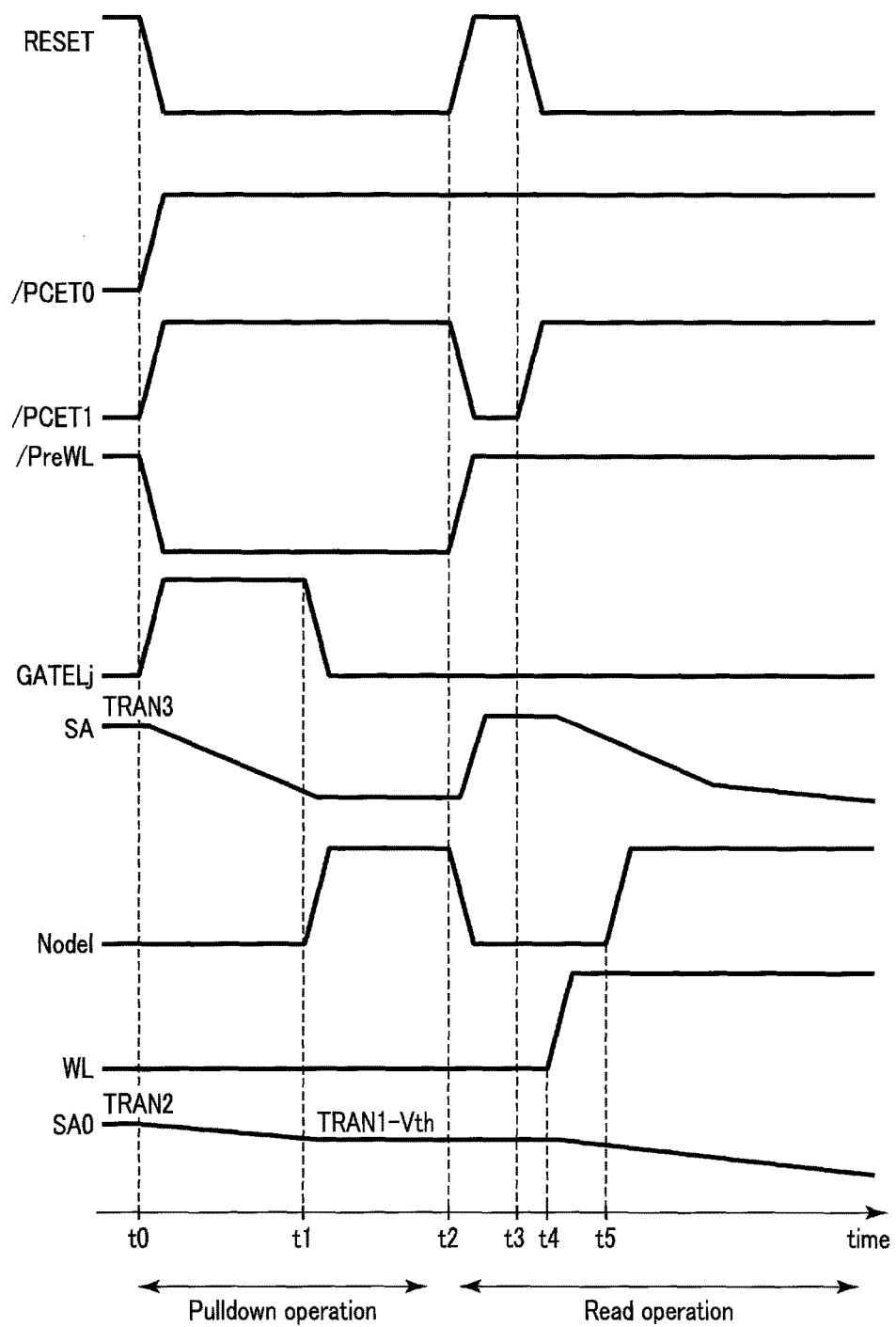
FIGS. 9, 10, and 11 are timing charts of a pulldown operation and a read operation of the semiconductor memory device according to the first embodiment.
Figure 10:
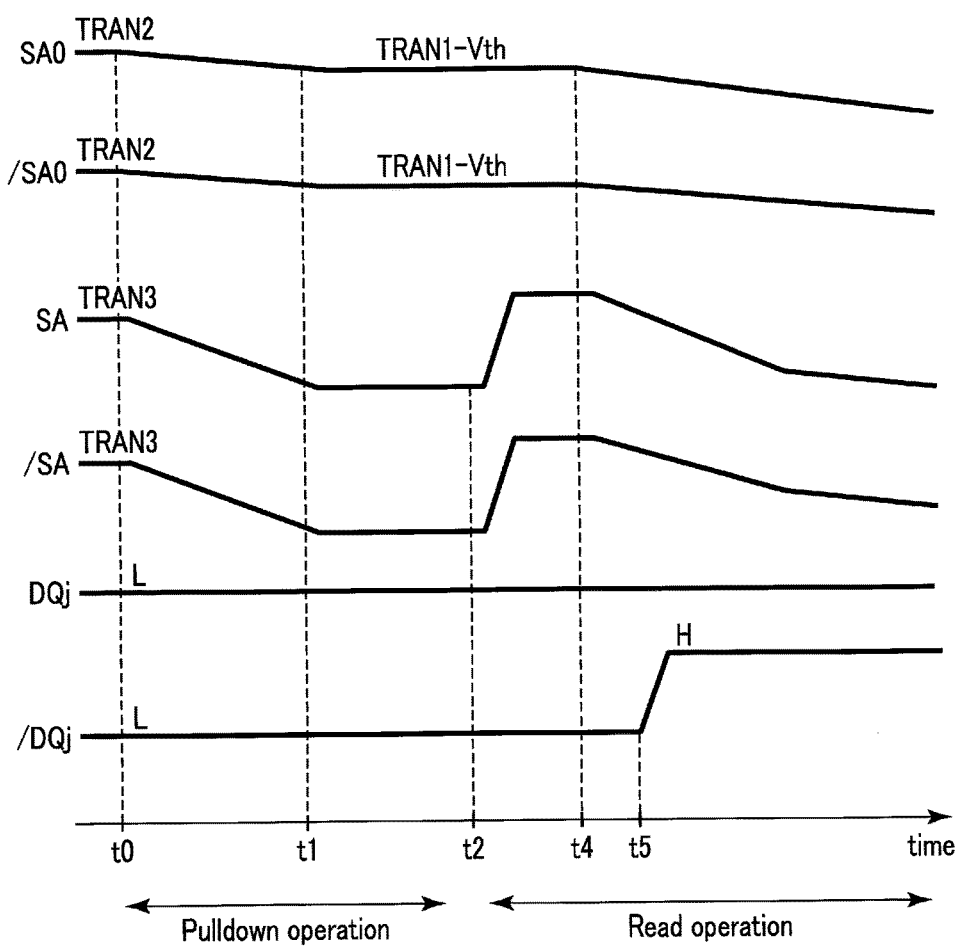
Figure 11:
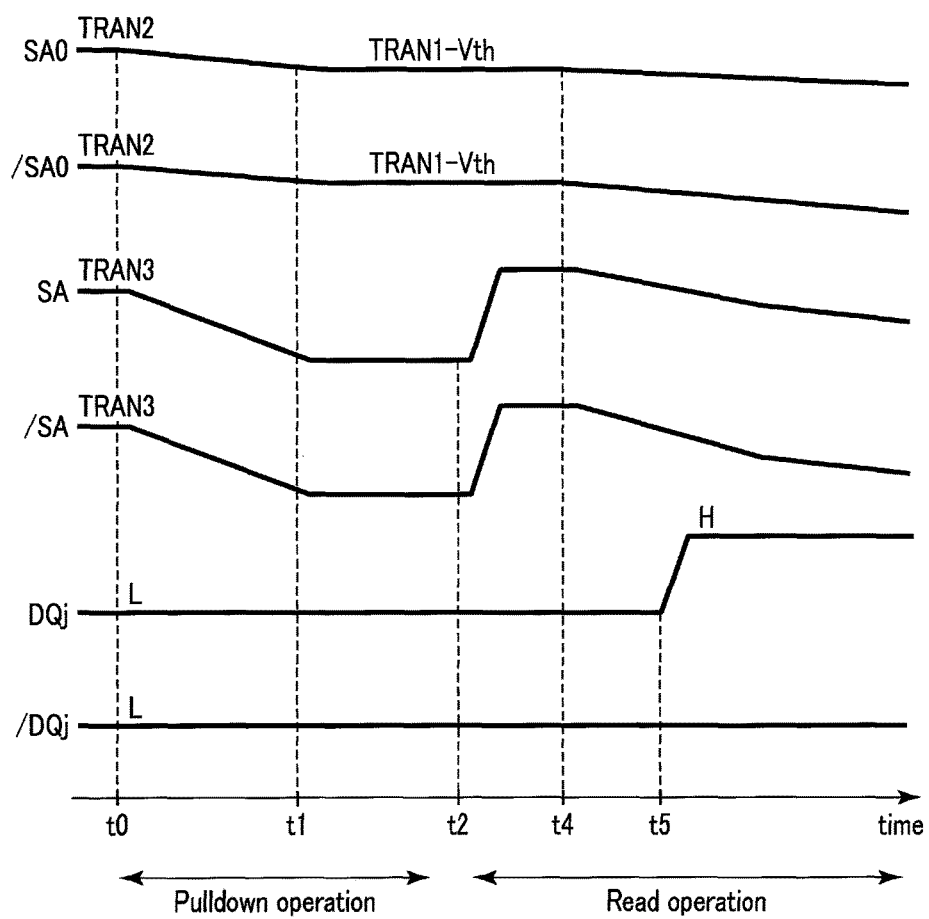

The pulldown operation and the read operation of the semiconductor memory device 1 will be described using FIGS. 9 to 11. FIGS. 9 to 11 are timing charts of the pulldown operation and the read operation of the semiconductor memory device 1 according to the first embodiment. When an element on the sense node SA side and an element on the sense node/SA side perform the same operation in the page buffer 11, the description of the element on the sense node/SA side is omitted.

In the description below, the column selection signal YSB corresponding to the selected memory cell MC is set to "L" level, and the column selection signal YST corresponding to the selected memory cell MC is set to "H" level during the pulldown operation and the read operation. When the column selection signals YSB and YST are set to the "L" level and the "H" level, respectively, the column select transistors CSL and CSR are turned on. Therefore, one bit line pair related to the selected memory cell MC is electrically connected to the page buffer 11 during the pulldown operation and the read operation.

Before a read operation of data is performed, first a reset operation is performed. More specifically, the control signal Reset is set to the "H" level and the control signals /PCET0, /PCET1 are set to the "L" level. The "L" level is a voltage at which an n-channel MOS transistor into which a control signal is input is turned off and a p-channel MOS transistor into which a control signal is input is turned on.

When the control signal Reset is set to the "H" level, the transistors 50L, 50R are turned on. Accordingly, the ground voltage is applied to the nodes Nodel, Noder and the nodes Nodel, Noder change to the "L" level (0 V).

When the control signal /PCET0 is set to the "L" level, the switch elements 42, 43 are turned on. Accordingly, the bit line nodes SA0, /SA0 are precharged to the voltage TRAN2. When the control signal /PCET1 is set to the "L" level, the switch elements 44, 45 are turned on. Accordingly, the sense nodes SA, /SA are precharged to the voltage TRAN3.

Next, the pulldown operation is performed. The pulldown operation lowers the voltage of the bit line nodes SA0, /SA0 and makes the memory cell array 10 and the page buffer 11 ready for reading after the pulldown operation. The operation of the memory cell array 10 and the page buffer 11 during pulldown operation and read operation will be described using FIG. 9.

First, the control signal Reset is set to the "L" level, the control signals /PCET0, /PCET1 are set to the "H" level, and the control signal /PreWL is set to the "L" level (time t0).

When the control signal Reset is set to the " " level, the transistor 50L turned off.

When the control signal /PCET0 is set to the "H" level, the switch elements 42, 43 are turned off. Accordingly, the precharge of the bit line nodes SA0, /SA0 by the precharge circuit PC1 is stopped. When the control signal /PCET1 is set to the "H" level, the switch elements 44, 45 are turned off. Accordingly, the precharge of the sense nodes SA, /SA by the precharge circuit PC2 is stopped. When the control signal /PreWL is set to the "L" level, the control signal GATELj changes to the "H" level to start the pulldown operation. More specifically, the node Nodel and the control signal /PreWL change to the "L" level and thus, the NOR gate 53L sets the control signal GATELj to the "H" level.

Accordingly, the transistor 35L of the pulldown circuit PDL is turned on and the voltage of the bit line node SA0 starts to drop.

At this point, the voltage TRAN1 (for example, 1.4 V) applied to the gate of the transistor 36L is smaller than the sum of the threshold voltage Vth (for example, 1.0 V) of the transistor 36L and the voltage (for example, 0.5 V) of the bit line node SA0 and thus, a charge is transferred from the sense node SA to the bit line node SA0 and the voltage of the sense node SA starts to drop.

When the voltage of the sense node SA drops to the "L" level, the transistor 37L is turned on (time t1).

When the transistor 37L is turned on, the power supply voltage VAA is applied to the node Nodel so that the node Nodel changes to the "H" level. When the node Nodel is at the "H" level, the NOR gate 53L sets the control signal GATELj to the "L" level. At this point, the voltage of the bit line node SA0 is approximately the same as (the voltage TRAN1–the threshold voltage Vth). The reason is that a transistor which transfers charge supplied from the sense node SA turns on only in a case of V(TRAN1)–Vth≥V (SA0).

Next, the control signal /PCET1 is set to the "L" level and then, the control signal Reset is set to the "H" level and the control signal /PreWL is set to the "H" level (time t2).

When the control signal Reset is set to the "H" level, the ground voltage is applied to the node Nodel and the voltage of the node Nodel changes to the "L" level (0 V). When the control signal /PCET1 is set to the "L" level, the sense nodes SA, /SA are precharged to the voltage TRAN3. When the control signal /PreWL is set to the "H" level, the NOR gate 53L sets the control signal GATELj to the "L" level to terminate the pulldown operation.

Next, the control signal Reset is set to the "L" level and the control signal /PCET1 is set to the "H" level (time t3). Accordingly, the ground voltage is no longer applied to the node Nodel and the precharge of the sense nodes SA, /SA ends.

Next, the control signal WL is set to the "H" level to start a read operation (time t4).

When the control signal WL is set to the "H" level, the control signal /GATELj is already at the "H" level and the control signal WL changes to the "H" level and thus, the AND gate 52L sets the control signal WLL to the "H" level. Accordingly, the control signal WLL is input into the word line WLLi. At this point, an "H" level signal is input into the word line DWLR.

When the word line WLLi changes to the "H" level, the select transistor 31L is turned on and the voltage of the bit line node SA0 starts to drop. Correspondingly, the charge transfer transistor 36L transfers a charge from the sense node SA to the bit line node SA0 and the voltage of the sense node SA drops. The speed at which the voltage drops is different in the sense nodes SA, /SA.

Next, the operation of the page buffer 11 after time t4 in FIG. 9 will be described using FIGS. 10 and 11. FIG. 10 is a timing chart when data of the memory cell MC to be read is "0" and FIG. 11 is a timing chart when data of the memory cell MC to be read is "1". The times in FIGS. 10 and 11 correspond to the times in FIG. 9.

If, as shown in FIG. 10, data of the memory cell MC to be read is "0", the voltage of the sense node SA first drops and the transistor 37L is first turned on. Accordingly, the power supply voltage VAA is applied to the node Nodel and the voltage of the node /DQj changes to the "H" level (time t5). Then, the transistor 39 is turned off and the transistor 41 is turned on and the node DQi changes to the "L" level. Accordingly, "0" data is latched in the latch circuit DL.

On the other hand, if, as shown in FIG. 11, data of the memory cell MC to be read is "1", the voltage of the sense node /SA first drops and the transistor 37R is first turned on. Accordingly, the power supply voltage VAA is applied to the node Noder and the voltage of the node DQj changes to the "H" level (time t5). Then, the transistor 38 is turned off and the transistor 40 is turned on. Accordingly, "1" data is latched in the latch circuit DL.

The speed of the voltage drop of the sense nodes SA, /SA is slower by way of a reference cell than by way of the memory cell MC (low-resistance state) in which "0" data is held and still slower by way of the memory cell MC (high-resistance state) in which "1" data is held than by way of the reference cell. That is, time t5 at which the transistor 37L is turned on when "0" data is read is earlier than time t5 at which the transistor 37R is turned on when "1" data is read.

Thus, data of the memory cell MCL connected to the bit line BLj can be read in the manner described above. When data of the memory cell MCR connected to the bit line /BLj is read, the operation corresponding to the bit line BLj and the operation corresponding to the bit line /BLj in the above case when data of the memory cell MCL is read may be reversed.

In the pulldown circuit PD, the resistance value of the pulldown resistance element 34 poses a problem. If the resistance value of the pulldown resistance element 34 is too small, the voltage of the bit line nodes SA0, /SA0 can be caused to drop in a shorter time, but the voltage of the bit line nodes SA0, /SA0 may be caused to drop too far and there is the possibility that the voltage of the bit line nodes SA0, /SA0 is caused to drop below the TRAN1 voltage-threshold voltage.

If, on the other hand, the resistance value of the pulldown resistance element 34 is too large, the voltage of the bit line nodes SA0, /SA0 can be just adjusted to the TRAN1 voltage-threshold voltage, but it may take too much time.

Thus, the speed at which the pulldown circuit PD causes the voltage to drop and the speed at which a memory cell causes the voltage to drop is desirably such an extent to which time constants are matched. More specifically, the resistance value of the pulldown resistance element 34 is desirably equal to the resistance value of the memory element 30 in a low-resistance state or more and equal to the resistance value of the memory element 30 in a high-resistance state or less and generally set to the resistance value or so of a reference cell.

[3] Effect of the First Embodiment

In a resistance change type semiconductor memory device, a technology of sensing using a charge transfer device (charge transfer transistor) is widely known. The charge transfer transistor is configured by an n-channel MOS transistor, separates a bit line with a large capacity and a sense node with a small capacity, and transfers a micro-charge on the bit line side to the sense node side. Accordingly, voltage changes of the sense node increase, making sensing easier.

If such a configuration is adopted, however, a problem of a longer time to precharge the voltage on the bit line side to (the gate voltage of the charge transfer transistor-threshold voltage of the charge transfer transistor) is posed.

Thus, in the semiconductor memory device 1 according to the first embodiment, the time of precharge is reduced by causing the voltage on the bit line side to drop by a pulldown operation before a read operation. More specifically, the pulldown circuit PD is provided for each bit line. The pulldown circuit PD is turned on before a read operation to cause the voltage of the bit line nodes SA0, /SA0 to drop. When the voltage of the bit line nodes SA0, /SA0 drops to (the gate voltage of the charge transfer transistor 36-threshold voltage of the charge transfer transistor 36), the pulldown circuit PD is turned off to enable a read operation. Accordingly, the time to precharge the bit line nodes SA0, /SA0 before reading can be reduced. With the above configuration, the semiconductor memory device 1 can make the operation faster.

In addition, the semiconductor memory device 1 according to the first embodiment includes the p-channel MOS transistor 37 in which the sense node SA is connected to the gate and read data is transferred to the latch circuit DL by the operation of the transistor 37. Accordingly, the latch circuit DL can automatically hold read data without the timing being provided from outside. With the above configuration, the semiconductor memory device 1 can reduce the probability of erroneously reading data.

Second Embodiment

A semiconductor memory device 1 according to the second embodiment uses a diode for the selection of a memory cell MC and the operation of a pulldown circuit PD.

Figure 12:
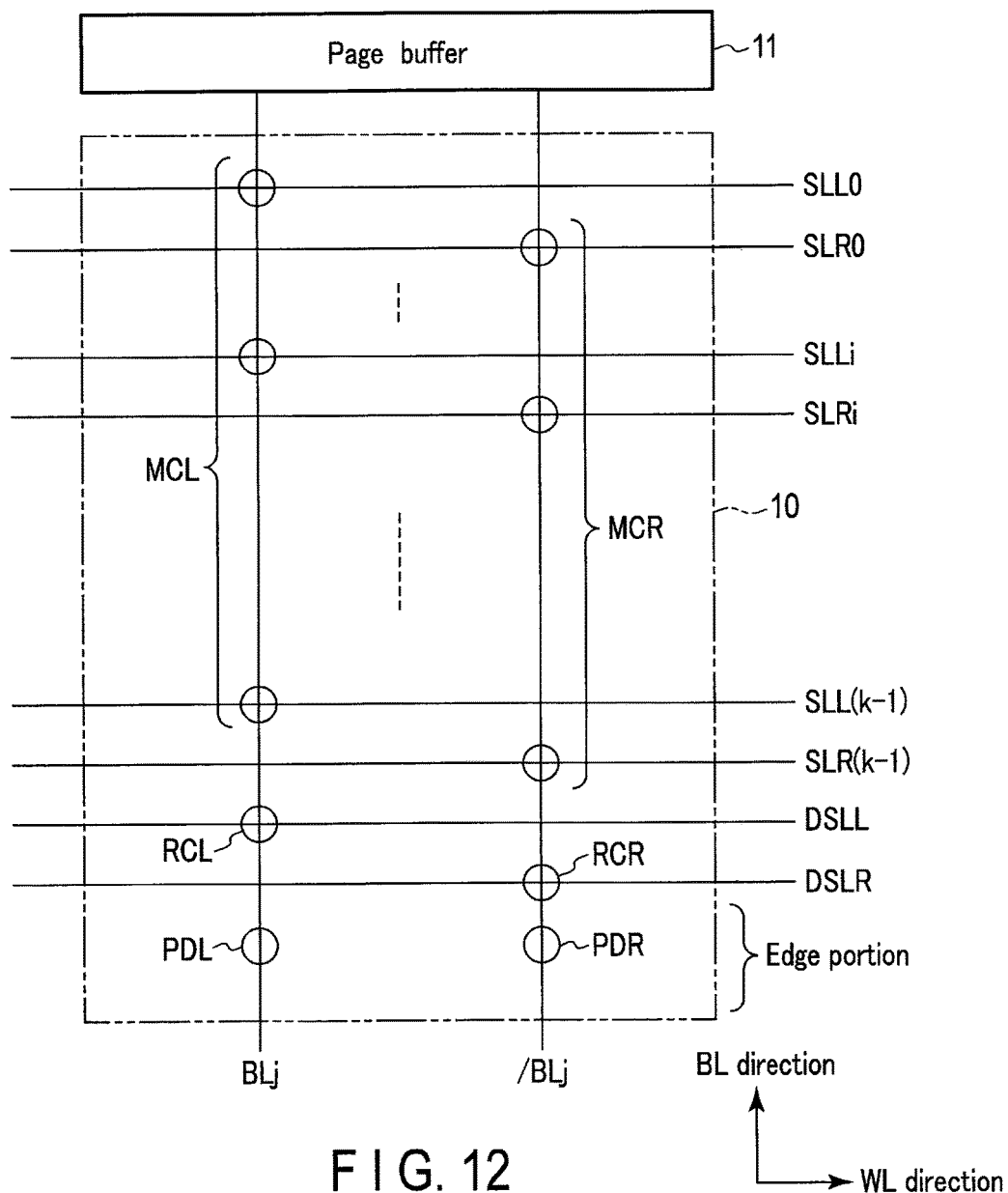
FIG. 12 is a plan view of the memory cell array included in the semiconductor memory device according to a second embodiment.
Figure 13:
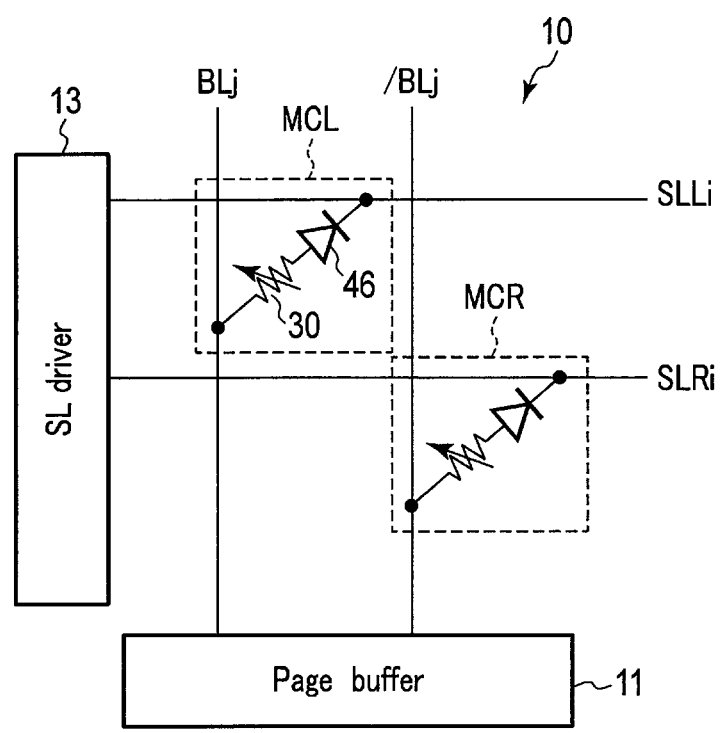
FIG. 13 is a circuit diagram of the memory cell array included in the semiconductor memory device according to the second embodiment.

The configuration of a memory cell array 10 will be described using FIGS. 12 and 13. FIG. 12 is a plan view of the memory cell array 10 included in the semiconductor memory device 1 according to the second embodiment. FIG. 13 is a circuit diagram of the memory cell array 10 included in the semiconductor memory device 1 according to the second embodiment.

The memory cell array 10 includes a plurality of bit lines, a plurality of source lines, and a plurality of memory cells.

The plurality of bit lines are arranged in a source line direction and contain m (m is a natural number equal to 1 or greater) bit line pairs (bit lines BL, /BL). FIG. 12 shows one bit line pair (bit lines BLj, /BLj (j is an integer equal to 0 or greater)).

The plurality of source lines are arranged in a BL direction and contain k (k is a natural number greater than or equal to 1) source line pairs (source lines SLL, SLR). The (k−1)-th source line pair SLL, SLR will be denoted as source lines SLL(k−1), SLR(k−1). The i-th (i is an integer greater than or equal to 0) source line pair SLL, SLR will be denoted as source lines SLLi, SLRi.

The circuit configuration of the memory cell array 10 will be described using FIG. 13.

A plurality of memory cells are arranged, for example, in a staggered configuration. The memory cell to which the bit line BLj and the source line SLLi are connected will be denoted as the memory cell MCL, and the memory cell to which the bit line /BLj and the source line SLRi are connected will be denoted as the memory cell MCR.

The memory cell MC includes a memory element 30 and a diode 46. One end of the memory element 30 is connected to the bit line and the other end thereof is connected to the anode of the diode 46. The cathode of the diode 46 is connected to the source line.

The bit lines BLj, /BLj are connected to the page buffer 11. One column of the memory cell array 10 is connected to one bit line.

The source lines SLLi, SLRi are connected to a source line driver (SL driver) 13. One row of the memory cell array 10 is connected to one source line. For the selection of the memory cell MC, a voltage equal to a built-in potential or more is applied to the diode 46.

Incidentally, the order of connection of the memory element 30 and the diode 46 may be reversed. In such a case, one end of the memory element 30 is connected to the source line and the other end is connected to the cathode of the diode 46. The anode of the diode 46 is connected to the bit line.

As the diode 46, a diode-connected transistor may be used.

Returning to FIG. 12, the memory cell array 10 includes a dummy source line pair, reference cells RCL, RCR, and pulldown circuits PDL, PDR.

The dummy source line pair (dummy source lines DSLL, DSLR) is included in a plurality of source lines. The dummy source line DSLL is connected to the reference cell RCL and the dummy source line DSLR is connected to the reference cell RCR. The dummy source line pair is arranged such that, for example, the plurality of source lines are sandwiched between the dummy source line pair and the page buffer 11.

The arrangement of the pulldown circuits PDL, PDR is the same as in the first embodiment.

The circuit configuration of the reference cell and the pulldown circuit PD will be described using FIG. 14. FIG. 14 is a circuit diagram of the memory cell array 10 and the page buffer 11 included in the semiconductor memory device 1 according to the second embodiment. FIG. 14 shows one memory cell MCL to which the source line SLLi is connected and one reference cell RCR. In FIG. 14, the diode 46 corresponding to the bit line BLj is shown as a diode 46L.

The reference cell RCR includes a reference resistance element 32R (32) and a diode 47R (47). One end of the reference resistance element 32R is connected to the bit line /BLj and the other end thereof is connected to the anode of the diode 47R. The cathode of the diode 47R is connected to the dummy source line DSLR.

On the other hand, the reference cell RCL (not shown) includes a reference resistance element 32L (32) and a diode 47L (47). One end of the reference resistance element 32L is connected to the bit line BLj and the other end thereof is connected to the anode of the diode 47L. The cathode of the diode 47L is connected to the dummy source line DSLL.

Incidentally, the order of connection of the reference resistance element 32 and the diode 47 may be reversed. In such a case, one end of the reference resistance element 32 is connected to the source line SL and the other end is connected to the cathode of the diode 47. The anode of the diode 47 is connected to the bit line.

The pulldown circuit PDL includes a pulldown resistance element 34L (34) and a diode 48L (48). One end of the pulldown resistance element 34L is connected to the bit line BLj and the other end thereof is connected to the anode of the diode 48L. The cathode of the diode 48L is connected to a node DIOL.

On the other hand, the pulldown circuit PDR includes a pulldown resistance element 34R (34) and a diode 48R (48). One end of the pulldown resistance element 34R is connected to the bit line /BLj and the other end thereof is connected to the anode of the diode 48R. The cathode of the diode 48R is connected to a node DIO_R.

Incidentally, the order of connection of the pulldown resistance element 34 and the diode 48 may be reversed. In such a case, one end of the pulldown resistance element 34 is connected to the node DIO_L or DIO_R and the other end is connected to the cathode of the diode 48. The anode of the diode 48 is connected to the bit line.

The circuit configuration of the page buffer 11 shown in FIG. 14 is the same as in the first embodiment.

The circuit configuration of the source line driver 13 will be described using FIG. 15.

The source line driver 13 includes transistors 56L, 56R, 58L, 58R.

The transistor 56L is an n-channel MOS transistor and one end thereof is connected to the source line SLLi, the ground voltage is applied to the other end, and a control signal DIOON_L is input into the gate thereof. The transistor 56R is an n-channel MOS transistor and one end thereof is connected to the source line SLRi, the ground voltage is applied to the other end, and the control signal DIOON_R is input into the gate thereof. When the transistors 56L, 56R are turned on during a read operation, a charge is pulled from the bit line toward the grounding terminal through the memory cell MC and the reference cell RC, and the voltage of the bit line nodes SA0, /SA0 drops.

The transistor 58L is an n-channel MOS transistor and one end thereof is connected to the node DIO_L, the ground voltage is applied to the other end, and a control signal PULL_Lj is input into the gate thereof. The transistor 58R is an n-channel MOS transistor and one end thereof is connected to the node DIO_R, the ground voltage is applied to the other end, and a control signal PULL_Rj is input into the gate thereof. When the transistors 58L, 58R are turned on during a pulldown operation, a charge is pulled from the bit line toward the grounding terminal through the pulldown resistance element 34 and the voltage of the bit line nodes SA0, /SA0 drops.

A circuit (not shown) that controls the voltage of dummy source lines DSLL, DSLR corresponding to the reference cells RCL, RCR has a configuration in which, for example, the source lines SLLi, SLRi and the dummy source lines DSLL, DSLR in a circuit controlling the voltage of the memory cells MCL, MCR are interchanged.

Only differences in the logic circuit configuration of a sequencer 16 related to the operation of the page buffer 11 from the logic circuit configuration thereof in FIG. 8 will be described using FIG. 16. FIG. 16 is a circuit diagram of the sequencer 16 included in the semiconductor memory device 1 according to the second embodiment.

An AND gate 52L performs an AND operation of a control signal /PULL_Lj and a control signal Active and outputs the control signal DIOON_L. An AND gate 52R performs an AND operation of a control signal /PULL_Rj and the control signal Active and outputs the control signal DIOON_R. When data of the memory cell MCL to which the source line SLLi is connected is read, the control signal DIOON_L is input into the gate of the transistor 56L, which causes the source line SLLi to drop to the ground voltage. At this point, the ground voltage is applied to the dummy source line DSLR. On the other hand, when data of the memory cell MCR to which the source line SLRi is connected is read, the control signal DIOON_R is input into the gate of the transistor 56R, which causes the source line SLRi to drop to the ground voltage. At this point, the ground voltage is applied to the dummy source line DSLL.

A NOR gate 53L performs a NOT-OR operation of the voltage of a node Nodel and a control signal /PreWL and outputs the control signal PULL_Lj. A NOR gate 53R performs a NOT-OR operation of the voltage of a node Noder and the control signal /PreWL and outputs the control signal PULL_Rj.

An inverter circuit 54L inverts the control signal PULL_Lj and outputs the control signal /PULL_Lj. An inverter circuit 54R inverts the control signal PULL_Rj and outputs the control signal /PULL_Rj.

The timing chart of the operation of the semiconductor memory device 1 according to the second embodiment is the same as a timing chart in which control signals GATEL, GATER in FIG. 9 are replaced by the control signals PULL_L, PULL_R and a control signal WL is replaced by the control signal Active. Hereinafter, only differences from the first embodiment will be described.

When the control signal DIOON_L changes to the "H" level, the transistor 56L is turned on and the ground voltage is applied to the source line SLLi. On the other hand, when the control signal DIOON_L changes to the "L" level, the transistor 56L is turned off and a current path between the source line SLLi and the grounding terminal is cut off.

Similarly, when the control signal DIOON_R changes to the "H" level, the transistor 56R is turned on and the ground voltage is applied to the source line SLRi. On the other hand, when the control signal DIOON_R changes to the "L" level, the current path between the source line SLRi and the grounding terminal is cut off.

When the control signal PULL_Lj changes to the "H" level, the transistor 58L is turned on and the ground voltage is applied to the node DIO_L. On the other hand, when the control signal PULL_Lj changes to the "L" level, the transistor 58L is turned off and the current path between the node DIO_L and the grounding terminal is cut off.

Similarly, when the control signal PULL_Rj changes to the "H" level, the transistor 58R is turned on and the ground voltage is applied to the node DIO_R. On the other hand, when the control signal PULL_Rj changes to the "L" level, the transistor 58R is turned off and the current path between the node DIO_R and the grounding terminal is cut off.

With the above configuration, the semiconductor memory device 1 according to the second embodiment can obtain the same effect as that in the first embodiment. Also, the semiconductor memory device 1 according to the second embodiment selects the memory cell MC by the source line, and also, when compared with the first embodiment, the area of the memory cell array 10 can be reduced because the area of the diode is less than that of the transistor.

Third Embodiment

A semiconductor memory device 1 according to the third embodiment amplifies read data sensed by a transistor 37 by a current mirror circuit CM1 and latches the amplified read data by a latch circuit DL.

Figure 18:
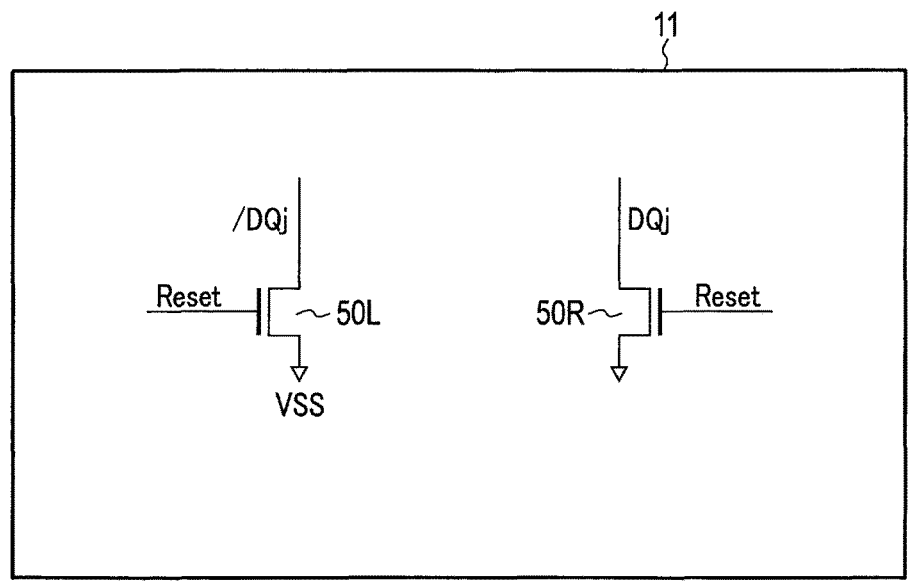

Only differences in the circuit configuration of a page buffer 11 from the circuit configuration thereof in the first embodiment will be described, using FIGS. 17 and 18. FIGS. 17 and 18 are circuit diagrams of the page buffer 11 included in the semiconductor memory device according to the third embodiment. A memory cell array 10 is configured in the same manner as in the first embodiment. Incidentally, the memory cell array 10 may be configured in the same manner as in the second embodiment.

As shown in FIG. 17, the page buffer 11 includes the current mirror circuit CM1. The current mirror circuit CM1 includes p-channel MOS transistors 37L, 37R, 68 and n-channel MOS transistors 60, 61.

One end of the transistor 37L is connected to one end of the transistor 68, the other end thereof is connected to a node /DQj, and the gate thereof is connected to a sense node SA. One end of the transistor 37R is connected to the one end of the transistor 68, the other end thereof is connected to a node DQj, and the gate thereof is connected to a sense node /SA.

The power supply voltage VAA is applied to the other end of the transistor 68, the control signal Reset is input into the gate thereof.

One end of the transistor 60 is connected to the node /DQj, the ground voltage is applied to the other end thereof, and the gate thereof is connected to the gate of the transistor 61. One end and the gate of the transistor 61 are connected to the node DQj and the ground voltage is applied to the other end thereof.

With the above configuration, the current mirror circuit CM1 amplifies a potential difference between the sense nodes SA, /SA and outputs the amplified potential difference to the nodes DQj, /DQj to be able to latch data.

The latch circuit DL further includes transistors 62, 63. The transistor 62 is a p-channel MOS transistor and the power supply voltage VAA is applied to one end thereof, the other end is connected to one ends of transistors 38, 39, and a control signal /SAP is input into the gate thereof. The transistor 63 is an n-channel MOS transistor and one end thereof is connected to the other ends of transistors 40, 41, the ground voltage is applied to the other end, and a control signal SAN is input into the gate thereof.

As shown in FIG. 18, one end of a transistor 50L is connected to the node /DQj and one end of a transistor 50R is connected to the node DQj.

Figure 19:
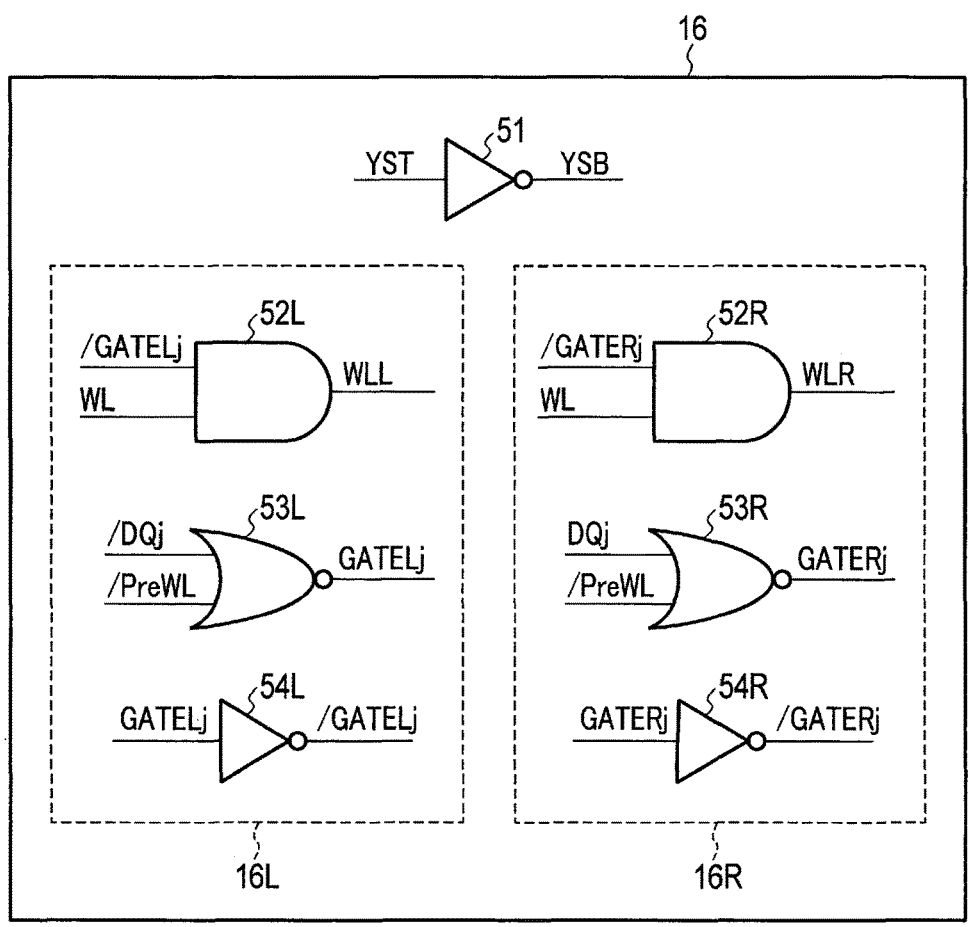
FIG. 19 is a circuit diagram of the sequence controller included in the semiconductor memory device according to the third embodiment.

Only differences of the logic circuit configuration of a sequencer 16 related to the operation of the page buffer 11 from the logic circuit configuration thereof in FIG. 8 will be described, using FIG. 19. FIG. 19 is a circuit diagram of the sequencer 16 included in the semiconductor memory device 1 according to the third embodiment.

A NOR gate 53L performs a NOT-OR operation of the voltage of the node /DQj and the control signal /PreWL and outputs the control signal GATELj. A NOR gate 53R performs a NOT-OR operation of the voltage of the node DQj and the control signal /PreWL and outputs the control signal GATERj.

Figure 21:
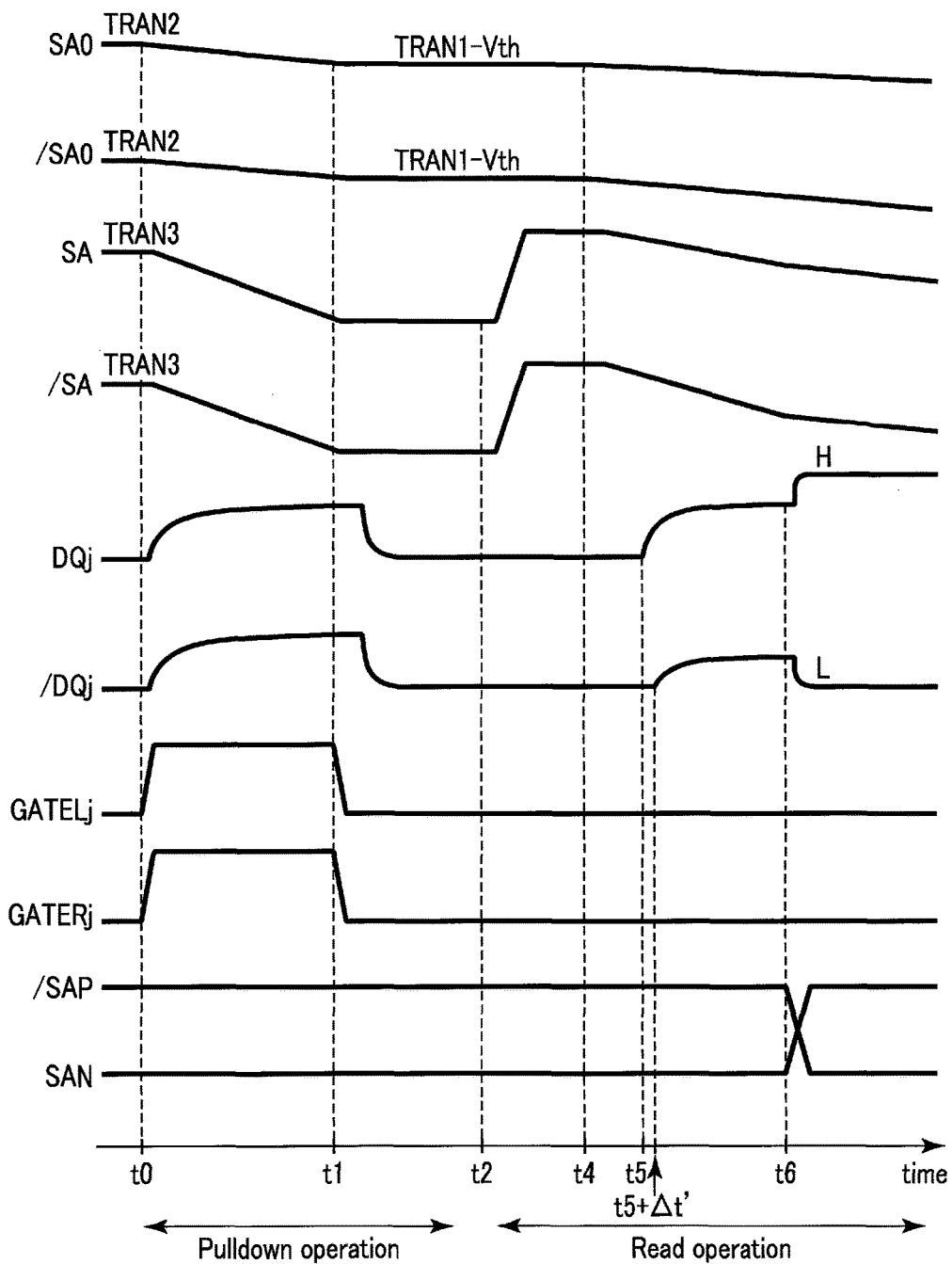

Only differences in the operation of the semiconductor memory device 1 according to the third from the operation thereof in the first embodiment will be described, using FIGS. 20 and 21. FIG. 20 is a timing chart when data of the memory cell MC to be read is "0" and FIG. 21 is a timing chart when data of the memory cell MC to be read is "1". The times in FIGS. 20 and 21 correspond to the times in FIG. 9.

At time t0, when the control signals GATEL, GATER are set to the "H" level, the voltage of the sense nodes SA, /SA drops and the transistors 37L, 37R are turned on. Accordingly, the power supply voltage VAA is applied to the nodes /DQj, DQj and the voltage thereof rises.

At time t1, when the voltage of the nodes /DQj, DQj reaches the "H" level, the control signals GATEL, GATER change to the "L" level correspondingly. Then, the voltage of the nodes /DQj, DQj is discharged to change to the "L" level.

At time t5, t5−Δt or t5+Δt', one of the transistors 37L, 37R is turned on in accordance with the speed of the voltage drop of the sense nodes SA, /SA.

If, as shown in FIG. 20, data of the memory cell MC to be read is "0", the voltage of the sense node SA first drops and the transistor 37L is first turned on. As illustrated in FIG. 20, the time is t5−Δt. Accordingly, the power supply voltage VAA is applied to the node /DQj and amplified by the current mirror circuit CM1. The transistor 37R is also turned on a little later and the voltage of the node DQj starts to rise. Accompanying the operation of the current mirror circuit CM1, the potential difference between the nodes /DQj, DQj is amplified.

During the period when the potential difference between the nodes /DQj, DQj becomes wide enough, the control signal /SAP is changed from the "H" level to the "L" level and the control signal SAN is changed from the "L" level to the "H" level (time t6). Accordingly, the node /DQj changes to the "H" level and "0" data is latched in the latch circuit DL.

On the other hand, if, as shown in FIG. 21, data of the memory cell MC to be read is "1", the voltage of the sense node /SA first drops and the transistor 37R is first turned on. Accordingly, the power supply voltage VAA is applied to the node DQj. Accompanying the operation of the current mirror circuit CM1, the potential difference between the nodes /DQj, DQj is amplified.

During the period when the potential difference between the nodes /DQj, DQj becomes wide enough, the control signal /SAP is changed from the "H" level to the "L" level and the control signal SAN is changed from the "L" level to the "H" level (time t6). Accordingly, the node DQj changes to the "H" level and "1" data is latched in the latch circuit DL.

Time t6 is a parameter determined in advance by a simulation or the like and is set with a sufficient interval such that erroneous reading should not occur.

With the above configuration, the semiconductor memory device 1 according to the third embodiment can obtain the same effect as that in the first embodiment.

Fourth Embodiment

A semiconductor memory device 1 according to the fourth embodiment is, compared with the semiconductor memory device 1 in the third embodiment, further provided with a current mirror circuit CM2 to amplify a node DQj.

Figure 22:
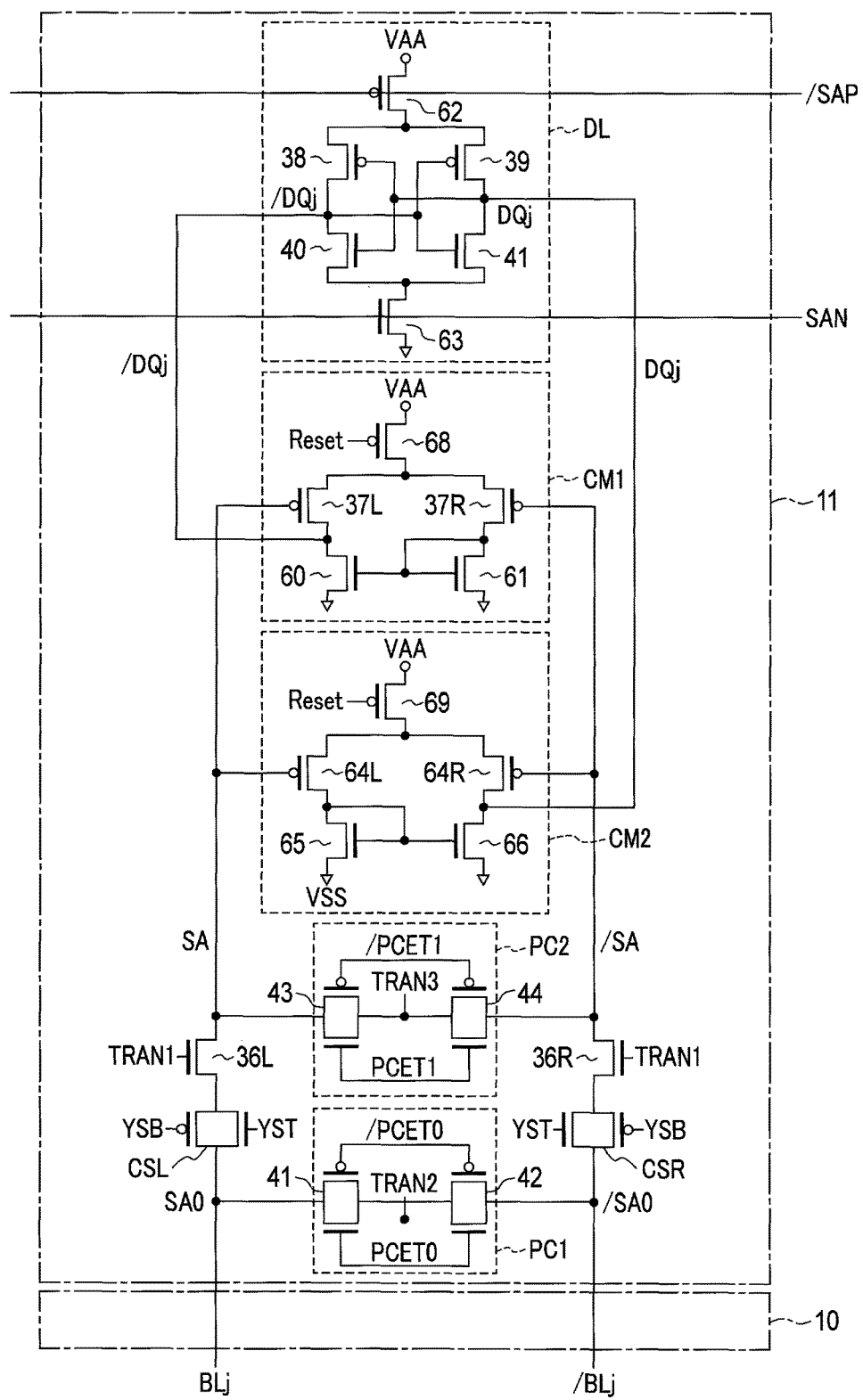
FIG. 22 is a circuit diagram of the page buffer included in the semiconductor memory device according to a fourth embodiment.

Only differences in the circuit configuration of a page buffer 11 from the circuit configuration thereof in the third embodiment will be described, using FIG. 22. FIG. 22 is a circuit diagram of the page buffer 11 included in a semiconductor memory device 1 according to the fourth embodiment. The page buffer 11 includes the current mirror circuit CM2.

The current mirror circuit CM2 includes p-channel MOS transistors 64L, 64R and n-channel MOS transistors 65, 66.

One end of the transistor 64L is connected to one end of the transistor 69, the other end thereof is connected to one end of the transistor 65, and the gate thereof is connected to a sense node SA. One end of the transistor 64R is connected to the one end of the transistor 69, the other end thereof is connected to one end of the transistor 66, and the gate thereof is connected to a sense node /SA. The power supply voltage VAA is applied to the other end of the transistor 69, the control signal Reset is input into the gate thereof. The gate of the transistor 65 is connected to the gate of the transistor 66 and the one end of the transistor 64L, and the ground voltage is applied to the other end thereof. One end of the transistor 66 is connected to a node DQj, and the ground voltage is applied to the other end thereof.

A node /DQj is connected to one end of a transistor 37L and the node DQj is connected to one end of the transistor 64R.

With the above configuration, a current mirror circuit CM1 output the voltage of the node /DQj by amplifying a difference between a voltage of the sense node /SA and a voltage of the sense node SA, a current mirror circuit CM2 output a voltage of the node DQj by amplifying a difference between the voltage of the sense node SA and the voltage of the sense node /SA.

Figure 23:
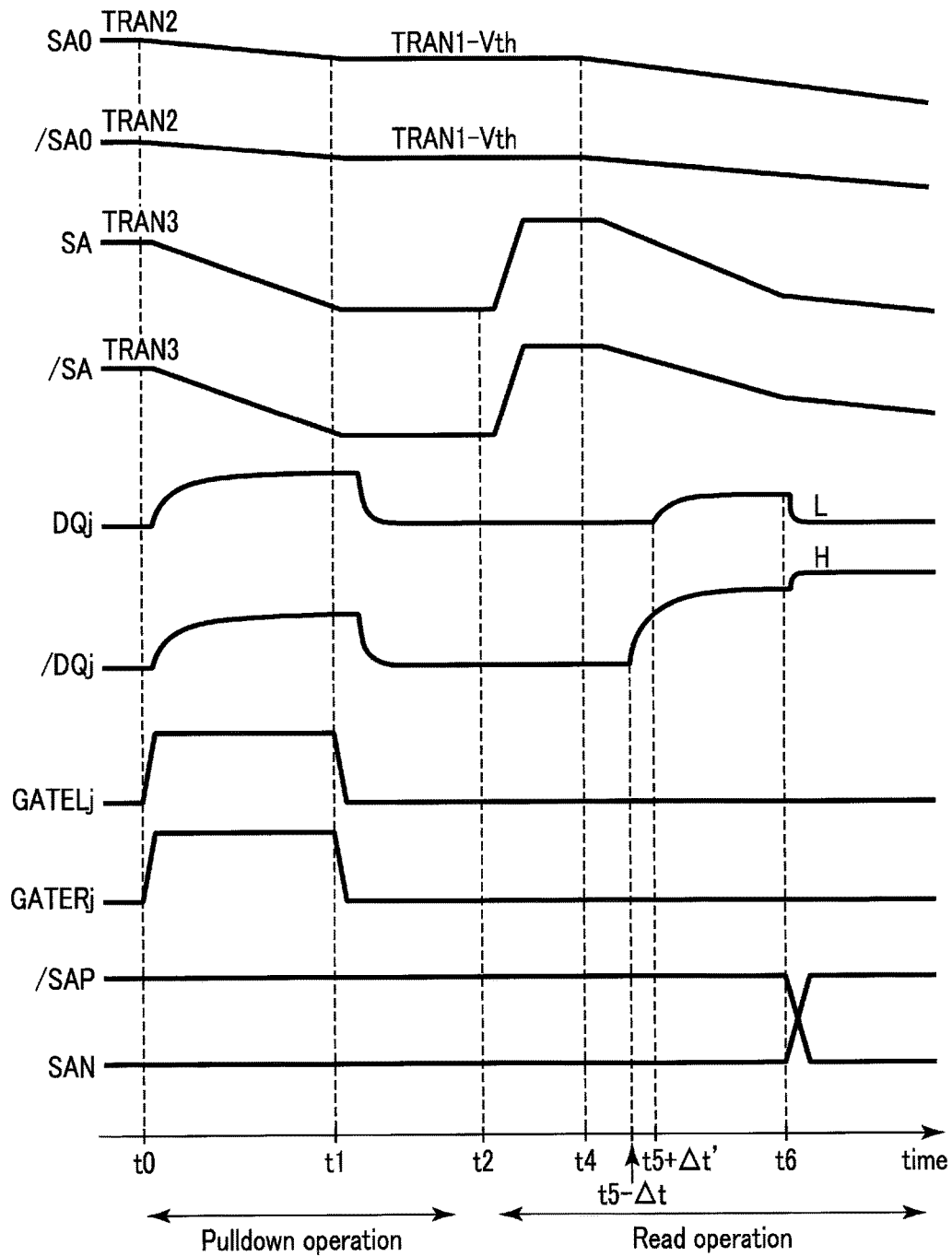
FIGS. 23 and 24 are timing charts of the pulldown operation and the read operation of the semiconductor memory device according to the fourth embodiment.
Figure 24:
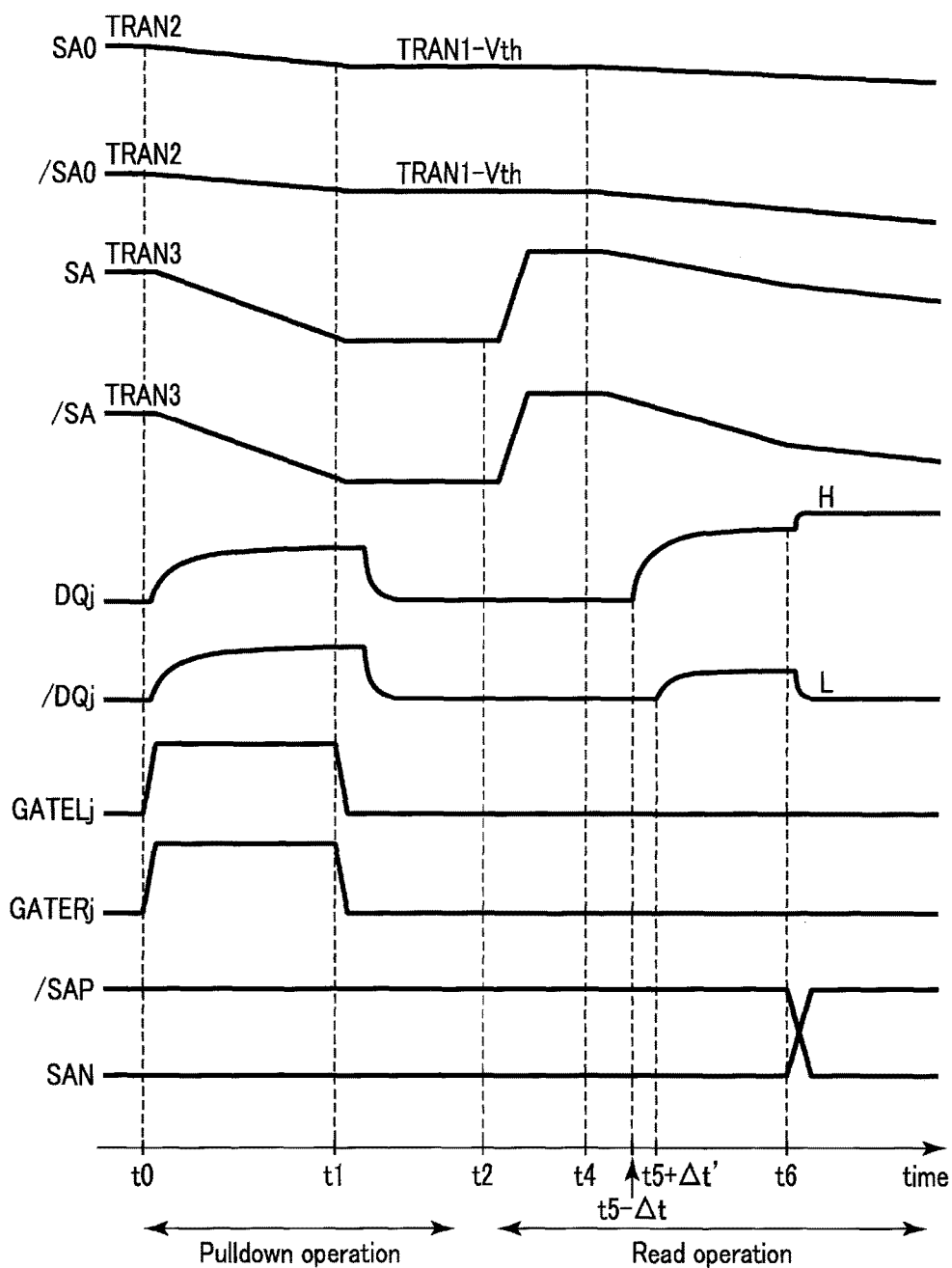

Only differences of the operation of the semiconductor memory device 1 according to the fourth from the operation thereof in the third embodiment will be described using FIGS. 23 and 24. FIG. 23 is a timing chart when data of the memory cell MC to be read is "0" and FIG. 24 is a timing chart when data of the memory cell MC to be read is "1". The times in FIGS. 23 and 24 correspond to the times in FIGS. 20 and 21 respectively.

The case when data of the memory cell MC to be read is "0" and the case when data of the memory cell MC to be read is "1" are different in the voltage values and timing to which nodes /DQ, DQ are charged after time t5.

At time t5−Δt or t5+Δt', one of the transistors 37L, 64R is turned on in accordance with the speed of the voltage drop of the sense nodes SA, /SA.

If data of the memory cell MC to be read is "0", the voltage of the node /DQj is amplified by the current mirror circuit CM1 and if data of the memory cell MC to be read is "1", the voltage of the node DQj is amplified by the current mirror circuit CM2. Accordingly, in both cases of reading "0" data and "1" data, the voltage difference of the nodes /DQj, DQj can be increased.

With the above configuration, the semiconductor memory device 1 according to the fourth embodiment can obtain the same effect as that in the first to third embodiment and the probability of erroneously reading data can be reduced when compared with the third embodiment. However, an area of the page buffer 11 according to the fourth embodiment is larger than that of the page buffer 11 according to the third embodiment.

Fifth Embodiment

In a semiconductor memory device 1 according to the fifth embodiment, a sense node is directly connected to a latch circuit DL.

Only differences in the circuit configuration of a page buffer 11 from the circuit configuration thereof in the third embodiment will be described, using FIG. 25. FIG. 25 is a circuit diagram of the page buffer 11 included in the semiconductor memory device 1 according to the fifth embodiment.

One end of a charge transfer transistor 36L is connected to a node DQj and one end of a charge transfer transistor 36R is connected to a node /DQj. That is, when compared with the third and fourth embodiments, the correspondence of the nodes /DQj, DQj of the latch circuit DL is reversed.

FIG. 26 is a circuit diagram of the sequencer 16 included in the semiconductor memory device 1 according to the fifth embodiment. Only differences of the logic circuit configuration of a sequencer 16 related to the operation of the page buffer 11 from the logic circuit configuration thereof in FIG. 8 will be described, using FIG. 26.

Control circuits 16L, 16R include AND gates 67L, 67R respectively.

The AND gate 67L performs an NOT-OR operation of the voltage of the node DQj and the control signal PULLj and outputs the control signal GATELj. The AND gate 67R performs an NOT-OR operation of the voltage of the node /DQj and the control signal PULLj and outputs the control signal GATERj. The control signal PULLj controls the pulldown operation described later.

Figure 27:
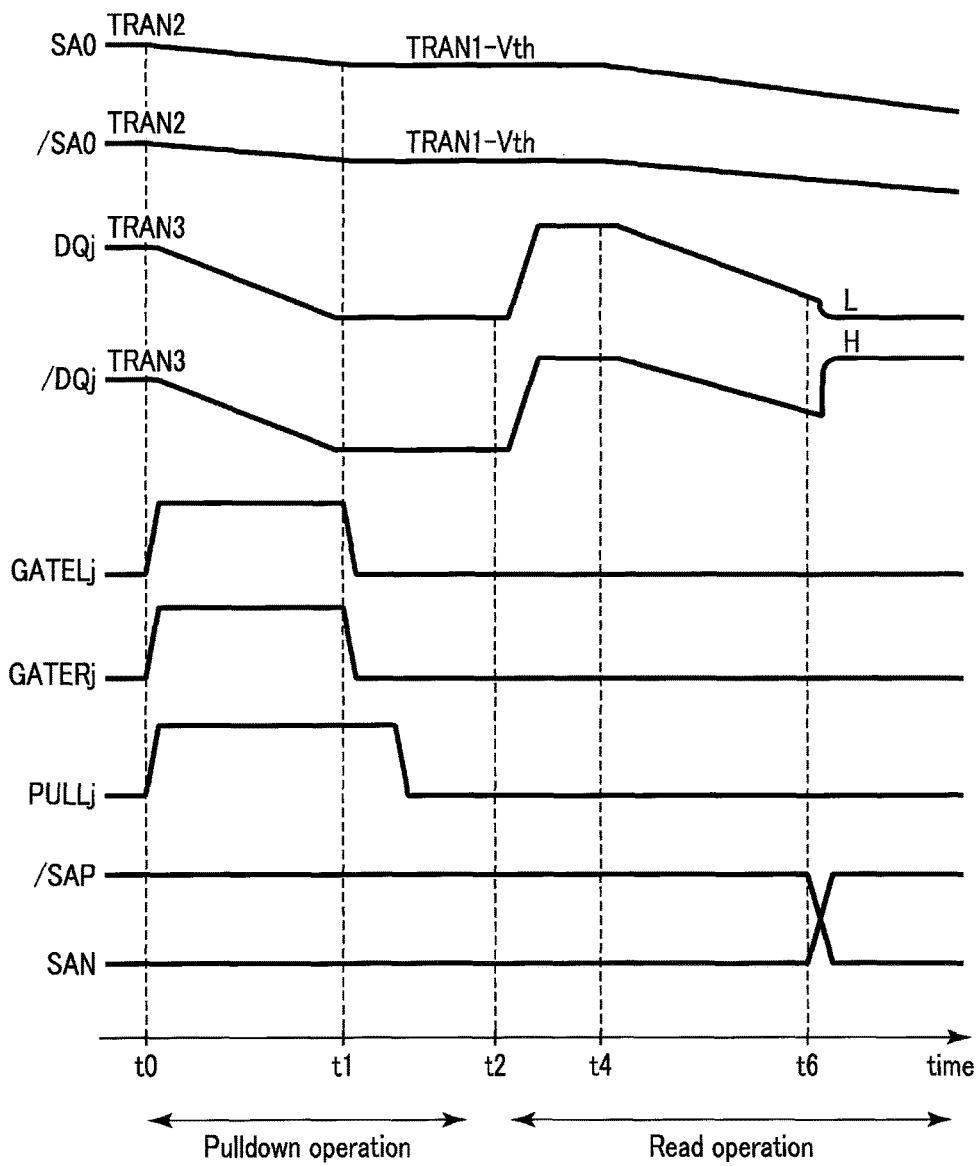
FIGS. 27 and 28 are timing charts of the pulldown operation and the read operation of the semiconductor memory device according to the fifth embodiment.
Figure 28:
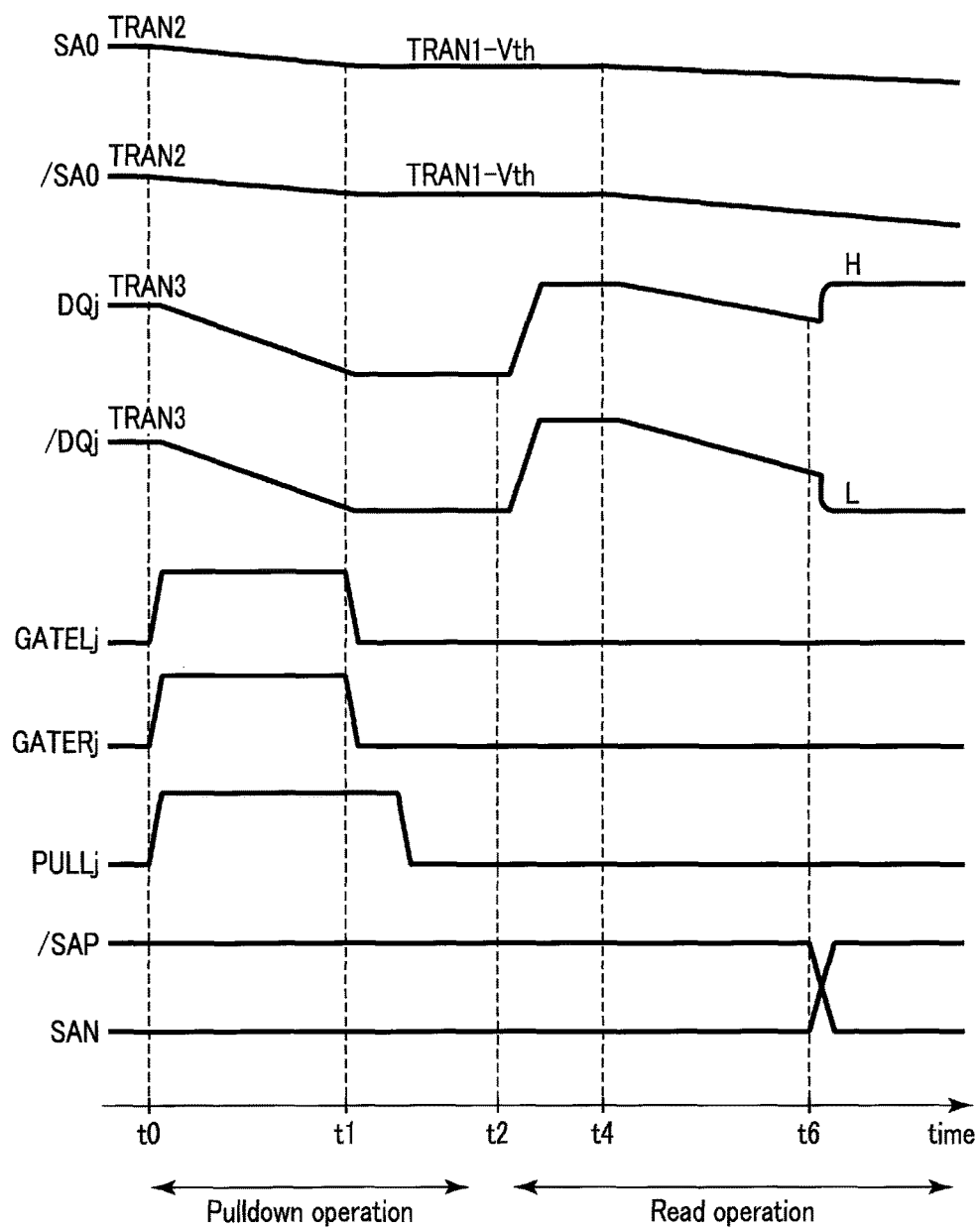

Only differences in the operation of the semiconductor memory device 1 according to the fifth from the operation thereof in the first embodiment will be described, using FIGS. 27 and 28. FIG. 27 is a timing chart when data of the memory cell MC to be read is "0" and FIG. 28 is a timing chart when data of the memory cell MC to be read is "1". The times in FIGS. 27 and 28 correspond to the times in FIGS. 20 and 21 respectively.

When, at time t0, the control signal PULLj changes to the "H" level, a pulldown operation is started. The control signal PULLj is set to the "L" level after time t1. The period in which the control signal PULLj is at the "H" level (the period in which the pulldown operation is performed) is determined in advance by a simulation or the like.

The operations of the nodes DQj, /DQj up to time t4 correspond to those of sense nodes SA, /SA in the first embodiment respectively. At time t4, the control signal WL is set to the "H" level to start a read operation, and the voltage of the nodes DQj, /DQj starts to drop.

If, as shown in FIG. 27, data of the memory cell MC to be read is "0", the speed of the voltage drop of the node DQj is faster than the speed of the voltage drop of the node /DQj. Accordingly, a voltage difference between the nodes DQj, /DQj arises at time t6 and the voltage of the node /DQj becomes higher than the voltage of the node DQj. At this point, when the control signal /SAP is changed from the "H" level to the "L" level and the control signal SAN is changed from the "L" level to the "H" level, the node /DQj is set to the "H" level and "0" data is latched in the latch circuit DL.

If, as shown in FIG. 28, data of the memory cell MC to be read is "1", the speed of the voltage drop of the node DQj is slower than the speed of the voltage drop of the node /DQj. Accordingly, a voltage difference between the nodes DQj, /DQj arises at time t6 and the voltage of the node DQj becomes higher than the voltage of the node /DQj. At this point, when the control signal /SAP is changed from the "H" level to the "L" level and the control signal SAN is changed from the "L" level to the "H" level, the node DQj is set to the "H" level and "1" data is latched in the latch circuit DL.

With the above configuration, the semiconductor memory device 1 according to the fifth embodiment can obtain the same effect as that in the first embodiment.

Sixth Embodiment

Next, a semiconductor memory device according to the sixth embodiment will be described. The sixth embodiment is obtained by adding respective transistors to between the transistors 37L, 37R and the latch circuit DL in the first embodiment. Hereinafter, only differences of the semiconductor memory device according to the sixth embodiment from devices in the first to fifth embodiments will be described.

First, the circuit configuration of a page buffer 11 will be described using FIG. 29. FIG. 29 is a circuit diagram of the page buffer 11 included in the semiconductor memory device according to the sixth embodiment. A memory cell array 10 is configured in the same manner as in the first embodiment.

As shown in FIG. 29, the page buffer 11 further includes p-channel MOS transistors 70L, 70R in the configuration shown in FIG. 6.

A control signal /WLLi is input into the gate of the transistor 70L, one end thereof is connected to a node Nodel, and the other end thereof is connected to a node Nodel'. The node Nodel' is connected to one end of a transistor 38. A control signal /WLRi is input into the gate of the transistor 70R, one end thereof is connected to a node Noder, and the other end thereof is connected to a node Noder'. The node Node$r'$ is connected to one end of a transistor 39. Thus, the transistors 70L, 70R are inserted between the transistors 37L, 37R and the transistors 38, 39 respectively.

Next, the logical circuit configuration of a sequencer 16 will be described using FIG. 30. FIG. 30 is a circuit diagram of the sequencer 16 included in a semiconductor memory device 1 according to the sixth embodiment.

As shown in FIG. 30, the sequencer 16 further includes inverter circuits 71L, 71R. The inverter circuit 71L inverts an input control signal WLL and outputs a control signal /WLL. The inverter circuit 71R inverts an input control signal WLR and outputs a control signal /WLR.

When data in a memory cell MCL is read, the control signal /WLL is input into the gate of the transistor 70L and a control signal /DWLR as a signal obtained by inverting a signal input into a dummy word line DWLR is input into the gate of the transistor 70R. On the other hand, when data in a memory cell MCR is read, the control signal /WLR is input into the gate of the transistor 70R and a control signal /DWLL as a signal obtained by inverting a signal input into a dummy word line DWLL is input into the gate of the transistor 70L.

Figure 31:
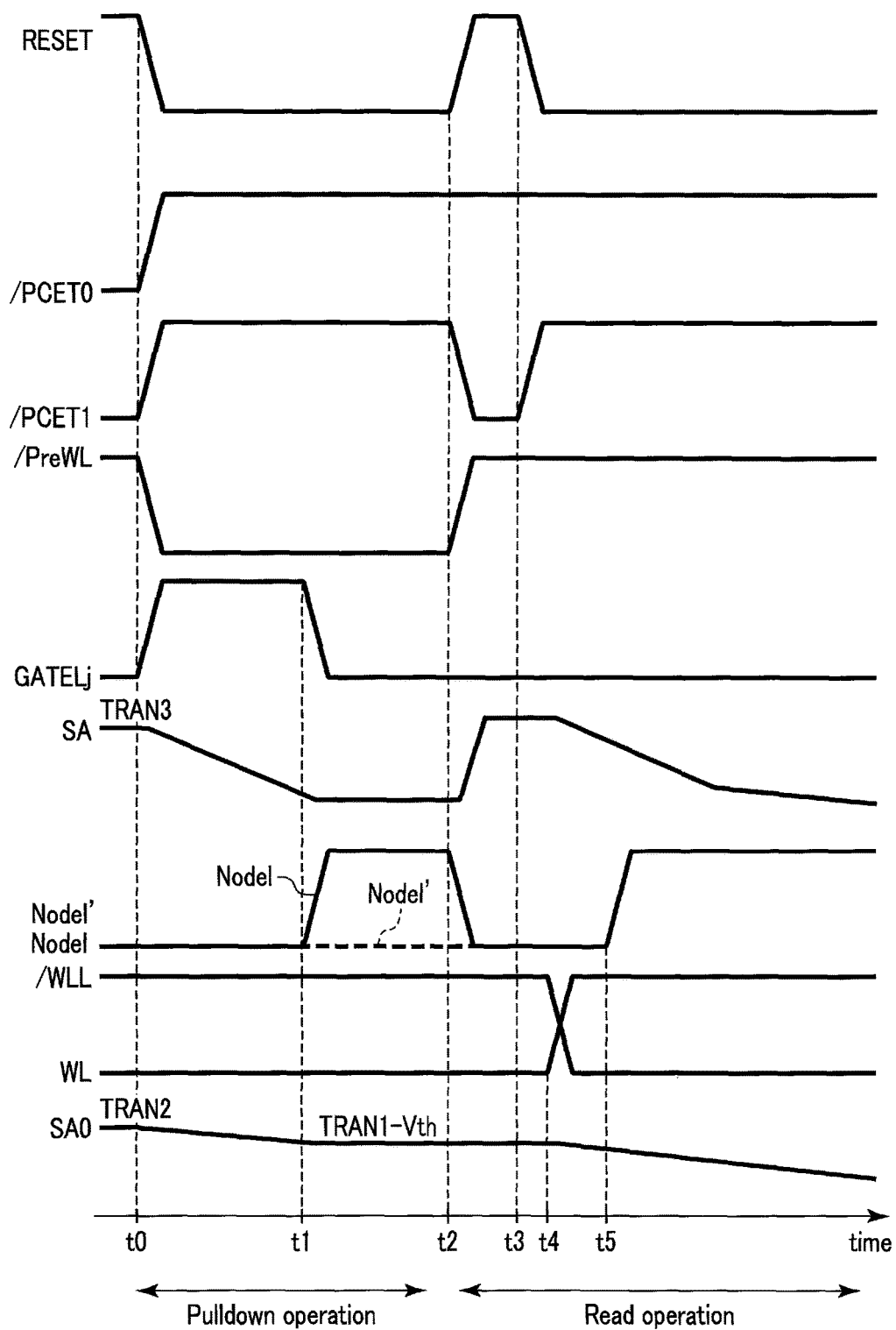
FIG. 31 is a timing chart of the pulldown operation and the read operation of the semiconductor memory device according to the sixth embodiment.

Next, the operation of the semiconductor memory device 1 according to the sixth embodiment will be described using FIG. 31 by assuming a case when data stored in the memory cell MCL is read. FIG. 31 is a timing chart of the pulldown operation and the read operation of the semiconductor memory device 1 according to the sixth embodiment.

First during the pulldown operation, the control signal WL is set to the "L" level and the control signal /WLL is set to the "H" level. When the control signal /WLL is at the "H" level, the transistor 70L is turned off. That is, the node Node$l'$ maintains the "L" level from time t0 to time t2 even if the voltage of the node Nodel rises. On the other hand, like the control signal WL, a signal at the "L" level is provided to the dummy word line DWLR and thus, the control signal /DWLR is set to the "H" level. When the control signal /DWLR is at the "H" level, the transistor 70R is turned off. That is, the node Node$r'$ maintains the "L" level from time t0 to time t2 even if the voltage of the node Noder rises.

In the subsequent read operation, the control signal WL is changed from the "L" level to the "H" level at time t4. At this point, the control signals /WLL, /DWLR are set to the "L" level and the transistors 70L, 70R are turned on. Accordingly, a current path is formed between the nodes Noder, Nodel and the latch circuit. DL and so data can be latched by the latch circuit DL.

When data of the memory cell MCR connected to the bit line /BLj is read, the operation corresponding to the bit line BLj and the operation corresponding to the bit line /BLj in the above case when data of the memory cell MCL is read may be reversed.

As described above, the transistors 70L, 70R operate by being linked to signals provided to the word lines. More specifically, the transistors 70L, 70R are turned off between the pulldown operation and the start of a current passed to a reference cell and the current path between the nodes Nodel and Node$l'$ and the current path between the nodes Noder and Node$r'$ are cut off.

With the above configuration, the semiconductor memory device 1 according to the sixth embodiment may suppress remaining of the result from the latch circuit DL malfunctioned in pulldown operation remains when the read operation is started. That is, the semiconductor memory device 1 may suppress erroneous reading of data.

Seventh Embodiment

Next, a semiconductor memory device according to the seventh embodiment will be described. In the seventh embodiment, the charge transfer transistor is turned off after the charge of bit lines is removed by the pulldown circuit in a pulldown operation in the sixth embodiment until the determination of data is started in a read operation. Hereinafter, only differences of the semiconductor memory device according to the seventh embodiment from devices in the first to sixth embodiments will be described.

First, the circuit configuration of a memory cell array 10 and a page buffer 11 will be described using FIG. 32. FIG. 32 is a circuit diagram of the memory cell array 10 and the page buffer 11 included in a semiconductor memory device 1 according to the seventh embodiment.

As shown in FIG. 32, the memory cell array 10 and the page buffer 11 included in the semiconductor memory device 1 according to the seventh embodiment are different from FIG. 29 described in the sixth embodiment in that signals input into charge transfer transistors 36L, 36R and transistors 35L, 35R are different. More specifically, control signals TRANLj, TRANRj are input into the gates of the transistors 36L, 36R respectively and control signals GATELINj, GATERINj are input into the gates of the transistors 35L, 35R respectively.

Figure 33:
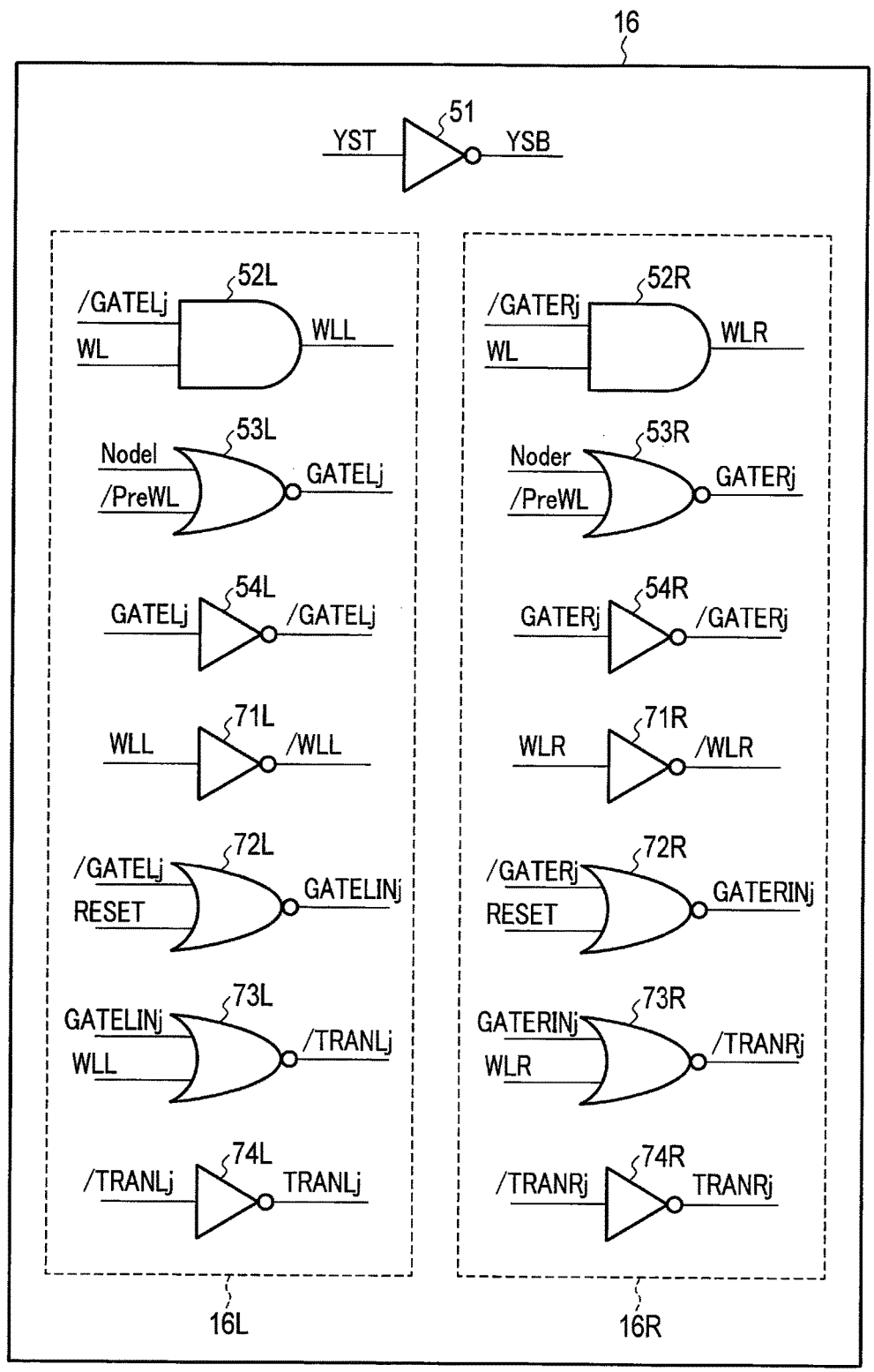
FIG. 33 is a circuit diagram of the sequence controller included in the semiconductor memory device according to the seventh embodiment.

Next, the logical circuit configuration of a sequencer 16 will be described using FIG. 33. FIG. 33 is a circuit diagram of the sequence controller included in the semiconductor memory device according to the seventh embodiment. The sequencer 16 in the seventh embodiment further includes, in addition to the configuration described in the sixth embodiment, NOR gates 72L, 72R, 73L, 73R and inverter circuits 74L, 74R.

The NOR gate 72L performs a NOT-OR operation of a control signal /GATELj and a control signal RESET and outputs a control signal GATELINj. The NOR gate 72R performs a NOT-OR operation of a control signal /GATERj and the control signal RESET and outputs a control signal GATERINj.

The NOR gate 73L performs a NOT-OR operation of the control signal GATELINj and a control signal WLL and outputs a control signal /TRANLj. The NOR gate 73R performs a NOT-OR operation of the control signal GATER-INj and a control signal WLR and outputs a control signal /TRANRj.

The inverter circuit 74L inverts the control signal /TRANLj and outputs a control signal TRANLj. The inverter circuit 74R inverts the control signal /TRANRj and outputs a control signal TRANRj.

Figure 34:
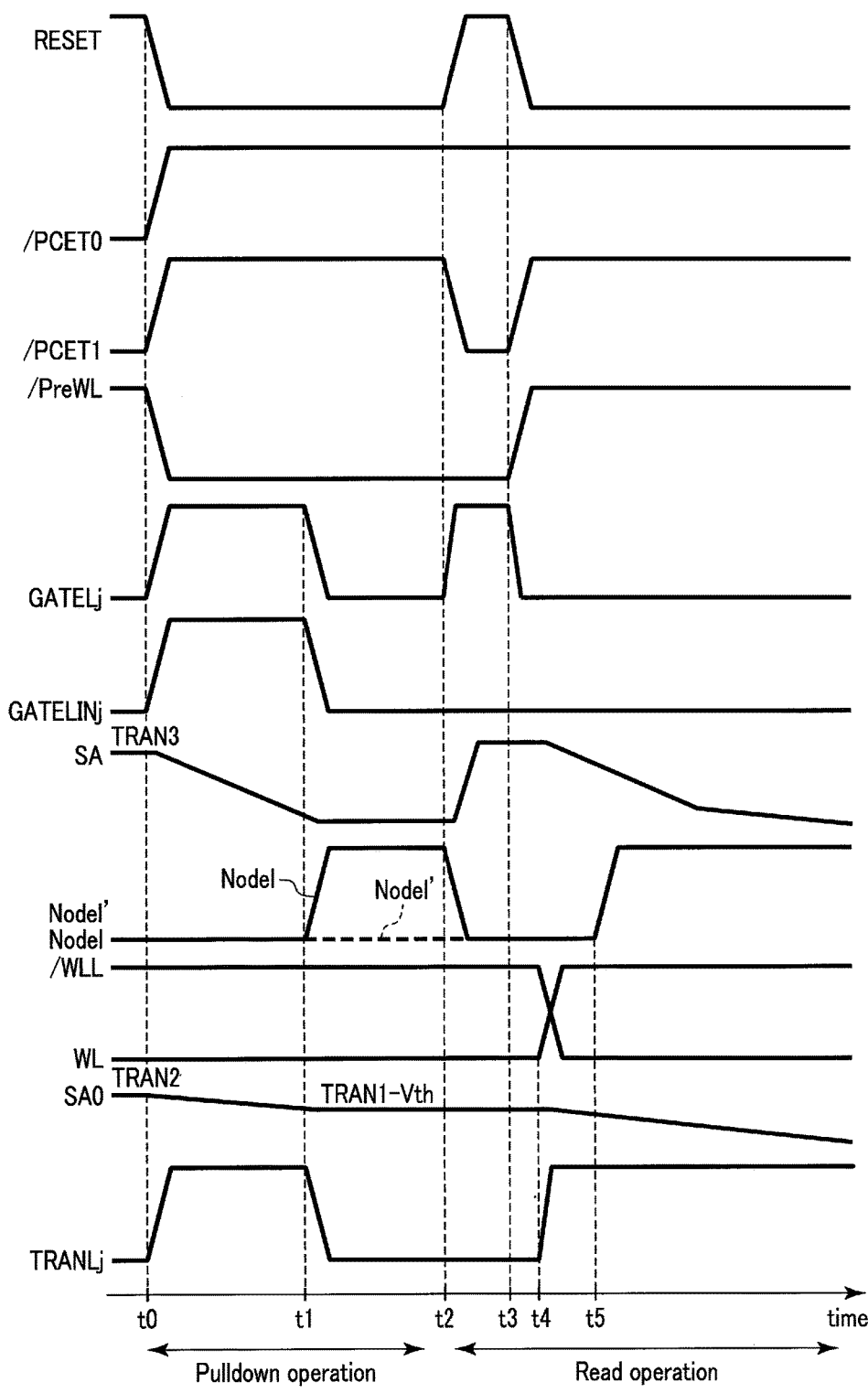

Next, the operation of the semiconductor memory device 1 according to the seventh embodiment will be described using FIG. 34 by assuming a case when data stored in the memory cell MCL is read. FIG. 34 is a timing chart of the pulldown operation and the read operation of the semiconductor memory device 1 according to the seventh embodiment. When an element on a sense node SA side and an element on a sense node /SA side perform the same operation in the page buffer 11, the description of the element on the sense node /SA side is omitted.

At time t0, the control signals GATELINj, TRANLj are set to the "H" level and the transistors 35L, 36L are turned on.

At time t1 when the voltage of the sense node SA reaches the "L" level, the voltage of the node Nodel reaches the "H" level. When the voltage of the node Nodel reaches the "H" level, the control signals GATELINj, TRANLj are set to the "L" level and the transistors 35L, 36L are turned off.

At time t2, the control signals GATELj, RESET are set to the "H" level and the control signal GATELINj maintains the "L" level.

At time t3, the control signals GATELj, RESET are set to the "L" level and the control signal GATELINj maintains the "L" level.

At time t4, with the control signal WL being set to the "H" level, the control signal TRANj is set to the "H" level and the transistor 35L is turned on.

The operations of the sense nodes SA, /SA, bit line nodes SA0, /SA0, and the latch circuit DL corresponding to FIG. 34 look like FIG. 35 when data of the memory cell MC to be read is "0" and look like FIG. 36 when data of the memory cell MC to be read is "1". In FIGS. 35 and 36, a solid line indicates an operation of the seventh embodiment and a broken line indicates an operation of Comparative Example.

From time t1 to time t4, the voltage of the bit line nodes SA0, /SA0 is balanced so as to be substantially the same as the value (hereinafter, called a balanced voltage) obtained by subtracting a threshold voltage of the transistors 35L, 35R from a gate voltage of the transistors 35L, 35R. When the transistors 35L, 35R are turned on, however, as shown in Comparative Example, the voltages of the bit line nodes SA0, /SA0 may gradually rise. If the voltages of the bit line nodes SA0, /SA0 rise before a read operation, the timing when data is determined in the read operation is delayed. In addition, if the voltages of the bit line nodes SA0, /SA0 rise when the read operation is started; there is a possibility of causing erroneous read.

Thus, in the seventh embodiment, the charge transfer transistor 36L is turned off when the removal of charge in the pulldown operation is completed and turned on when the determination of data is started in the read operation. Accordingly, the semiconductor memory device 1 according to the seventh embodiment can inhibit a voltage rise of the bit line nodes SA0, /SA0 like in Comparative Example shown in FIGS. 35 and 36 and thus, reliability of read data can be improved.

Eighth Embodiment

Next, a semiconductor memory device according to the eighth embodiment will be described. The eighth embodiment uses a diode to select the memory cell in the seventh embodiment. Hereinafter, only differences of the semiconductor memory device according to the eighth embodiment from devices in the first to seventh embodiments will be described.

First, the circuit configuration of a cell array 10 and a page buffer 11 will be described using FIG. 37. FIG. 37 is a circuit diagram of the memory cell array 10 and the page buffer 11 included in a semiconductor memory device 1 according to the eighth embodiment.

In the semiconductor memory device 1 according to the eighth embodiment, as shown in FIG. 37, the cell array 10 has a configuration similar to one in FIG. 14 described in the second embodiment. Also, the page buffer 11 has a configuration similar to one in FIG. 32 described in the seventh embodiment and only signals input into the transistors 70L, 70R are different. More specifically, control signals /DIOON_L, /DIOON_R are input into the gates of the transistors 70L, 70R respectively.

Next, the circuit configuration of a source line driver 13 will be described using FIG. 38. FIG. 38 is a circuit diagram of the source line driver 13 included in the semiconductor memory device according to the eighth embodiment.

As shown in FIG. 38, the source line driver 13 included in the semiconductor memory device 1 according to the eighth embodiment has a configuration similar to one in FIG. 15 described in the second embodiment. Also, the page buffer 11 has a configuration similar to one in FIG. 32 described in the seventh embodiment and only signals input into the transistors 58L, 58R are different. More specifically, control signals /PULL_LINj, /PULL_RINj are input into the gates of the transistors 58L, 58R respectively.

Next, the logical circuit configuration of a sequencer 16 will be described using FIG. 39. FIG. 39 is a circuit diagram of a sequence controller included in the semiconductor memory device according to the eighth embodiment.

As shown in FIG. 39, the sequencer 16 included in the semiconductor memory device 1 according to the eighth embodiment has a configuration similar to one in FIG. 33 described in the seventh embodiment and is different only in signals input into or output from each logical circuit.

Signals input into or output from an AND gate 52, a NOR gate 53, and an inverter circuit 54 are similar to those in FIG. 16 described in the second embodiment.

An inverter circuit 71L inverts a control signal DIOON_L and outputs a control signal /DIOON_L. An inverter circuit 71R inverts a control signal DIOON_R and outputs a control signal /DIOON_R.

The NOR gate 72L performs a NOT-OR operation of a control signal /PULL_Lj and a control signal RESET and outputs a control signal PULL_LINj. The NOR gate 72R performs a NOT-OR operation of a control signal /PULL_Rj and the control signal RESET and outputs a control signal PULL_RINj.

The NOR gate 73L performs a NOT-OR operation of a control signal PULL_LINj and a control signal DIOON_L and outputs a control signal /TRANLj. The NOR gate 73R performs a NOT-OR operation of a control signal PULL_RINj and a control signal DIOON_R and outputs a control signal /TRANRj.

The operation of the semiconductor memory device 1 according to the eighth embodiment is similar to the operation when the control signals GATELj, GATERj, GATELINj, WL, /WL in FIG. 34 described in the seventh embodiment are replaced by the control signals PULL_Lj, PULL_Rj, PULL_LINj, DIOON_L, /DIOON_R respectively.

With the above configuration, the semiconductor memory device 1 according to the eighth embodiment can obtain the same effect as that in the seventh embodiment. Also, the semiconductor memory device 1 according to the eighth embodiment selects the memory cell MC using a diode having a smaller area than a transistor and thus, when compared with the seventh embodiment, the area of the memory cell array 10 can be reduced.

Ninth Embodiment

Next, a semiconductor memory device according to the ninth embodiment will be described. In the ninth embodiment, the resistance value of a pulldown resistance element is made higher than that of a reference resistance element in the seventh element. Hereinafter, only differences of the semiconductor memory device according to the ninth embodiment from devices in the first to eighth embodiments will be described.

First, the circuit configuration of a cell array 10 and a page buffer 11 will be described. While the resistance value of the reference resistance element 32 and that of the pulldown resistance element 34 are made substantially equal in the seventh embodiment, a semiconductor memory device 1 according to the ninth embodiment is configured such that the resistance value of a pulldown resistance element 34 is made higher than that of a reference resistance element 32. In addition, pulldown resistance elements 34L, 34R have substantially the same resistance value. The other configuration is the same as that of the seventh embodiment.

Next, the operation of the semiconductor memory device 1 according to the ninth embodiment will be described using FIGS. 40 and 41 by assuming a case when data stored in the memory cell MCL is read. FIGS. 40 and 41 are timing charts of the pulldown operation and the read operation of the semiconductor memory device 1 according to the ninth embodiment. FIGS. 40 and 41 show the cases when data of the memory cell MC to be read is "0" and "1" respectively. In FIGS. 40 and 41, a solid line indicates an operation of the ninth embodiment and a broken line indicates an operation of the seventh embodiment. The operation of other control signals is the same as that of the seventh embodiment.

At time t1, a pulldown circuit PD terminates the removal of charge of bit lines when the voltages of the bit line nodes SA0, /SA0 are higher than the balanced voltage. That is, the voltages of bit line nodes SA0, /SA0 at this point are higher than that in the seventh embodiment.

From time t1 to time t4, the voltages of the bit line nodes SA0, /SA0 are maintained higher than those in the seventh embodiment.

At time t4, when the determination of data is started by a control signal WL being set to the "H" level, the voltages of the bit line nodes SA0, /SA0 start to fall. The timing when the voltages of the bit line nodes SA0, /SA0 start to fall is substantially the same as in the seventh embodiment. On the other hand, the voltages of sense nodes SA, /SA start to fall after the voltages of the bit line nodes SA0, /SA0 have fallen to the balanced voltage. That is, the timing when the voltages of the sense nodes SA, /SA start to fall is later than in the seventh embodiment.

As shown in FIG. 40, when the data of the memory cell MC is "0" (low resistance state), the voltage of the bit line node SA0 falls earlier than that of the bit line node /SA0. Accordingly, the voltage of the bit line node SA0 falls to the balanced voltage earlier than the voltage of the bit line node /SA0 and thus, the voltage of the sense node SA starts to fall earlier than the voltage of the sense node /SA. Then, a transistor 37L is turned on earlier in accordance with the fall of voltage of the sense node SA. When the transistor 37L is turned on, a node /DQj is set to the "H" level at time t5' and the read data is determined.

On the other hand, as shown in FIG. 41, when the data of the memory cell MC is "1" (high resistance state), the voltage of the bit line node SA0 falls later than that of the bit line node /SA0. Accordingly, the voltage of the bit line node SA0 falls to the balanced voltage later than the voltage of the bit line node /SA0 and thus, the voltage of the sense node SA starts to fall later than the voltage of the sense node /SA. Then, a transistor 37R is turned on earlier in accordance with the fall of voltage of the sense node /SA. When the transistor 37R is turned on, a node DQj is set to the "H" level at time t5' and the read data is determined.

By making the resistance value of the pulldown resistance element 34 higher than that of the reference resistance element 32, the semiconductor memory device 1 according to the ninth embodiment shifts the timing when the voltages of the sense nodes SA, /SA starts to fall in a read operation. Then, a potential difference between the sense nodes SA, /SA when data is determined is increased. Accordingly, the semiconductor memory device 1 according to the ninth embodiment may suppress erroneous reading of data by increasing sense margin, and therefore, reliability of read data can be improved.

Modification and the Like

A semiconductor memory device in an embodiment includes a memory cell (MC in FIG. 32) including a variable resistance element (30L in FIG. 32), a first circuit (PDL in FIG. 32) including a first resistance element (34L in FIG. 32) and a first transistor (35L in FIG. 32), a first bit line (BL in FIG. 32), a second transistor (36L in FIG. 32), and a sense circuit (37L and DL in FIG. 32). One end of the first transistor is connected to one end of the first resistance element. The memory cell and the first circuit are connected by the first bit line. One end of the second transistor is connected to one end of the first bit line. The other end of the second transistor is connected to the sense circuit. In a first operation (Pulldown operation in FIG. 34) before reading data from the memory cell, first and second voltages are applied to the gates of the first and second transistors to turn on the first and second transistors respectively and the voltage of the first bit line falls from a third voltage to a fourth voltage. Then, fifth and sixth voltages are applied to the gates of the first and second transistors in accordance with the fall of the voltage of the first bit line from the third voltage to the fourth voltage to turn on the first and second transistors respectively.

Accordingly, reliability of read data can be improved.

However, the embodiment is not limited to the above first to ninth embodiments and various modifications can be made. For example, the configuration of the cell array 10 and the page buffer 11 may be another configuration. The above embodiments illustrate a case when the number of the page buffers 11 provided for the cell array 10 is one, but the number of the page buffers 11 provided may be more than one. In such a case, a plurality of bit line pairs is divided into groups and the page buffer 11 is allocated to each group.

The read operation in the above embodiments is described in some cases only in a case when data of the memory cell connected to one bit line is read. The read operation of the memory cell connected to the other bit line in such an embodiment is similar to an operation when an operation corresponding to the one bit line BL and an operation corresponding to the other bit line are interchanged.

In the semiconductor memory device 1 according to the seventh to ninth embodiments, the configuration of the circuit that detects a potential difference between the sense nodes SA, /SA contained in the page buffer 11 is not limited to the one described in the above embodiments. For example, one or two current mirror circuits CM may be used like in the third or fourth embodiment. Alternatively, the latch circuit DL may directly be connected like in the fifth embodiment. Even in such cases, the seventh to ninth embodiments can achieve a similar effect.

In the above embodiments, the "threshold voltage" is a gate-source voltage needed to pass a current (called a cell current or an on current) of a predetermined value between the drain and the source of a transistor. On the other hand, if a voltage less than the threshold voltage is applied to between the gate and the source of a transistor, no current flows to the transistor. However, even if a voltage less than the threshold voltage is applied to the gate of the transistor, a micro leak current may flow between the drain and the source of the transistor. In the above embodiments, a case when a voltage equal to the threshold voltage or more is applied to the gate of a transistor is defined as an on state and a case when a voltage less than the threshold voltage is defined as an off state.

In the operation in the above embodiments, various control signals are controlled by the sequencer 16.

Also in the above description, "electrically connected" includes a case when another element is connected therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell including a variable resistance element;
a first pulldown circuit including a first resistance element and a first transistor, one end of the first transistor being connected to one end of the first resistance element;
a first bit line connected to the memory cell and the first pulldown circuit;
a second transistor, one end of the second transistor being connected to the first bit line;
a sense circuit connected to the other end of the second transistor, the sense circuit including a first node; and
a sequencer configured to execute reading, the sequencer including a first NOR gate, a first input terminal of the first NOR gate being connected to the first node, a first signal being input into a second input terminal of the first NOR gate, and an output terminal of the first NOR gate being connected to a gate of the first transistor,
wherein:
the sequencer sequentially executes a pulldown operation and a read operation in the reading,
the first signal is set to a first logic level during the pulldown operation, and the first signal is set to a second logic level during the read operation, the first logic level being different from the second logic level, and
during the pulldown operation,
a first voltage is applied to a gate of the second transistor,
a voltage of the first bit line falls from a second voltage to a third voltage based on a signal at a third logic level output from the first NOR gate, and
a voltage of the first node changes from a fourth voltage to a fifth voltage in response to a fall of the voltage of the first bit line from the second voltage to the third voltage, and the first NOR gate outputs a signal at a fourth logic level, the fourth logic level being different from the third logic level.

2. The device of claim 1, wherein the first logic level is lower than the second logic level, and the third logic level is higher than the fourth logic level.

3. The device of claim 1, wherein the sense circuit includes a third transistor, one end of the third transistor is connected to a power supply terminal, the other end of the third transistor is connected to the first node, and a gate of the third transistor is connected to the other end of the second transistor.

4. The device of claim 3, wherein:
the sense circuit includes a fourth transistor and a latch circuit, one end of the fourth transistor is connected to the first node, the other end of the fourth transistor is connected to the latch circuit,
the fourth transistor is turned off by a sixth voltage applied to a gate of the fourth transistor during the pulldown operation, and
the fourth transistor is turned on by a seventh voltage applied to the gate of the fourth transistor during the read operation, the seventh voltage being different from the sixth voltage.

5. The device of claim 4, wherein during the pulldown operation, the sixth voltage continues to be applied to the gate of the fourth transistor after the sixth voltage is applied to the gate of the fourth transistor, until the memory cell is selected during the read operation.

6. The device of claim 1, wherein the other end of the first resistance element is connected to the first bit line, and the other end of the first transistor is connected to a ground terminal.

7. The device of claim 1, wherein the third voltage is substantially the same as a value obtained by subtracting a threshold voltage of the second transistor from the first voltage.

8. The device of claim 1, further comprising a memory cell array being a set of the memory cells, wherein the first pulldown circuit is arranged at an edge portion or in a center portion of the memory cell array.

9. The device of claim 1, further comprising:
a first charging circuit connected to the first bit line, and
a second charging circuit connected to the other end of the second transistor,
wherein the sequencer executes a reset operation before the pulldown operation in the reading, and
wherein during the reset operation, the first charging circuit charges the first bit line to the second voltage, and the second charging circuit charges the other end of the second transistor to a sixth voltage, the sixth voltage being higher than or equal to the second voltage.

10. The device of claim 1, wherein the second transistor is turned off by a voltage applied to the gate of the second transistor that changes from the first voltage to a sixth voltage in response to the signal at the fourth logic level output from the first NOR gate during the pulldown operation.

11. The device of claim 10, wherein the second transistor is turned on by the voltage applied to the gate of the second transistor changes from the sixth voltage to the first voltage in response to the memory cell being selected during the read operation.

12. The device of claim 10, wherein during the pulldown operation, the sixth voltage continues to be applied to the gate of the second transistor after the sixth voltage is applied to the gate of the second transistor in response to a fall of the voltage of the first bit line from the second voltage to the third voltage, until the memory cell is selected during the read operation.

13. The device of claim 1, further comprising:
a reference cell including a reference resistance element;
a second pulldown circuit including a second resistance element and a third transistor, a resistance value of the second resistance element being substantially equal to a resistance value of the first resistance element, and one end of the third transistor being connected to one end of the second resistance element;
a second bit line connected to the reference cell and the second pulldown circuit;
a fourth transistor, one end of the fourth transistor being connected to the second bit line, the other end of the fourth transistor being connected to the sense circuit; and a second NOR gate, a first input terminal of the second NOR gate being connected to a second node, the first signal being input into a second input terminal of the second NOR gate, and an output terminal of the second NOR gate being connected to a gate of the third transistor, wherein the sense circuit reads data stored in the memory cell from a potential difference between the first and second bit lines.

14. The device of claim 13, wherein:
the variable resistance element can be in one of a high-resistance state and a low-resistance state, and
the resistance value of the first resistance element is greater than or equal to a resistance value of the variable resistance element in the low-resistance state and less than or equal to a resistance value of the variable resistance element in the high-resistance state.

15. The device of claim 13, wherein the resistance value of the first resistance element is approximately equal to a resistance value of the reference resistance element.

16. The device of claim 13, wherein the resistance value of the first resistance element is higher than a resistance value of the reference resistance element.

17. The device of claim 13, wherein the third voltage is substantially the same as a value obtained by subtracting a threshold voltage of the second or fourth transistor from the first voltage.

18. A semiconductor memory device comprising:
a memory cell including a variable resistance element;
a pulldown circuit including a first resistance element and a first transistor, one end of the first transistor being connected to one end of the first resistance element;
a first bit line connected to the memory cell and the first pulldown circuit;
a second transistor, one end of the second transistor being connected to the first bit line;
a reference cell including a reference resistance element;
a second pulldown circuit including a second resistance element and a third transistor, one end of the third transistor being connected to one end of the second resistance element;
a second bit line connected to the reference cell and the second pulldown circuit;
a fourth transistor, one end of the fourth transistor being connected to the second bit line;
a sense circuit, the sense circuit including fifth to eighth transistors, a gate of the fifth transistor being connected to the other end of the second transistor, one end of the sixth transistor being connected to one end of the fifth transistor, a gate of the seventh transistor being connected to the other end of the fourth transistor, and one end of the seventh transistor being connected to one end of the eighth transistor and gates of the sixth and eighth transistors; and
a sequencer including first and second NOR gates, a first input terminal of the first NOR gate being connected to the one end of the fifth transistor, a first signal being input into a second input terminal of the first NOR gate, an output terminal of the first NOR gate being connected to a gate of the first transistor, a first input terminal of the second NOR gate being connected to the one end of the seventh transistor, the first signal being input into a second input terminal of the second NOR gate, and an output terminal of the second NOR gate being connected to a gate of the third transistor.

19. The device of claim 18, wherein the sense circuit includes ninth to twelfth transistors, a gate of the ninth transistor being connected to the other end of the second transistor, one end and a gate of the tenth transistor being connected to one end of the ninth transistor, a gate of the eleventh transistor being connected to the other end of the fourth transistor, one end of the twelfth transistor being connected to one end of the eleventh transistor, and a gate of the twelfth transistor being connected to the gate of the tenth transistor.

20. The device of claim 19, wherein:
the sense circuit includes a latch circuit, and
the latch circuit latches data based on a difference between a voltage of the one end of the fifth transistor and a voltage of the one end of the eleventh transistor.

* * * * *